(12) United States Patent
Ushikubo et al.

(10) Patent No.: US 9,437,824 B2
(45) Date of Patent: Sep. 6, 2016

(54) LIGHT-EMITTING ELEMENT, LIGHT EMITTING DEVICE, AND ELECTRONIC DEVICE

(71) Applicant: Semiconductor Energy Laboratory Co., Ltd., Kanagawa-ken (JP)

(72) Inventors: Takahiro Ushikubo, Kanagawa (JP); Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 206 days.

(21) Appl. No.: 13/748,844

(22) Filed: Jan. 24, 2013

(65) Prior Publication Data

US 2013/0134406 A1 May 30, 2013

Related U.S. Application Data

(62) Division of application No. 12/152,009, filed on Dec. 15, 2009, now Pat. No. 8,362,466.

(30) Foreign Application Priority Data

Dec. 17, 2008 (JP) ................ 2008-320918

(51) Int. Cl.
*H01L 29/08* (2006.01)
*H01L 51/00* (2006.01)
(Continued)

(52) U.S. Cl.
CPC ......... *H01L 51/0052* (2013.01); *H01L 51/006* (2013.01); *H01L 51/0072* (2013.01); *H01L 51/5036* (2013.01); *H05B 33/14* (2013.01)

(58) Field of Classification Search
CPC .................................. H01L 51/0052
USPC ............... 257/40, E51.001–E51.052; 438/99
See application file for complete search history.

(56) References Cited

U.S. PATENT DOCUMENTS 6,531,234 B1   3/2003 Higashi et al.
6,603,150 B2   8/2003 Liao et al.
(Continued)

FOREIGN PATENT DOCUMENTS

EP   1 033 904 A1   9/2000
EP   1 718 122 A1   11/2006
(Continued)

OTHER PUBLICATIONS

Zhang, Z.-L. et al., "Blue/White Organic light Emitting Diodes and Passive Matrix Display," Proceedings of SPIE, vol. 5632, 2005, pp. 45-52.

(Continued)

*Primary Examiner* — Mark Tornow
(74) *Attorney, Agent, or Firm* — Husch Blackwell LLP

(57) ABSTRACT

A light-emitting element includes a light-emitting layer having a two-layer structure in which a first light-emitting layer containing a first light-emitting substance and a second light-emitting layer containing a second light-emitting substance, which is in contact with the first light-emitting layer, are provided between an anode and a cathode. The first light-emitting layer is separated into two layers of a layer provided on the anode side and a layer provided on the cathode side. The layer provided on the anode side contains only a first light-emitting substance, or a first organic compound of less than 50 wt % and the first light-emitting substance of 50 wt % to 100 wt %. The layer provided on the cathode side contains a second organic compound and the first light-emitting substance. The second light-emitting layer, which is provided in contact with the first light-emitting layer, contains the second light-emitting substance and a third organic compound.

30 Claims, 24 Drawing Sheets

(51) Int. Cl.
*H01L 51/50* (2006.01)
*H05B 33/14* (2006.01)

(56) References Cited

U.S. PATENT DOCUMENTS

| | | | |
|---|---|---|---|
| 6,803,120 | B2 | 10/2004 | Fukuoka et al. |
| 6,998,487 | B2 | 2/2006 | Kim et al. |
| 7,163,831 | B2 | 1/2007 | Hasegawa et al. |
| 7,173,370 | B2 | 2/2007 | Seo et al. |
| 7,192,659 | B2 | 3/2007 | Ricks et al. |
| 7,196,360 | B2 | 3/2007 | Seo et al. |
| 7,268,484 | B2 | 9/2007 | Nakamura |
| 7,294,849 | B2 | 11/2007 | Thompson et al. |
| 7,365,360 | B2 | 4/2008 | Kang et al. |
| 7,859,186 | B2 | 12/2010 | Noh et al. |
| 7,951,470 | B2 | 5/2011 | Tokuda et al. |
| 8,040,047 | B2 | 10/2011 | Ushikubo et al. |
| 2002/0027416 | A1 | 3/2002 | Kim et al. |
| 2002/0086180 | A1 | 7/2002 | Seo et al. |
| 2002/0093283 | A1 | 7/2002 | Seo et al. |
| 2002/0109136 | A1 | 8/2002 | Seo et al. |
| 2002/0113546 | A1 | 8/2002 | Seo et al. |
| 2002/0121860 | A1 | 9/2002 | Seo et al. |
| 2002/0139303 | A1 | 10/2002 | Yamazaki et al. |
| 2002/0155632 | A1 | 10/2002 | Yamazaki et al. |
| 2003/0010288 | A1 | 1/2003 | Yamazaki et al. |
| 2004/0154542 | A1 | 8/2004 | Yamazaki et al. |
| 2004/0241491 | A1 | 12/2004 | Hatwar |
| 2005/0046337 | A1* | 3/2005 | Chin et al. .......... 313/504 |
| 2005/0100760 | A1 | 5/2005 | Yokoyama |
| 2005/0112405 | A1 | 5/2005 | Hamada |
| 2005/0179378 | A1 | 8/2005 | Oooka et al. |
| 2005/0218799 | A1* | 10/2005 | Hamada .......... 313/506 |
| 2005/0260440 | A1 | 11/2005 | Seo et al. |
| 2006/0188746 | A1 | 8/2006 | Iou |
| 2006/0210828 | A1 | 9/2006 | Nakayama et al. |
| 2006/0243967 | A1 | 11/2006 | Nomura et al. |
| 2006/0243970 | A1 | 11/2006 | Seo et al. |
| 2006/0292394 | A1 | 12/2006 | Iwaki et al. |
| 2007/0015006 | A1 | 1/2007 | Lee et al. |
| 2007/0020483 | A1 | 1/2007 | Park et al. |
| 2007/0020484 | A1 | 1/2007 | Kim et al. |
| 2007/0075632 | A1 | 4/2007 | Kawakami et al. |
| 2007/0108892 | A1 | 5/2007 | Bae et al. |
| 2007/0122656 | A1 | 5/2007 | Klubek et al. |
| 2007/0159083 | A1 | 7/2007 | Matsuura et al. |
| 2007/0200490 | A1 | 8/2007 | Kawamura et al. |
| 2007/0216292 | A1 | 9/2007 | Seo et al. |
| 2008/0006822 | A1 | 1/2008 | Ohsawa |
| 2008/0130278 | A1 | 6/2008 | Ushikubo et al. |
| 2009/0053559 | A1 | 2/2009 | Spindler et al. |
| 2009/0058278 | A1 | 3/2009 | Ushikubo et al. |
| 2009/0085479 | A1 | 4/2009 | Ushikubo |
| 2009/0102366 | A1 | 4/2009 | Ushikubo et al. |
| 2009/0140634 | A1 | 6/2009 | Nomura et al. |
| 2009/0146552 | A1 | 6/2009 | Spindler et al. |
| 2009/0174311 | A1* | 7/2009 | Patel et al. .......... 313/504 |
| 2012/0040482 | A1 | 2/2012 | Ushikubo et al. |

FOREIGN PATENT DOCUMENTS

| | | |
|---|---|---|
| EP | 2 276 084 A1 | 1/2011 |
| JP | 3-190088 | 8/1991 |
| JP | 6-158038 | 6/1994 |
| JP | 2000-100566 | 4/2000 |
| JP | 2001-319779 | 11/2001 |
| JP | 2004-6165 | 1/2004 |
| JP | 2004-526284 A | 8/2004 |
| JP | 2005-11734 | 1/2005 |
| JP | 2005-11735 | 1/2005 |
| JP | 2005-108729 | 4/2005 |
| JP | 2005-235403 | 9/2005 |
| JP | 2006-49057 | 2/2006 |
| JP | 2006-199629 | 8/2006 |
| JP | 2007-91721 | 4/2007 |
| JP | 2007-201491 | 8/2007 |
| JP | 2008-84913 | 4/2008 |
| KR | 2007-0049221 A | 5/2007 |
| KR | 2008-0105640 A | 12/2008 |
| WO | WO 02/74015 A2 | 9/2002 |
| WO | WO 2005/079118 A1 | 8/2005 |
| WO | WO 2006/022193 A1 | 3/2006 |
| WO | WO 2007/029530 A1 | 3/2007 |
| WO | WO 2007/139124 A1 | 12/2007 |

OTHER PUBLICATIONS

Kajii, H. et al., "Study of Transient Electroluminescence Process Using Organic Light-Emitting Diode with Partial Doping Layer," Japanese Journal of Applied Physics, vol. 45, No. 4B, 2006, pp. 3721-3724.

Sun, Y. et al., "Management of Singlet and Triplet Excitons for Efficient White Organic Light-Emitting Devices," Nature, vol. 440, Apr. 13, 2006, pp. 908-912.

Sun, Y. et al., "High-Efficiency White Organic Light Emitting Devices with Three Separate Phosphorescent Emission Layers," Applied Physics Letters, vol. 91, 2007, pp. 263503-1-263503-3.

Lee, Y.G. et al., "White Organic Light-Emitting Devices with Mixed Interfaces Between Light Emitting Layers," Applied Physics Letters, vol. 90, 2007, pp. 243508-1-243508-3.

Kim, S.H. et al., "High Efficiency Phosphorescent Organic Light Emitting Diodes Using Triplet Quantum Well Structure," Applied Physics Letters, vol. 90, 2007, pp. 173501-1-173501-3.

International Search report re application No. PCT/JP2007/060940, dated Aug. 21, 2007.

Written Opinion re application No. PCT/JP2007/060940, dated Aug. 21, 2007.

Baek, H.I. et al., "Optimization of White Organic Light Emitting Diodes Based on Emitting Layer Charge Carrier Conduction Properties," Journal of Physics D: Applied Physics, vol. 41, 2008, p. 105101 (5pages).

European Search report re application No. EP 08018185.2, dated Mar. 16, 2009.

European Search report re application No. EP 09178012.2, dated Oct. 10, 2011.

Korean Office Action re Application No. KR 2009-0125620, dated Oct. 30, 2015.

* cited by examiner

LIGHT-EMITTING ELEMENT, LIGHT EMITTING DEVICE, AND ELECTRONIC DEVICE

This application is a divisional of copending application Ser. No. 12/638,709 filed on Dec. 15, 2009.

BACKGROUND OF THE INVENTION

1. Field of the Invention

The present invention relates to a current-excitation light-emitting element. Further, the present invention relates to a light-emitting device and an electronic device including the light-emitting element.

2. Description of the Related Art

In recent years, research and development have been actively conducted on light-emitting elements using electroluminescence. In a basic structure of such a light-emitting element, a layer containing a light-emitting substance is interposed between a pair of electrodes. By applying voltage to this element, light emission from the light-emitting substance can be obtained.

Light-emitting elements using electroluminescence are broadly classified according to whether the light-emitting substance is an organic compound or an inorganic compound.

In the case where an organic compound is used for the light-emitting substance, by applying voltage to a light-emitting element, electrons and holes are injected from a pair of electrodes into a layer containing a light-emitting substance, so that current flows therethrough. Then, by recombination of these carriers (electrons and holes), the light-emitting substance forms an excited state, and emits light when the excited state returns to a ground state. Because of such a mechanism, such a light-emitting element is called a current-excitation light-emitting element.

As described above, the current-excitation light-emitting element using an organic compound as a light-emitting substance can be manufactured to be thin and lightweight and can be driven at low voltage. Therefore, the current-excitation light-emitting element is thought to be suitable for a next-generation flat panel display element. In addition, response speed being extremely fast is also one of the characteristics, and it is also an advantage that high image quality can be realized by applying the current-excitation light-emitting element to a display.

Further, since such a light-emitting element can be formed in a film form, planar light emission in a large area can be easily obtained. This implies that a "surface light source" can be formed easily which is difficult to obtain by a point light source typified by an incandescent lamp or an LED, or by a line light source typified by a fluorescent lamp. Therefore, utility value as a surface light source that can be applied to lighting or the like is also high.

Although such a light-emitting element can provide various emission colors depending on the kind of light-emitting substances, development of a light-emitting element which provides white light is important in consideration of application to a flat panel display or lighting. This is not only because a full-color display can be realized with combination of a white light-emitting element and a color filter, but also because white light is an emission color with the highest demand for lighting.

When a plurality of kinds of organic compounds showing different emission colors is combined, light emission of desired color, light emission having a broad spectrum, or white light emission can be obtained. However, light-emitting efficiency and lifetime of the light-emitting element described above are great problems, which also apply to a white light-emitting element.

In order to solve these problems, light-emitting efficiency and lifetime of the white light-emitting element are improved by using a specific substance in, for example, Patent Document 1. However, the measures are yet inadequate in consideration for practical application.

In the case of a light-emitting element using a plurality of kinds of organic compounds showing different emission colors, adjustment in order to obtain light emission of desired color is difficult in some cases due to influence of energy transfer or the like.

PRIOR ART DOCUMENT

Patent Document

[Patent Document 1] Japanese Published Patent Application No. 2007-201491

SUMMARY OF THE INVENTION

In view of the above-described problems, an object of one embodiment of the present invention is to provide a long-lifetime light-emitting element. In particular, an object of one embodiment of the present invention is to provide a long-lifetime light-emitting element, which is formed by combining a plurality of organic compounds showing different emission colors to emit mixed color light.

Further, another object of one embodiment of the present invention is, as for a light-emitting element formed by combining a plurality of organic compounds showing different emission colors, which emits a mixed color light, to provide a light-emitting element of which light emission color is easily adjusted.

Further, another object of one embodiment of the present invention is to provide a highly reliable light-emitting device or electronic device, by applying a light-emitting element of one embodiment of the present invention to the light-emitting device or the electronic device. Furthermore, another object of one embodiment of the present invention is to provide a light-emitting device or electronic device with high display quality.

It is possible to manufacture a light-emitting element in which both light emission from the first light-emitting substance and light emission from the second light-emitting substance can be obtained by adopting a light-emitting element having a two-layer structure in which between an anode and a cathode, a first light-emitting layer containing a first light-emitting substance is provided and a second light-emitting layer containing a second light-emitting substance is further provided in contact with the first light-emitting layer.

In the above element structure, as a result of diligent study, the present inventors have found that the problems can be solved in the following manner: the first light-emitting layer is separated into two layers of a layer provided on an anode side and a layer provided on a cathode side, only a first light-emitting substance is contained or a first organic compound of less than 50 wt % and the first light-emitting substance of greater than or equal to 50 wt % and less than 100 wt % are contained in the layer provided on the anode side, a second organic compound and the first light-emitting substance are contained in the layer provided on the cathode side, and further, the second light-emitting substance and a third organic compound are contained in the second light-emitting layer which is provided in contact with the first light-emitting layer.

Further, the second light-emitting layer provided in contact with the first light-emitting layer contains not only the second light-emitting substance but also the third organic compound; therefore, a carrier-transporting property can be controlled. Accordingly, the second light-emitting layer can be provided on an anode side or a cathode side of the first light-emitting layer. Therefore, the third organic compound is preferably a host material in the second light-emitting layer.

As described above, according to one embodiment of the present invention, a light-emitting element includes, between an anode and a cathode, a first light-emitting layer and a second light-emitting layer which is provided in contact with an anode side of the first light-emitting layer. The first light-emitting layer includes a layer provided on the anode side and a layer provided on a cathode side. The layer provided on the anode side contains a first organic compound and a first light-emitting substance, and the amount of the first light-emitting substance in the layer provided on the anode side is greater than or equal to 50 wt % and less than 100 wt %. The layer provided on the cathode side contains a second organic compound and the first light-emitting substance, and the amount of the second organic compound in the layer provided on the cathode side is greater than or equal to 50 wt % and less than or equal to 99.9 wt %. The second light-emitting layer contains a third organic compound and a second light-emitting substance, and the amount of the third organic compound in the second light-emitting layer is greater than or equal to 50 wt % and less than or equal to 99.9 wt %. Both light emission from the first light-emitting substance and light emission from the second light-emitting substance can be obtained in the light-emitting element.

According to one embodiment of the present invention, a light-emitting element includes, between an anode and a cathode, a first light-emitting layer and a second light-emitting layer which is provided in contact with an anode side of the first light-emitting layer. The first light-emitting layer includes a layer provided on the anode side and a layer provided on a cathode side. The layer provided on the anode side contains a first light-emitting substance. The layer provided on the cathode side contains a second organic compound and the first light-emitting substance, and the amount of the second organic compound in the layer provided on the cathode side is greater than or equal to 50 wt % and less than or equal to 99.9 wt %. The second light-emitting layer contains a third organic compound and a second light-emitting substance, and the amount of the third organic compound in the second light-emitting layer is greater than or equal to 50 wt % and less than or equal to 99.9 wt %. Both light emission from the first light-emitting substance and light emission from the second light-emitting substance can be obtained in the light-emitting element.

In the above-described structures, a carrier recombination region is preferably provided inside of the light-emitting layer, in particular, near the interface between the layer provided on the anode side and the layer provided on the cathode side of the first light-emitting layer in order that light emission of a short wavelength side is realized efficiently. Therefore, in the above-described light-emitting element of one embodiment of the present invention, the layer provided on the anode side has a hole-transporting property, the layer provided on the cathode side has an electron-transporting property, and the second light-emitting layer has a hole-transporting property.

Further, in the above-described light-emitting element of one embodiment of the present invention, the first light-emitting substance has a hole-transporting property, the second organic compound has an electron-transporting property, and the third organic compound has a hole-transporting property.

Similarly, according to one embodiment of the present invention, a light-emitting element includes, between an anode and a cathode, a first light-emitting layer and a second light-emitting layer which is provided in contact with a cathode side of the first light-emitting layer. The first light-emitting layer includes a layer provided on an anode side and a layer provided on the cathode side. The layer provided on the anode side contains a first organic compound and a first light-emitting substance, and the amount of the first light-emitting substance in the layer provided on the anode side is greater than or equal to 50 wt % and less than 100 wt %. The layer provided on the cathode side contains a second organic compound and the first light-emitting substance, and the amount of the second organic compound in the layer provided on the cathode side is greater than or equal to 50 wt % and less than or equal to 99.9 wt %. The second light-emitting layer contains a third organic compound and a second light-emitting substance, and the amount of the third organic compound in the second light-emitting layer is greater than or equal to 50 wt % and less than or equal to 99.9 wt %. Both light emission from the first light-emitting substance and light emission from the second light-emitting substance can be obtained in the light-emitting element.

According to one embodiment of the present invention, a light-emitting element includes, between an anode and a cathode, a first light-emitting layer and a second light-emitting layer which is provided in contact with a cathode side of the first light-emitting layer. The first light-emitting layer includes a layer provided on an anode side and a layer provided on the cathode side. The layer provided on the anode side contains a first light-emitting substance. The layer provided on the cathode side contains a second organic compound and the first light-emitting substance, and the amount of the second organic compound in the layer provided on the cathode side is greater than or equal to 50 wt % and less than or equal to 99.9 wt %. The second light-emitting layer contains a third organic compound and a second light-emitting substance, and the amount of the third organic compound in the second light-emitting layer is greater than or equal to 50 wt % and less than or equal to 99.9 wt %. Both light emission from the first light-emitting substance and light emission from the second light-emitting substance can be obtained in the light-emitting element.

In the above-described structures, a carrier recombination region is preferably provided inside of the light-emitting layer, in particular, near the interface between the layer provided on the anode side and the layer provided on the cathode side of the first light-emitting layer in order that light emission of a short wavelength side is realized efficiently. Therefore, in the above-described light-emitting element of one embodiment of the present invention, the layer provided on the anode side has a hole-transporting property, the layer provided on the cathode side has an electron-transporting property, and the second light-emitting layer has an electron-transporting property.

Further, in the above-described light-emitting element of one embodiment of the present invention, the first light-emitting substance has a hole-transporting property, the second organic compound has an electron-transporting property, and the third organic compound has an electron-transporting property.

Further, in the structure of one embodiment of the present invention, the first light-emitting substance is preferably a compound in which anthracene is bonded to a diarylamino group via an arylene group. In particular, an aryl group bonded to a 9-position of 9,10-diarylanthracene derivative is preferably an aryl group in which an arylene group is bonded to a diarylamino group. As such a substance, specifically, a substance represented by the following general formula (i) is given.

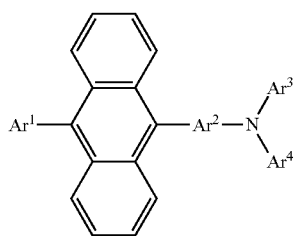

(i)

In the formula, $Ar^1$ represents an aryl group having 6 to 25 carbon atoms, $Ar^2$ represents an arylene group having 6 to 25 carbon atoms, and $Ar^3$ and $Ar^4$ independently represent either an aryl group having 6 to 25 carbon atoms or a carbazolyl group.

With the structure described above, a carrier recombination region in the light-emitting element of one embodiment of the present invention is mainly provided in the first light-emitting layer in many cases. Therefore, in consideration of energy transfer, light emission in the first light-emitting layer preferably has a wavelength shorter than that of light emission in the second light-emitting layer. In other words, in the light-emitting element of one embodiment of the present invention, an emission peak wavelength of the first light-emitting substance is preferably shorter than that of the second light-emitting substance.

Note that both light emission from the first light-emitting substance and light emission from the second light-emitting substance can be obtained with the structure of the light-emitting element of one embodiment of the present invention; therefore, the light-emitting element of one embodiment of the present invention is suitable for a light-emitting element having a broad spectrum, and in particular, suitable to be used for a white light-emitting element. Therefore, in the light-emitting element described above, a light-emitting element in which an emission color of the first light-emitting substance and an emission color of the second light-emitting substance are complementary to each other is also one example of the invention disclosed in this specification.

In consideration of white light, more specifically, a structure in which an emission color of the first light-emitting substance is blue and an emission color of the second light-emitting substance is yellow is preferable. Alternatively, it is preferable that an emission peak wavelength of the first light-emitting substance be in the range of greater than or equal to 400 nm and less than 480 nm and an emission peak wavelength of the second light-emitting substance be in the range of greater than or equal to 540 nm and less than 600 nm.

In addition, as another structure in consideration of white light, it is preferable that an emission color of the first light-emitting substance be blue-green and an emission color of the second light-emitting substance be red. Alternatively, it is preferable that an emission peak wavelength of the first light-emitting substance be in the range of greater than or equal to 480 nm and less than 520 nm and an emission peak wavelength of the second light-emitting substance be in the range of greater than or equal to 600 nm and less than 700 nm.

Note that by using the structure of a light-emitting element of one embodiment of the present invention, the light-emitting element can emit not only white light but also light of another color combining other wavelengths. Therefore, in the above-described light-emitting element, a light-emitting element in which an emission color of the first light-emitting substance is blue and an emission color of the second light-emitting substance is green is also an example of the present invention disclosed in this specification.

Note that the light-emitting element of one embodiment of the present invention as described above can be applied to a variety of light-emitting devices. Therefore, a light-emitting device having the above-described light-emitting element of one embodiment of the present invention is also included in the present invention. The category of a light-emitting device in this specification includes image display devices, lighting devices, and the like. Further, the category of the light-emitting device also includes a module in which a connector such as a flexible printed circuit (FPC), a tape automated bonding (TAB) tape, or a tape carrier package (TCP) is attached to a panel on which a light-emitting element is formed; a module in which a printed wiring board is provided at an end of a TAB tape or a TCP; and also a module in which an integrated circuit (IC) is directly mounted on a light-emitting element by a chip on glass (COG) method.

In particular, the light-emitting element of one embodiment of the present invention is suitable for manufacturing a light-emitting element having a broad spectrum or a white light-emitting element; therefore, a lighting device is preferable as the above-described light-emitting device.

In addition, the above-described light-emitting device of one embodiment of the present invention is particularly useful for a display portion of an electronic device. Therefore, an electronic device provided with the light-emitting device of one embodiment of the present invention is also included in the present invention.

When the light-emitting element of one embodiment of the present invention is manufactured, a long-lifetime light-emitting element can be obtained. In particular, as for a light-emitting element which emits mixed color light by combining a plurality of organic compounds showing different light emission colors, a long-lifetime light-emitting element can be obtained.

Further, as for a light-emitting element which emits mixed color light by combining a plurality of organic compounds showing different emission colors, a light-emitting element of which color is easily adjusted can be obtained.

Further, when the light-emitting element of one embodiment of the present invention is applied to a light-emitting device or an electronic device, a light-emitting device or an electronic device with high reliability can be obtained. Furthermore, a light-emitting device or an electronic device with high display quality can be obtained.

BRIEF DESCRIPTION OF THE DRAWINGS

In the accompanying drawings.

DETAILED DESCRIPTION OF THE INVENTION

Hereinafter, embodiments and examples of the present invention will be described with reference to the drawings. However, the present invention can be implemented in many various ways and it is easily understood by those skilled in the art that the modes and details can be changed in various ways without departing from the spirit and the scope of the invention. Therefore, the present invention should not be interpreted as being limited to the description of the embodiments and examples given below.

Embodiment 1

In Embodiment 1, a concept of one embodiment of the present invention will be described. A conceptual view of a light-emitting element of one embodiment of the present invention is illustrated in FIGS. 1A and 1B.

Figure 1A:
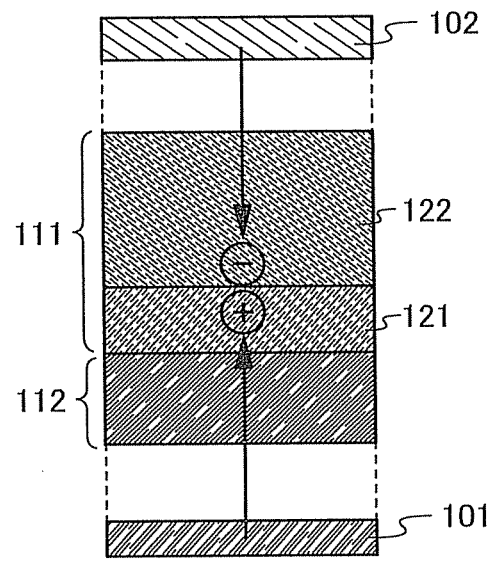
FIGS. 1A and 1B each illustrate a light emitting element according to one embodiment of the present invention.
Figure 1B:
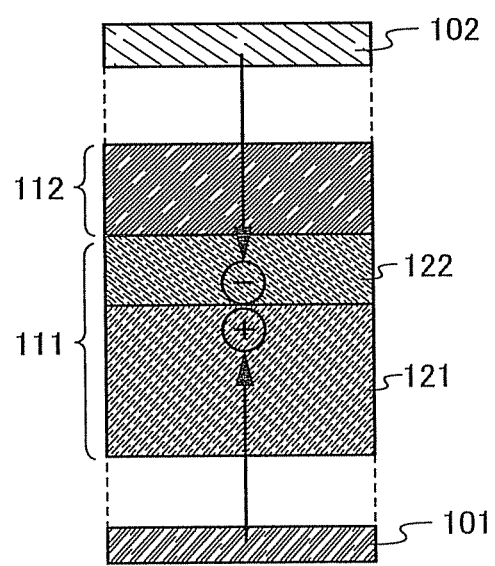

FIG. 1A illustrates a structure of a light-emitting element of one embodiment of the present invention, which includes, between an anode 101 and a cathode 102, a first light-emitting layer 111 and a second light-emitting layer 112 which is provided in contact with the anode side of the first light-emitting layer 111, and the first light-emitting layer 111 includes a layer 121 provided on the anode side and a layer 122 provided on the cathode side. Although a hole-injecting layer or a hole-transporting layer may be provided between the anode 101 and the second light-emitting layer 112, they are not necessarily provided; therefore, they are omitted in FIG. 1A. In addition, although an electron-injecting layer or an electron-transporting layer may be provided between the cathode 102 and the first light-emitting layer 111, they are not necessarily provided; therefore, they are omitted in FIG. 1A.

In the first light-emitting layer 111, the layer 121 provided on the anode side contains only a first light-emitting substance or a first organic compound of less than 50 wt % and the first light-emitting substance of greater than or equal to 50 wt % and less than 100 wt %, and the layer 122 provided on the cathode side contains a second organic compound of greater than or equal to 50 wt % and less than or equal to 99.9 wt % and the first light-emitting substance. Therefore, light emission from the first light-emitting substance is obtained from the first light-emitting layer 111. On the other hand, the second light-emitting layer 112 contains a third organic compound of greater than or equal to 50 wt % and less than or equal to 99.9 wt % and a second light-emitting substance. In other words, light emission from the second light-emitting substance is obtained from the second light-emitting layer 112. In the light-emitting element of one embodiment of the present invention, both the light emission from the first light-emitting substance and the light emission from the second light-emitting substance can be obtained when holes injected from the anode 101 and electrons injected from the cathode 102 are recombined by applying voltage to the light-emitting element.

First, as for the light-emitting element of one embodiment of the present invention, it is important that the first light-emitting layer 111 is separated into two layers of the layer 121 provided on the anode side and the layer 122 provided on the cathode side and both of the two layers contain the first light-emitting substance. In addition, it is also important that by the first light-emitting substance in the layer 121 provided on the anode side and the second organic compound which is contained in the layer 122 provided on the cathode side, a carrier-transporting property in the first light-emitting layer 111 is adjusted, and the vicinity of the interface between the layer 121 provided on the anode side and the layer 122 provided on the cathode side becomes a main recombination region of carriers. With such a structure, since recombination of carriers occurs not at an end interface of the first light-emitting layer 111 but inside thereof, the carrier balance in the first light-emitting layer 111 does not change easily over time; thus, the first light-emitting layer 111 does not deteriorate easily.

From the above perspectives, it is preferable that a hole-transporting property in the layer 121 provided on the anode side be adjusted by the first light-emitting substance having a hole-transporting property and an electron-transporting property in the layer 122 provided on the cathode side be adjusted by the second organic compound contained therein.

In the case where the layer 121 provided on the anode side contains the first organic compound, the first organic compound functions to stabilize the film quality of the layer 121 provided on the anode side (e.g., suppression of crystallization).

On the other hand, the second light-emitting layer 112 contains the second light-emitting substance and emits light with a color which is different from that of light emission from the first light-emitting layer 111 (light emission from the first light-emitting substance). Then, as described above, a main recombination region of carriers is near the interface between the layer 121 provided on the anode side and the layer 122 provided on the cathode side of the first light-emitting layer 111. Accordingly, the second light-emitting layer 112 also has a function of transporting holes up to the first light-emitting layer 111 in the case of FIG. 1A. Therefore, it is preferable that the second light-emitting layer 112 further contain the third organic compound to adjust a hole-transporting property.

Here, in the light-emitting element of one embodiment of the present invention, both the first light-emitting substance contained in the first light-emitting layer 111 and the second light-emitting substance contained in the second light-emitting layer 112 need to emit light. The second light-emitting substance contained in the second light-emitting layer 112 is slightly apart from the main recombination region of carriers as illustrated in FIG. 1A; however, part of electrons reaches up to the second light-emitting layer 112 by adjusting the thickness of the layer 121 provided on the anode side. Therefore, the second light-emitting substance can also emit light.

Alternatively, the emission wavelength of the first light-emitting substance is made shorter than that of the second light-emitting substance, whereby part of excitation energy of the first light-emitting substance is transferred to the second light-emitting substance, so that the second light-emitting substance can emit light. In this case, since the recombination region is inside the first light-emitting layer 111 which emits light with a short wavelength, energy transfer to the second light-emitting layer 112 which emits light with a long wavelength can be suppressed and colors can be easily adjusted. It is known that the efficiency of energy transfer of the first light-emitting layer is inversely proportional to the 6th power of a distance between substances; therefore, the ratio of light emission of the first light-emitting substance to light emission of the second light-emitting substance can be adjusted by adjusting the thickness of the layer 121 provided on the anode side.

With either mechanism, holes injected from the anode 101 and electrons injected from the cathode 102 are distributed without waste in faulting an excited state of either the first light-emitting layer 111 or the second light-emitting layer 112, thereby contributing to light emission. Therefore, high emission efficiency can be achieved in the light-emitting element of one embodiment of the present invention.

On the other hand, FIG. 1B illustrates, contrary to FIG. 1A, a structure of the light-emitting element of one embodiment of the present invention in which the second light-emitting layer 112 is provided in contact with the cathode side of the first light-emitting layer 111. Although a hole-injecting layer or a hole-transporting layer may be provided between the anode 101 and the first light-emitting layer 111, they are not necessarily formed; therefore, they are omitted in FIG. 1B. In addition, although an electron-injecting layer or an electron-transporting layer may be provided between the cathode 102 and the second light-emitting layer 112, they are not necessarily provided; therefore, they are omitted in FIG. 1B.

In the first light-emitting layer 111, the layer 121 provided on the anode side contains only the first light-emitting substance or the first organic compound of less than 50 wt % and the first light-emitting substance of greater than or equal to 50 wt % and less than 100 wt %, and the layer 122 provided on the cathode side contains the second organic compound of greater than or equal to 50 wt % and less than or equal to 99.9 wt % and the first light-emitting substance. Therefore, light emission from the first light-emitting substance is obtained from the first light-emitting layer 111. On the other hand, the second light-emitting layer 112 contains the third organic compound of greater than or equal to 50 wt % and less than or equal to 99.9 wt % and the second light-emitting substance. In other words, light emission from the second light-emitting substance is obtained from the second light-emitting layer 112. In the light-emitting element of one embodiment of the present invention, both the light emission from the first light-emitting substance and the light emission from the second light-emitting substance can be obtained when holes injected from the anode 101 and electrons injected from the cathode 102 are recombined by applying voltage to the light-emitting element.

As for the first light-emitting layer 111, FIG. 1B has a structure similar to that of FIG. 1A, and it is preferable that the layer 121 provided on the anode side obtain a hole-transporting property by the first light-emitting substance, and an electron-transporting property in the layer 122 provided on the cathode side be adjusted by the second organic compound contained therein.

On the other hand, the second light-emitting layer 112 contains the second light-emitting substance and emits light with a color which is different from that of light emission from the first light-emitting layer 111 (light emission from the first light-emitting substance). Then, a main recombination region of carriers is near the interface between the layer 121 provided on the anode side and the layer 122 provided on the cathode side. Accordingly, the second light-emitting layer 112 also has a function of transporting electrons up to the first light-emitting layer 111 in the case of FIG. 1B. Therefore, it is preferable that the second light-emitting layer 112 further contain the third organic compound to adjust an electron-transporting property.

Here, in the light-emitting element of one embodiment of the present invention, both the first light-emitting substance contained in the first light-emitting layer 111 and the second light-emitting substance contained in the second light-emitting layer 112 need to emit light. The second light-emitting substance contained in the second light-emitting layer 112 is slightly apart from the main recombination region of carriers as illustrated in FIG. 1B; however, part of holes reaches up to the second light-emitting layer 112 by adjusting the thickness of the layer 122 provided on the cathode side. Therefore, the second light-emitting substance can also emit light.

Alternatively, the emission wavelength of the first light-emitting substance is made shorter than that of the second light-emitting substance, whereby part of excitation energy of the first light-emitting substance is transferred to the second light-emitting substance, so that the second light-emitting substance can emit light. In this case, since the recombination region is inside the first light-emitting layer 111 which emits light with a short wavelength, energy transfer to the second light-emitting layer 112 which emits light with a long wavelength can be suppressed and colors can be easily adjusted. It is known that the efficiency of energy transfer is inversely proportional to the 6th power of a distance between substances; therefore, the ratio of light emission of the first light-emitting substance to light emission of the second light-emitting substance can be adjusted by adjusting the thickness of the layer 122 provided on the cathode side.

With either mechanism, holes injected from the anode 101 and electrons injected from the cathode 102 are distributed without waste in forming an excited state of either the first light-emitting layer 111 or the second light-emitting layer 112, thereby contributing to light emission. Therefore, high emission efficiency can be achieved in the light-emitting element of one embodiment of the present invention.

Note that since both light emission from the first light-emitting substance and light emission from the second light-emitting substance can be obtained in the light-emitting element of one embodiment of the present invention, light emission of mixed two colors and light emission having a broad spectrum can be obtained. Therefore, white light emission can also be obtained.

According to the above description, by application of the structure of one embodiment of the present invention, a long-lifetime light-emitting element can be obtained. In particular, as for a light-emitting element in which mixed color light is obtained by combining a plurality of organic compounds showing different emission colors, a long-lifetime light-emitting element can be obtained.

Further, as for a light-emitting element in which mixed color light is obtained by combining a plurality of organic compounds showing different emission colors, a light-emitting element of which color is easily adjusted can be obtained.

As described above, the concept of the light-emitting element of one embodiment of the present invention is described in this embodiment. Next, the structure of the light-emitting element of one embodiment of the present invention will be described in more detail also with reference to specific materials.

Embodiment 2

In Embodiment 2, a specific structure of the light-emitting element of one embodiment of the present invention, which is described in FIG. 1A, will be described with reference to FIG. 2A.

Figure 2A:
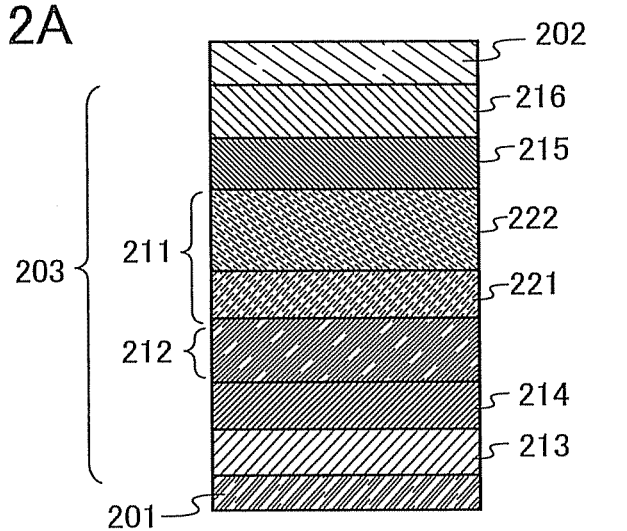
FIGS. 2A and 2B each illustrate a light-emitting element according to one embodiment of the present invention.

FIG. 2A schematically illustrates an element structure of the light-emitting element of one embodiment of the present invention. A layer 203 containing a light-emitting substance is provided between an anode 201 and a cathode 202, and the layer 203 containing a light-emitting substance includes at least a first light-emitting layer 211 and a second light-emitting layer 212 which is provided in contact with the anode side of the first light-emitting layer 211. The first light-emitting layer 211 includes a layer 221 provided on the anode side and a layer 222 provided on the cathode side.

Note that in the light-emitting element in this embodiment, a hole-injecting layer 213 and a hole-transporting layer 214 are provided between the anode 201 and the second light-emitting layer 212. In addition, an electron-transporting layer 215 and an electron-injecting layer 216 are provided between the cathode 202 and the first light-emitting layer 211. However, the hole-injecting layer 213, the hole-transporting layer 214, the electron-transporting layer 215, and the electron-injecting layer 216 are not necessarily provided. In addition, each of these layers may be formed of a plurality of layers.

Hereinafter, first, the structures of the first light-emitting layer 211 and the second light-emitting layer 212 are specifically described.

In the first light-emitting layer 211, the layer 221 provided on the anode side contains only a first light-emitting substance or a first organic compound and a first light-emitting substance of greater than or equal to 50 wt % and less than 100 wt %, and the layer 222 provided on the cathode side contains a second organic compound and the first light-emitting substance. The amount of the second organic compound is greater than or equal to 50 wt % and less than or equal to 99.9 wt %.

As described also in Embodiment 1, the first light-emitting substance and the second organic compound have a function of adjusting a carrier-transporting property in the first light-emitting layer 211 so that the vicinity of the interface between the layer 221 provided on the anode side and the layer 222 provided on the cathode side becomes a main recombination region of carriers, that is, a function of keeping the carrier balance. With such a structure, the carrier balance in the first light-emitting layer 211 does not change easily over time; thus, the first light-emitting layer 211 does not deteriorate easily. Note that the first light-emitting substance in the layer 221 provided on the anode side emits light as well as transports carriers.

In order to adjust a carrier-transporting property, the amount of the first light-emitting substance in the layer 221 provided on the anode side is preferably greater than or equal to 50 wt %. More specifically, the amount of the first light-emitting substance in the layer 221 provided on the anode side is greater than or equal to 50 wt % and less than or equal to 100 wt % since the first light-emitting substance transports carriers and emits light. In addition, the amount of the second organic compound in the layer 222 provided on the cathode side is preferably greater than or equal to 50 wt %. More specifically, the amount of the second organic compound in the layer 222 provided on the cathode side is greater than or equal to 50 wt % and less than or equal to 99.9 wt % since the layer 222 provided on the cathode side functions as a light-emitting layer by containing the first light-emitting substance. In the case where the first organic compound is contained in the layer 221 provided on the anode side, the first organic compound functions to stabilize the film quality of the layer 221 provided on the anode side (e.g., suppression of crystallization).

In addition, as described also in Embodiment 1, in order that the vicinity of the interface between the layer 221 provided on the anode side and the layer 222 provided on the cathode side becomes the main recombination region of carriers, it is preferable that the layer 221 provided on the anode side have a hole-transporting property and the layer 222 provided on the cathode side have an electron-transporting property. In consideration of this point, it is preferable that the first light-emitting substance which transports carriers in the layer 221 provided on the anode side have a hole-transporting property and the second organic compound which is a host material in the layer 222 provided on the cathode side have an electron-transporting property.

Therefore, as the first light-emitting substance, a substance which has a carrier-transporting property and can be an emission center substance in the layer 222 provided on the cathode side may be adopted. Light emission by the first light-emitting substance may be fluorescence or phosphorescence. Further, a substance preferably also has a hole-transporting property. As examples of such a substance, 4-(10-phenyl-9-anthryl)-4'-(9-phenyl-9H-carbazol-3-yl)triphenylamine (abbreviation: PCBAPA), 4-[4-(10-phenyl-9- anthryl)phenyl]-4'-(9-phenyl-9H-carbazol-3-yl)triphenylamine (abbreviation: PCBAPBA), 9,10-bis{4-[N-(4-diphenylaminophenyl)-N-phenylamino]phenyl}-2-tert-butylanthracene (abbreviation: DPABPA), 4-(9H-carbazol-9-yl)-4'-(10-phenyl-9-anthryl)triphenylamine (abbreviation: YGAPA), 9,10-bis(4-{N-[4-(9-carbazolyl)phenyl]-N-phenylamino}phenyl)-2-tert-butylanthracene (abbreviation: YGABPA), 2-tert-butyl-9,10-bis{4-[N-(9-phenylcarbazol-3-yl)-N-phenylamino]phenyl}anthracene (abbreviation: PCABPA), 9-phenyl-10-(4-[N-phenyl-N-{3-(N-phenyl)carbazolyl}]amino)phenylanthracene (abbreviation: PCAPA), 2-{4-[N-phenyl-N-(9-phenylcarbazol-3-yl)amino]phenyl}-9,10-diphenylanthracene (abbreviation: 2PCAPPA), 2-(4-{N-[4-(carbazol-9-yl)phenyl]-N-phenylamino}phenyl)-9,10-diphenylanthracene (abbreviation: 2YGAPPA), 2-{4-[N-(4-diphenylaminophenyl)-N-phenylamino]phenyl}-9,10-diphenylanthracene (abbreviation: 2DPAPPA), 4-(10-phenyl-9-anthryl)triphenylamine (abbreviation: DPhPA), 4-(10-phenyl-9-anthryl)-4'-phenyl-triphenylamine (abbreviation: BPAPA) and the like are given. In particular, a compound in which anthracene is bonded to a diarylamino group via an arylene group is a preferable material. Among them, an aryl group bonded to a 9-position of 9,10-diarylanthracene derivative in which an arylene group is bonded to a diarylamino group, that is, a substance represented by the following general formula (i) is preferably used.

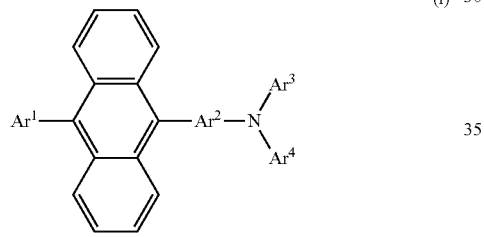

(i)

In the formula, Ar¹ represents an aryl group having 6 to 25 carbon atoms, Ar² represents an arylene group having 6 to 25 carbon atoms, and Ar³ and Ar⁴ independently represent an aryl group having 6 to 25 carbon atoms or a carbazolyl group. Ar³ and Ar⁴ may independently have a substituent, and in that case, as the substituent, an alkyl group having 1 to 4 carbon atoms, an aryl group having 6 to 25 carbon atoms, and a carbazolyl group are given. As the aryl group having 6 to 25 carbon atoms, for example, a phenyl group, an o-biphenyl group, an m-biphenyl group, a p-biphenyl group, a fluoren-2-yl group, a spiro-9,9'-bifluorene-2-yl group, and a naphthyl group are given. In addition, as an arylene group having 6 to 25 carbon atoms, for example, a divalent group or the like derived from benzene, naphthalene, fluorene, or spirofluorene is given. Further, as an alkyl group having 1 to 4 carbon atoms, for example, a methyl group, an ethyl group, a propyl group, an isopropyl group, a butyl group, an isobutyl group, and a tert-butyl group are given.

As examples of such a substance that can be preferably used for the first light-emitting substance, 4-(10-phenyl-9-anthryl)-4'-(9-phenyl-9H-carbazol-3-yl)triphenylamine (abbreviation: PCBAPA) represented by the following structural formula (1), 4-[4-(10-phenyl-9-anthryl)phenyl]-4'-(9-phenyl-9H-carbazol-3-yl)triphenylamine (abbreviation: PCBAPBA) represented by the following structural formula (2), N,9-diphenyl-N-[4-(10-phenyl-9-anthryl)phenyl]-9H-carbazol-3-amine (abbreviation: PCAPA) represented by the following structural formula (3) are given.

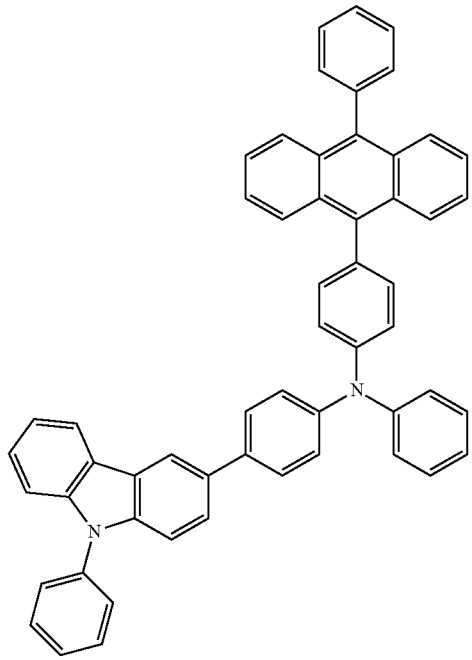

PCBAPA

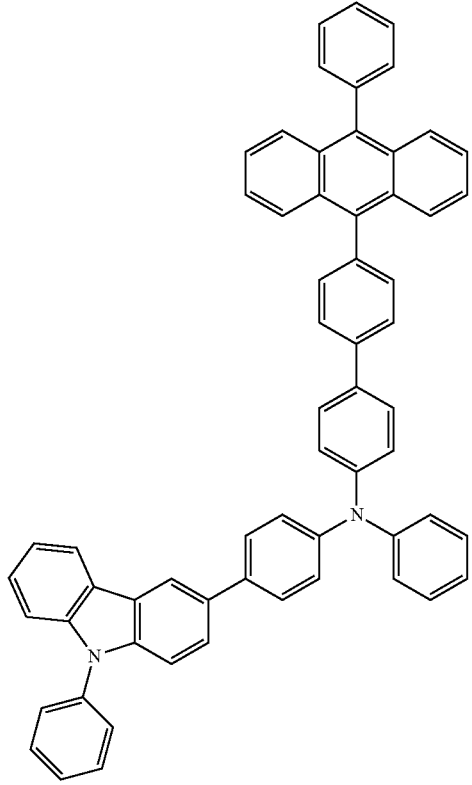

PCBAPBA

-continued (3)

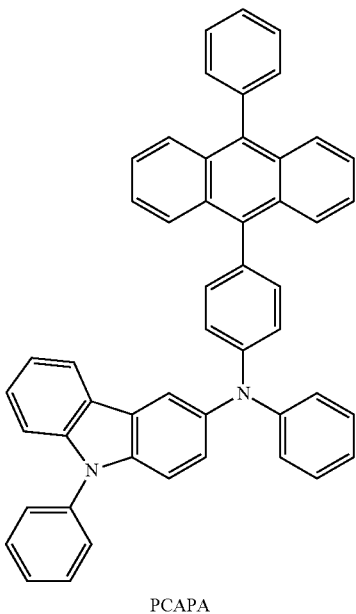

PCAPA

The first organic compound is added to the first light-emitting substance in the layer 221 provided on the anode side in order to suppress crystallization of the first light-emitting substance and improve the film quality of the layer 221 provided on the anode side. Thus, there are no particular limitation on the material, but for example, the following can be used: 4,4'-bis[N-(1-naphthyl)-N-phenylamino]biphenyl (abbreviation: NPB or α-NPD); N,N-bis(4-methylphenyl)-N,N'-diphenyl-p-phenylenediamine (abbreviation: DTDPPA); 9,10-bis(3,5-diphenylphenyl)anthracene (abbreviation: DPPA); 4,4'-b is [N-(4-diphenylaminophenyl)-N-phenylamino]biphenyl (abbreviation: DPAB); 4,4'-bis(N-{4-[N'-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 4,4',4"-tris(N-carbazolyl)triphenylamine (abbreviation: TCTA); 9-[4-(10-phenyl-9-anthryl)phenyl]-9H-carbazole (abbreviation: CzPA); 9-phenyl-9'-[4-(10-phenyl-9-anthryl)phenyl]-3,3'-bi(9H-carbazole) (abbreviation: PCCPA); 1,4-bis[4-(N-carbazolyl)phenyl]-2,3,5,6-tetraphenylbenzene; 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA). Note that if the energy gap (or triplet energy) of the first organic compound is smaller than that of the first light-emitting substance, energy is transferred from the first light-emitting substance to the first organic compound, and emission efficiency and color purity may be decreased. Thus, the first organic compound is preferably a substance having an energy gap (or triplet energy) larger than that of the first light-emitting substance.

Further, as specific examples of the second organic compound, a compound having an electron-transporting property such as the following is preferable: tris(8-quinolinolato)aluminum(III) (abbreviation: Alq); tris(4-methyl-8-quinolinolato)aluminum(III) (abbreviation: Almq$_3$); bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq); bis(8-quinolinolato)zinc(II) (abbreviation: Znq); bis[2-(2-benzoxazolyl)phenolato]zinc(II) (abbreviation: ZnPBO); bis[2-(2-benzothiazolyl)phenolato]zinc(II) (abbreviation: ZnBTZ); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butyl-phenyl)-1,2,4-triazole (abbreviation: TAZ01); 2,2',2"-(1,3,5-benzenetriyl)-tris(1-phenyl-1H-benzimidazole) (abbreviation: TPBI); bathophenanthroline (abbreviation: BPhen); bathocuproine (abbreviation: BCP); 9-[4-(5-phenyl-1,3,4-oxadiazol-2-yl)phenyl]-9H-carbazole (abbreviation: CO11); 9-[4-(10-phenyl-9-anthryl)phenyl]-9H-carbazole (abbreviation: CzPA); 3,6-diphenyl-9-[4-(10-phenyl-9-anthryl)phenyl]-9H-carbazole (abbreviation: DPCzPA); 9,10-bis(3,5-diphenylphenyl)anthracene (abbreviation: DPPA); 9,10-di(2-naphthyl)anthracene (abbreviation: DNA); 2-tert-butyl-9,10-di(2-naphthyl)anthracene (abbreviation: t-BuDNA); 9,9'-bianthryl (abbreviation: BANT); 9,9'-(stilbene-3,3'-diyl)diphenanthrene (abbreviation: DPNS); 9,9'-(stilbene-4,4'-diyl)diphenanthrene (abbreviation: DPNS2); and 3,3',3"-(benzene-1,3,5-triyl)tripyrene (abbreviation: IPB3). Note that if the energy gap (or triplet energy) of the second organic compound is smaller than that of the first light-emitting substance, energy is transferred from the first light-emitting substance to the second organic compound, and emission efficiency and color purity may be decreased. Thus, the second organic compound is preferably a substance having an energy gap (or triplet energy) larger than that of the first light-emitting substance. In addition, the interface between the layer 221 provided on the anode side and the layer 222 provided on the cathode side is a region where both holes and electrons have high density; therefore, the second organic compound is preferably stable with respect to both oxidation and reduction. Therefore, tricyclic, tetracyclic, pentacyclic, and hexacyclic condensed aromatic compound typified by CzPA, DPCzPA, DPPA, DNA, t-BuDNA, BANT, DPNS, DPNS2, or TPB3 is more preferable as the second organic compound. In particular, an anthracene derivative such as CzPA, DPCzPA, DPPA, DNA, t-BuDNA, or BANT is stable and has a large energy gap; therefore, such an anthracene derivative is preferable as the second organic compound which is a host material. Further, the same substance as the first organic compound can be used for the second organic compound.

Note that the first light-emitting layer 211 may further contain another substance in addition to the first organic compound, the second organic compound, and the first light-emitting substance.

On the other hand, the second light-emitting layer 212 contains the third organic compound and the second light-emitting substance. As described also in Embodiment 1, the main recombination region of carriers is the vicinity of the interface between the layer 221 provided on the anode side and the layer 222 provided on the cathode side; therefore, the second light-emitting layer 212 also has a function of transporting holes up to the first light-emitting layer 211 in the structure of FIG. 2A. In order to realize this function easily, it is preferable that the third organic compound as well as the first organic compound and the second organic compound be a host material in the second light-emitting layer 212. In other words, more specifically, the amount of the third organic compound in the second light-emitting layer 212 may be greater than or equal to 50 wt % and less than or equal to 99.9 wt %.

In addition, in consideration of the second light-emitting layer 212 also having the function of transporting holes, the third organic compound which is a host material in the second light-emitting layer 212 preferably has a hole-transporting property.

Therefore, as specific examples of the third organic compound, a compound having a hole-transporting property such as the following is preferable: 4,4'-bis[N-(1-naphthyl)-N-phenylamino]biphenyl (abbreviation: NPB or α-NPD); 4,4'-bis[N-(9,9-dimethylfluoren-2-yl)-N-phenylamino]biphenyl (abbreviation: DFLDPBi); N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methyl-phenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); N,N'-bis(spiro-9,9'-bifluoren-2-yl)-N,N'-diphenylbenzidine (abbreviation: BSPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); 4,4',4''-tris(N-carbazolyl)triphenylamine (abbreviation: TCTA); 9,10-diphenylanthracene (abbreviation: DPAnth); N,N-diphenyl-9-[4-(10-phenyl-9-anthryl)phenyl]-9H-carbazol-3-amine (abbreviation: CzA1PA); 9-phenyl-9'-[4-(10-phenyl-9-anthryl)phenyl]-3,3'-bi(9H-carbazole) (abbreviation: PCCPA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthry)phenyl]phenyl}-9H-carbazol-3-amine (abbreviation: PCAPBA); N,9-diphenyl-N-(9,10-diphenyl-2-anthryl)-9H-carbazol-3-amine (abbreviation: 2PCAPA); 6,12-dimethoxy-5,11-diphenylchrysene; and N,N,N',N',N'',N'',N''',N'''-octaphenyldibenzo[g,p]chrysene-2,7,10,15-tetraamine (abbreviation: DBC1). Note that if the energy gap (or triplet energy) of the third organic compound is smaller than that of the second light-emitting substance, energy is transferred from the second light-emitting substance to the third organic compound, and emission efficiency and color purity may be decreased. Thus, the third organic compound is preferably a substance having an energy gap (or triplet energy) larger than that of the second light-emitting substance. Here, an anthracene derivative such as DPAnth, CzA1PA, PCCPA, DPhPA, YGAPA, PCAPA, PCAPBA, or 2PCAPA is stable and has a large energy gap; therefore, such an anthracene derivative is preferable as the third organic compound which is a host material.

Note that the second light-emitting layer 212 may further contain another substance in addition to the third organic compound and the second light-emitting substance.

Next, the second light-emitting substance is described. The first light-emitting layer 211 contains the first light-emitting substance and the second light-emitting layer 212 contains the second light-emitting substance. Note that different substances are used for the first light-emitting substance and the second light-emitting substance in this embodiment in order to obtain light emission of a desired color, light emission having a broad spectrum or white light emission.

There is no particular limitation on the second light-emitting substance as long as it is different from the first light-emitting substance, and may be selected as appropriate from, for example, the following materials. As a substance which emits blue light, for example, a substance having an emission peak wavelength which is greater than or equal to 400 nm and less than 480 nm may be used, and the followings are given: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 2-(4-{N-[4-(carbazol-9-yl)phenyl]-N-phenylamino}phenyl)-9,10-diphenylanthracene (abbreviation: 2YGAPPA); N,9-diphenyl-N-[4-(10-phenyl-9-anthryl)phenyl]-9H-carbazole-3-amine (abbreviation: PCAPA); perylene; 2,5,8,11-tetra-tert-butylperylene (abbreviation: TBP); and 4-(10-phenyl-9-anthryl)-4'-(9-phenyl-9H-carbazol-3-yl)triphenylamine (abbreviation: PCBAPA). In addition, a material which emits phosphorescence such as bis[2-(4',6'-difluorophenyl)pyridinato-N,$C^{2'}$]iridium(III)tetrakis(1-pyrazolyl)borate (abbreviation: FIr6) or bis[2-(4',6'-difluorophenyl)pyridinato-N,$C^{2'}$]iridium(III) picolinate (abbreviation: FIrpic) can also be used. As a substance which emits blue-green light, for example, a substance having an emission peak wavelength which is greater than or equal to 480 nm and less than 520 nm may be used, and the followings are given: N,N''-(2-tert-butylanthracene-9,10-diyldi-4,1-phenylene)bis[N,N',N'-triphenyl-1,4-phen ylenediamine] (abbreviation: DPABPA); N,9-diphenyl-N-[4-(9,10-diphenyl-2-anthryl)phenyl]-9H-carbazole-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); and coumarin 30. In addition, a material which emits phosphorescence such as bis{2-[3',5'-bis(trifluoromethyl)phenyl]pyridinato-N,$C^{2'}$}iridium(III) picolinate (abbreviation: Ir(CF$_3$ppy)$_2$(pic)) or bis[2-(4',6'-difluorophenyl)pyridinato-N,$C^{2'}$]iridium(III) acetylacetonate (abbreviation: FIr(acac)) can also be used. As a substance which emits yellow light, for example, a substance having an emission peak wavelength which is greater than or equal to 540 nm and less than 600 nm may be used, and the followings are given: rubene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2). In addition, a material which emits phosphorescence such as bis(benzo[h]quinolinato)iridium(III)acetylacetonate (abbreviation: Ir(bzq)$_2$(acac)); bis(2,4-diphenyl-1,3-oxazolato-N,C$^{2'}$)iridium(III)acetylacetonate (abbreviation: Ir(dpo)$_2$(acac)); bis[2-(4'-(perfluorophenylphenyl)pyridinato]iridium(III) acetylacetonate (abbreviation: Ir(p-PF-ph)$_2$(acac)); or bis(2-phenylbenzothiazolato-N,C$^{2'}$)iridium(III)acetylacetonate (abbreviation: Ir(bt)$_2$(acac) can also be used. As a substance which emits red light, for example, a substance having an emission peak wavelength which is greater than or equal to 600 nm and less than 700 nm may be used, and the followings are given: N,N,N',N'-tetrakis(4-methylphenyl)tetracene-5,11-diamine (abbreviation: p-mPhTD); 7,14-diphenyl-N,N,N',N'-tetrakis(4-methyl-phenyl)acenaphtho[1,2-a]fluoranthene-3,10-d iamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). In addition, a material which emits phosphorescence such as bis[2-(2'-benzo[4,5-α]thienyl)pyridinato-N,C$^{3'}$]iridium(III) acetylacetonate (abbreviation: Ir(btp)$_2$(acac)); bis(1-phenylisoquinolinato-N,C$^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphyrin platinum(H) (abbreviation: PtOEP); tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) can also be used. Note that materials having an emission peak wavelength within the range of 520 nm to 540 nm are not given; however, it is needless to say that a light-emitting material having an emission wavelength of this range (including a material which emits phosphorescence) can be used. For example, coumarin 545T, N,N'-diphenylquinacridone (abbreviation: DPQd), and tris(2-phenylpyridinato)iridium(II) (abbreviation: Ir(ppy)$_3$), are given. Substances having different emission wavelengths can be selected from these materials and used so that a desired emission color can be obtained from a light-emitting element.

Here, in the light-emitting element of one embodiment of the present invention, both the first light-emitting substance contained in the first light-emitting layer 211 and the second light-emitting substance contained in the second light-emitting layer 212 need to emit light. The second light-emitting substance contained in the second light-emitting layer 212 is slightly apart from a main recombination region of carriers; however, part of electrons reaches up to the second light-emitting layer 212 by adjusting the thickness of the layer 221 provided on the anode side. Therefore, the second light-emitting substance can also emit light.

In addition, the emission wavelength of the first light-emitting substance is made shorter than that of the second light-emitting substance, whereby part of excitation energy of the first light-emitting substance is transferred to the second light-emitting substance, so that the second light-emitting substance can emit light. Therefore, in the light-emitting element of one embodiment of the present invention, the emission peak wavelength of the first light-emitting substance is preferably shorter than that of the second light-emitting substance. Note that it is known that the efficiency of energy transfer is inversely proportional to the 6th power of a distance between substances; therefore, the ratio of light emission of the first light-emitting substance to light emission of the second light-emitting substance can be adjusted by adjusting the thickness of the layer 221 provided on the anode side.

Note that both light emission from the first light-emitting substance and light emission from the second light-emitting substance can be obtained with the structure of the light-emitting element of one embodiment of the present invention; therefore, the light-emitting element of one embodiment of the present invention is suitable as a light-emitting element having a broad spectrum, and suitable to be used as a white light-emitting element, in particular. Therefore, in the light-emitting element of one embodiment of the present invention described above, a light-emitting element in which an emission color of the first light-emitting substance and an emission color of the second light-emitting substance are complementary to each other is also one feature of the present invention. As a complementary relation, blue and yellow, blue-green and red, or the like are given. A substance which emits blue, yellow, blue-green, or red light may be selected as appropriate from, for example, the light-emitting substances given above.

As a combination example, PCBAPA which emits blue light is used as the first light-emitting substance and rubrene which emits yellow light is used as the second light-emitting substance to obtain white light. Alternatively, white light is obtained when, for example, 2PCAPPA which emits blue-green light is used as the first light-emitting substance and BisDCM which emits red light is used as the second light-emitting substance. Note that as an emission color other than white light, an intermediate color like purple is obtained with the use of, for example, 2YGAPPA which emits blue light as the first light-emitting substance and BisDCM which emits red light as the second light-emitting substance.

Here, as described above, in consideration of utilization of energy transfer from the first light-emitting substance to the second light-emitting substance, the emission peak wavelength of the first light-emitting substance is preferably shorter than that of the second light-emitting substance.

Therefore, for example, a structure is preferable in which an emission color of the first light-emitting substance is blue (an emission peak wavelength is greater than or equal to 400 nm and less than 480 nm) and an emission color of the second light-emitting substance is yellow (an emission peak wavelength is greater than or equal to 540 nm and less than 600 nm). In consideration of this point, the above-described substance such as YGA2S, YGAPA, 2YGAPPA, PCAPA, perylene, TBP, PCBAPA, PCBAPBA, FIr6, or FIrpic is preferable as the first light-emitting substance, and the above-described substance such as rubrene, BPT, DCM1, DCM2, Ir(bzq)$_2$(acac), Ir(dpo)$_2$(acac), Ir(p-PF-ph)$_2$(acac), or Ir(bt)$_2$(acac) is preferable as the second light-emitting substance.

Alternatively, for example, a structure is preferable in which an emission color of the first light-emitting substance is blue-green (an emission peak wavelength is greater than or equal to 480 nm and less than 520 nm) and an emission color of the second light-emitting substance is red (an emission peak wavelength is greater than or equal to 600 nm and less than 700 nm). In consideration of this, the above-described DPABPA, 2PCAPPA, 2DPAPPA, DBC1, coumarin 30, Ir(CF$_3$ppy)$_2$(pic), FIr(acac), or the like is preferable as the first light-emitting substance, and the above-described p-mPhTD, p-mPhAFD, DCJTI, DCJTB, BisDCM, BisDCJTM, Ir(btp)$_2$(acac), Ir(piq)$_2$(acac), Ir(Fdpq)$_2$(acac), PtOEP, Eu(DBM)$_3$(Phen), tris[1-(2-thenoyl)-3,3,3-trifluoroacetonato](monophenanthroline)europium(III), or the like is preferable as the second light-emitting substance.

By applying the structures of the first light-emitting layer 211 and the second light-emitting layer 212 which are described above, holes injected from the anode 201 and electrons injected from the cathode 202 are distributed without waste in forming an excited state of either the first light-emitting layer 211 or the second light-emitting layer 212, thereby contributing to light emission. Therefore, high emission efficiency can be achieved in the light-emitting element of one embodiment of the present invention.

Next, materials, which are suitable to be used for the anode 201, the hole-injecting layer 213, the hole-transporting layer 214, the electron-transporting layer 215, the electron-injecting layer 216, and the cathode 202, are specifically given below.

The anode 201 is preferably formed using any of metals, alloys, electrically conductive compounds, a mixture thereof, and the like, each of which has a high work function (specifically greater than or equal to 4.0 eV). Specifically, for example, indium oxide-tin oxide (ITO: indium tin oxide), indium oxide-tin oxide containing silicon or silicon oxide, indium oxide-zinc oxide (IZO: indium zinc oxide), indium oxide containing silicon oxide and tin oxide (ITSO: indium tin silicon oxide), indium oxide containing tungsten oxide and zinc oxide (IWZO) are given. Such electrically conductive metal oxide films are generally deposited by a sputtering method, but may be formed by an ink-jet method, a spin coating method, or the like by applying a sol-gel method or the like. For example, indium oxide-zinc oxide (IZO) can be deposited by a sputtering method using a target in which zinc oxide of 1 wt % to 20 wt % is added to indium oxide. Further, indium oxide containing tungsten oxide and zinc oxide (IWZO) can be deposited by a sputtering method using a target in which tungsten oxide of 0.5 wt % to 5 wt % and zinc oxide of 0.1 wt % to 1 wt % are contained in indium oxide. Other than these, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), or the like can be used.

In addition, as the anode 201, any of a variety of metals, alloys, and electrically conductive compounds, a mixture thereof, or the like can be used regardless of the magnitude of the work function when a layer containing a composite material described later is used as the layer in contact with the anode 201. For example, aluminum (Al), silver (Ag), or an alloy containing aluminum (for example, Al—Si, Al—Ti, or Al—Nd) can be used. Alternatively, any of elements belonging to Group 1 or Group 2 of the periodic table which are materials with a low work function, that is, alkali metals such as lithium (Li) and cesium (Cs); alkaline earth metals such as magnesium (Mg), calcium (Ca), and strontium (Sr); alloys containing them (Mg—Ag or Al—Li); rare earth metals such as europium (Eu) and ytterbium (Yb); alloys containing them; or the like can also be used. The above-described metals and alloys can be formed by a vacuum evaporation method or a sputtering method. Alternatively, a film of a paste (a silver paste or the like) can also be formed by an ink-jet method or the like.

The hole-injecting layer 213 is a layer containing a substance having a high hole-injecting property. As the substance having a high hole-injecting property, molybdenum oxide, vanadium oxide, ruthenium oxide, tungsten oxide, manganese oxide, or the like can be used. In addition, as a low molecular organic compound, the followings are given: a phthalocyanine-based compound such as phthalocyanine (abbreviation: H$_2$Pc), copper(II)phthalocyanine (abbreviation: CuPc), and vanadyl phthalocyanine (abbreviation: VOPc); and an aromatic amine compound such as NPB (or α-NPD), DFLDPBi, DTDPPA, DPAB, DNTPD, DPA3B, BSPB, TPD, TDATA, MTDATA, m-MTDAB, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Alternatively, for the hole-injecting layer 213, a composite material in which an acceptor substance is mixed into a substance having a high hole-transporting property can be used. Note that by using such a composite material in which an acceptor substance is mixed into a substance having a high hole-transporting property, a material for forming an electrode can be selected regardless of the work function of the electrode. In other words, besides a material with a high work function, a material with a low work function can also be used for the anode 201. These composite materials can be formed by co-evaporation of a substance having a high hole-transporting property and an acceptor substance.

As a substance having a high hole-transporting property used for the composite material, any of a variety of compounds such as an aromatic amine compound, a carbazole derivative, an aromatic hydrocarbon, and a high molecular compound (such as an oligomer, a dendrimer or a polymer) can be used. Specifically, the substance having a high hole-transporting property used for the composite material is preferably a substance having a hole mobility of greater than or equal to $10^{-6}$ cm$^2$/Vs. However, any substance other than these substances may be used as long as it is a substance of which hole-transporting property is higher than the electron-transporting property. Hereinafter, substances having a high hole-transporting property, which can be used for the composite material, are specifically given.

As an organic compound which can be used as the substance having a high hole-transporting property, for example, the following which are described above can be given: the aromatic amine compounds such as NPB (or α-NPD), DFLDPBi, DTDPPA, DPAB, DNTPD, DPA3B, BSPB, TPD, TDATA, MTDATA, m-MTDAB, PCzPCA1, PCzPCA2, PCzPCN1, and TCTA; the carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene; and the aromatic hydrocarbons such as DPPA, DNA, t-BuDNA, BANT, DPAnth, 2-tert-butyl-9,10-bis(4-phenylphenyl)anthracene (abbreviation: t-BuDBA), 2-tert-butylanthracene (abbreviation: t-BuAnth), 9,10-bis(4-methyl-1-naphthyl)anthracene (abbreviation: DMNA), 9,10-bis[2-(1-naphthyl)phenyl-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, as the acceptor substance an organic compound, such as 7,7,8,8-tetracyano-2,3,5,6-tetrafluoroquinodimethane (abbreviation: $F_4$-TCNQ) or chloranil, and a transition metal oxide can be given. Furthermore, oxides of metals belonging to Group 4 to Group 8 of the periodic table can be given. Specifically, it is preferable to use vanadium oxide, niobium oxide, tantalum oxide, chromium oxide, molybdenum oxide, tungsten oxide, manganese oxide, or rhenium oxide because of their high electron-accepting properties. Among them, molybdenum oxide is particularly preferable because it is stable even in the atmosphere, has low moisture absorption property, and is easy to handle.

Further, a high molecular compound (an oligomer, a dendrimer, a polymer, or the like) can be used for the hole-injecting layer 213. For example, a high molecular compound such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine (abbreviation: poly-TPD) are given. Furthermore, a high molecular compound added with acid, such as poly(3,4-ethylenedioxythiophene)/poly(styrenesulfonic acid) (PEDOT/PSS) or polyaniline/poly(styrenesulfonic acid) (PAni/PSS), can be used.

Further, a composite material, which is formed using the above-described high molecular compound, such as PVK, PVTPA, PTPDMA, or Poly-TPD and the above-described acceptor substance, may be used as the hole-injecting layer 213.

The hole-transporting layer 214 is a layer containing a substance having a high hole-transporting property. As a substance having a high hole-transporting property, particularly as a low molecular organic compound, the above-described aromatic amine compound such as NPB (or α-NPD), DFLDPBi, BSPB, TPD, or TCTA can be used. The substances mentioned here mainly are substances having a hole mobility of greater than or equal to $10^{-6}$ cm$^2$/Vs. However, any substance other than the above substances may be used as long as it is a substance of which hole-transporting property is higher than the electron-transporting property.

Further, for the hole-transporting layer 214, a high molecular compound such as PVK, PVTPA, PTPDMA, or Poly-TPD can also be used.

The electron-transporting layer 215 is a layer containing a substance having a high electron-transporting property. For example, as a low molecular organic compound, a metal complex such as Alq, Almq$_3$, BeBq$_2$, BAlq, Znq, ZnPBO, or ZnBTZ or a heterocyclic compound such as PBD, OXD-7, TAZ01, TPBI, BCP, BPhen, or CO11 can be used. In addition, a condensed polycyclic aromatic compound such as CzPA, DPCzPA, or TPB3 can be used. The substances mentioned here mainly are substances having an electron mobility of greater than or equal to $10^{-6}$ cm$^2$/Vs. Note that any substance other than the above substances may be used as the electron-transporting layer as long as it is a substance of which electron-transporting property is higher than the hole-transporting property.

Further, for the electron-transporting layer 215, a high molecular compound can be used. For example, poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-injecting layer 216 is a layer containing a substance having a high electron-injecting property. As a substance having a high electron-injecting property, an alkali metal or an alkaline earth metal such as lithium (Li), cesium (Cs), calcium (Ca), lithium fluoride (LiF), cesium fluoride (CsF), or calcium fluoride (CaF$_2$), or a compound thereof can be used. Alternatively, a layer formed of a substance having an electron-transporting property where a donor substance is contained can be used. As a substance having an electron-transporting property, the above-described substance which can be used for the electron-transporting layer 215 may be used. On the other hand, as a donor substance, an alkali metal, an alkaline earth metal, or a compound thereof can be used. Further alternatively, as a donor substance, an organic compound such as tetrathianaphthacene (abbreviation: TTN) or decamethylnickelocene (abbreviation: DMN) may be used. The donor substance can be contained in the electron-injecting layer 216 by co-evaporation.

As a substance forming the cathode 202, any of metals, alloys, electrically conductive compounds, a mixture thereof and the like, each of which has a low work function (specifically less than or equal to 3.8 eV), is preferably used. As specific examples of such cathode materials, any of elements belonging to Group 1 or Group 2 of the periodic table, that is, an alkali metal such lithium (Li) or cesium (Cs); an alkaline earth metal such as magnesium (Mg), calcium (Ca), or strontium (Sr); an alloy containing them (Mg—Ag or Al—Li); a rare earth metal such as europium (Eu) or ytterbium (Yb); an alloy containing them are given. Further, aluminum (Al), indium (In), silver (Ag), or an alloy thereof can be used. The above-described metals and alloys can be formed by a vacuum evaporation method or a sputtering method. Alternatively, a film of a paste (a silver paste or the like) can also be fainted by an ink-jet method or the like.

Further, as the electron-injecting layer 216, the layer formed of any of the above-mentioned substances having an electron-transporting property where a donor substance is contained can be used, so that a variety of electrically conductive compounds such as Al, Ag, ITO, and indium oxide-tin oxide containing silicon or silicon oxide can be used for the cathode 202, regardless of the work function. These electrically conductive compounds can be formed by a sputtering method, an ink-jet method, a spin coating method, or the like.

Note that a conductive composition containing a conductive high molecule (also referred to as a conductive polymer) can also be used for the anode 201 or the cathode 202. When a thin film of a conductive composition is formed as an anode or a cathode, the thin film preferably has a sheet resistance of less than or equal to 10000 Ω/square and a light transmittance of greater than or equal to 70% at a wavelength of 550 nm. Further, the resistivity of a conductive high molecule which is contained in the thin film is preferably less than or equal to 0.1 Ω·cm.

As a conductive high molecule, so-called π-electron conjugated conductive high molecule can be used. For example, polyaniline and/or a derivative thereof, polypyrrole and/or a derivative thereof, polythiophene and/or a derivative thereof, and a copolymer of two or more kinds of those materials are given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

One of the above-described conductive high molecules can be used alone for an anode or a cathode, or an organic resin may be added to such a conductive high molecule in order to adjust film characteristics so that it can be used as a conductive composition.

As for an organic resin, a thermosetting resin, a thermoplastic resin, or a photocurable resin may be used, as long as such a resin is compatible to a conductive high molecule or a resin can be mixed and dispersed into a conductive high molecule. For example, the followings are given: a polyester-based resin such as polyethylene terephthalate, polybutylene terephthalate, or polyethylene naphthalate; a polyimide-based resin such as polyimide or polyamide imide; a polyamide resin such as polyamide 6, polyamide 6,6, polyamide 12, or polyamide 11; a fluorine resin such as polyvinylidene fluoride, polyvinyl fluoride, polytetrafluoroethylene, ethylenetetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of these resins.

Further, the aforementioned conductive high molecule or conductive composition may be doped with an acceptor dopant or a donor dopant so that oxidation-reduction potential of a conjugated electron in a conjugated conductive high molecule may be changed in order to adjust conductivity of the conductive high molecule or the conductive composition.

As an acceptor dopant, a halogen compound, Lewis acid, proton acid, an organic cyano compound, an organometallic compound, or the like can be used. Examples of a halogen compound include chlorine, bromine, iodine, iodine chloride, iodine bromide, and iodine fluoride. As the Lewis acid, phosphorus pentafluoride, arsenic pentafluoride, antimony pentafluoride, boron trifluoride, boron trichloride, and boron tribromide are given. As the proton acid, inorganic acid such as hydrochloric acid, sulfuric acid, nitric acid, phosphoric acid, fluoroboric acid, hydrofluoric acid, or perchloric acid and organic acid such as organic carboxylic acid or organic sulfonic acid can be given. As the organic carboxylic acid and the organic sulfonic acid, any of the above-described carboxylic acid compounds and sulfonic acid compounds can be used. As the organic cyano compound, a compound in which two or more cyano groups are included in a conjugated bond can be used. For example, tetracyanoethylene, tetracyanoethylene oxide, tetracyanobenzene, tetracyanoquinodimethane, and tetracyano azanaphthalene are given.

As a donor dopant, an alkali metal, an alkaline earth metal, a quaternary ammonium compound can be given.

A thin film used for the anode or the cathode can be formed by a wet process using a solution in which the aforementioned conductive high molecule or conductive composition is dissolved in water or an organic solvent (e.g., an alcohol-based solvent, a ketone-based solvent, an ester-based solvent, a hydrocarbon-based solvent, or an aromatic-based solvent).

There is no particular limitation on the solvent in which the aforementioned conductive high molecule or conductive composition is dissolved, as long as the above-described conductive high molecule and the high molecular resin compound such as an organic resin are dissolved. For example, the conductive high molecule or the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methylethylketone, methylisobutylketone, toluene, and/or the like.

Formation of a film using a solution in which the conductive high molecule or the conductive composition is dissolved in a solvent can be conducted by a wet process such as an application method, a coating method, a droplet discharge method (also referred to as an ink-jet method), or a printing method. The solvent may be removed with heat treatment or may be removed under reduced pressure. In the case where the organic resin is a thermosetting resin, heat treatment may be further performed. In the case where the organic resin is a photocurable resin, light irradiation treatment may be performed.

Next, a manufacturing method of a light-emitting element of one embodiment of the present invention is described. Any of a variety of methods can be employed for forming the layer 203 containing a light-emitting substance, regardless of whether it is a dry process or a wet process. For example, a vacuum evaporation method, an ink-jet method, a spin coating method, or the like may be used. Further, a different film formation method may be employed for each layer.

For example, the high molecule compound among the above-described materials can be formed by a wet process such as an ink-jet method or a spin coating method. Further, the low molecular organic compound can be formed by a wet process or a dry process such as a vacuum evaporation method.

As described above, a long lifetime can be achieved in the light-emitting element of one embodiment of the present invention with the carrier balance which does not change easily over time. Further, since holes and electrons can be utilized for forming an excited state without waste, high light-emitting efficiency can be obtained. Furthermore, since both the first light-emitting substance and the second light-emitting substance can emit light, light emission having a broad spectrum or white light emission can be obtained.

Therefore, by manufacturing the light-emitting element of one embodiment of the present invention, a long-lifetime light-emitting element, in particular, a long-lifetime white light-emitting element can be obtained. Further, by manufacturing the light-emitting element of one embodiment of the present invention, a light-emitting element having high light-emitting efficiency, in particular, a white light-emitting element having high light-emitting efficiency can be obtained.

Embodiment 3

In Embodiment 3, a specific structure of the light-emitting element of one embodiment of the present invention, which is described in FIG. 1B, will be described with reference to FIG. 2B.

Figure 2B:
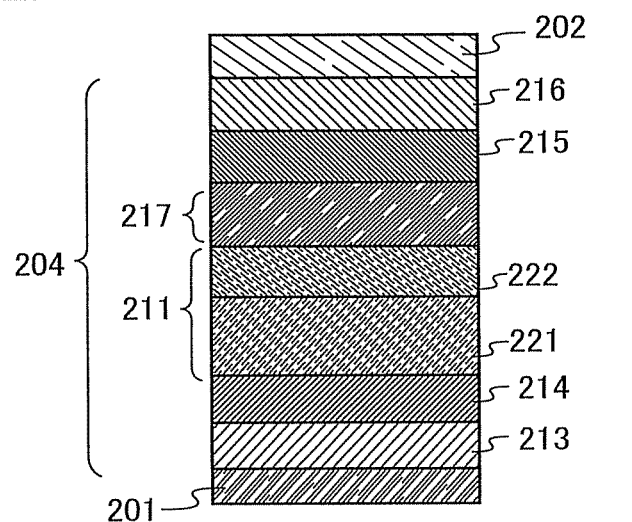

FIG. 2B schematically illustrates an element structure of the light-emitting element of one embodiment of the present invention. A layer 204 containing a light-emitting substance is provided between the anode 201 and the cathode 202, and the layer 204 containing the light-emitting substance includes at least the first light-emitting layer 211 and the second light-emitting layer 217 which is provided in contact with the cathode side of the first light-emitting layer 211. The first light-emitting layer 211 includes the layer 221 provided on the anode side and the layer 222 provided on the cathode side.

Note that in the light-emitting element in Embodiment 3, the hole-injecting layer 213 and the hole-transporting layer 214 are provided between the anode 201 and the first light-emitting layer 211. Further, the electron-transporting layer 215 and the electron-injecting layer 216 are provided between the cathode 202 and the second light-emitting layer 217. Note that the hole-injecting layer 213, the hole-transporting layer 214, the electron-transporting layer 215, and the electron-injecting layer 216 are not necessarily provided. Further, these layers may be formed of a plurality of layers.

The structures of the anode 201, the hole-injecting layer 213, the hole-transporting layer 214, the electron-transporting layer 215, the electron-injecting layer 216, the cathode 202, and the first light-emitting layer 211, which are included in the light-emitting element of Embodiment 3 illustrated in FIG. 2B, can be similar to those of the light-emitting element described in Embodiment 2. On the other hand, the structure of the second light-emitting layer 217 is preferably different from that of the second light-emitting layer 212 of the light-emitting element described in Embodiment 2.

In other words, the second light-emitting layer 217 is similar to the light-emitting layer described in Embodiment 2 in that the third organic compound and the second light-emitting substance are included but different in that the second light-emitting layer 217 has a function of transporting electrons instead of holes up to the first light-emitting layer 211. In order to realize this function easily, the third organic compound preferably serves as a host material in the second light-emitting layer 217 in a manner similar to those of the first organic compound and the second organic compound. That is, more specifically, the amount of the third organic compound in the second light-emitting layer 217 may be greater than or equal to 50 wt % and less than or equal to 99.9 wt %. Further, in consideration of the second light-emitting layer 217 having the function of transporting electrons, the third organic compound which is a host material in the second light-emitting layer 217 preferably has an electron-transporting property.

Therefore, as specific examples of the third organic compound in Embodiment 3, compounds having an electron-transporting property, such as Alq, Almq$_3$, BeBq$_2$, BAlq, Znq, ZnPBO, ZnBTZ, PBD, OXD-7, TAZ01, TPBI, BPhen, BCP, CO11, CzPA, DPCzPA, DPPA, DNA, t-BuDNA, BANT, DPNS, DPNS2, and TPB3 are preferable like the second organic compound contained in the layer 222 provided on the cathode side of the first light-emitting layer 211. In particular, anthracene derivatives such as CzPA, DPCzPA, DPPA, DNA, t-BuDNA, and BANT are stable and have large energy gaps; therefore, they are preferable as the third organic compound which is a host material.

Further, in order to reduce a hole injection barrier from the second light-emitting layer 217 to the first light-emitting layer 211, the second organic compound which is contained in the layer 222 provided on the cathode side of the first light-emitting layer 211 and the third organic compound which is contained in the second light-emitting layer 217 are preferably the same substances.

Note that as the second light-emitting substance, a substance similar to that described in Embodiment 2 can be used.

Further, the second light-emitting layer 217 may further contain another substance besides the third organic compound and the second light-emitting substance.

Note that in the light-emitting element of one embodiment of the present invention, both the first light-emitting substance contained in the first light-emitting layer 211 and the second light-emitting substance contained in the second light-emitting layer 217 need to emit light. The second light-emitting substance contained in the second light-emitting layer 217 is slightly apart from a main recombination region of carriers; however, part of holes reach up to the second light-emitting layer 217 by adjusting the thickness of the layer 222 provided on the cathode side in Embodiment 3. Therefore, the second light-emitting substance can also emit light.

In addition, the emission wavelength of the first light-emitting substance is made to be shorter than that of the second light-emitting substance, whereby part of excitation energy of the first light-emitting substance is transferred to the second light-emitting substance, so that the second light-emitting substance can emit light. Therefore, in the light-emitting element of one embodiment of the present invention, the emission peak wavelength of the first light-emitting substance is preferably shorter than that of the second light-emitting substance. Note that it has been known that the efficiency of energy transfer is inversely proportional to the 6th power of a distance between the substances; therefore, the ratio of light emission of the first light-emitting substance to light emission of the second light-emitting substance can be adjusted by adjusting the thickness of the layer 222 provided on the cathode side.

In a manner similar to the light-emitting element of Embodiment 2, a long lifetime can be achieved in the light-emitting element of Embodiment 3 with the carrier balance which does not change easily over time. Further, since holes and electrons can be utilized for forming an excited state without waste, emission efficiency is high. Furthermore, since both the first light-emitting substance and the second light-emitting substance can emit light, light emission having a broad spectrum or white light emission can be obtained.

Embodiment 4

In Embodiment 4, a stack order and a light-emitting direction of a light-emitting element will be described with reference to FIGS. 3A to 3C and FIGS. 4A to 4C in the case where the light-emitting element of one embodiment of the present invention, which is described in Embodiment 2 or Embodiment 3, is fainted over a substrate.

Figure 3A:
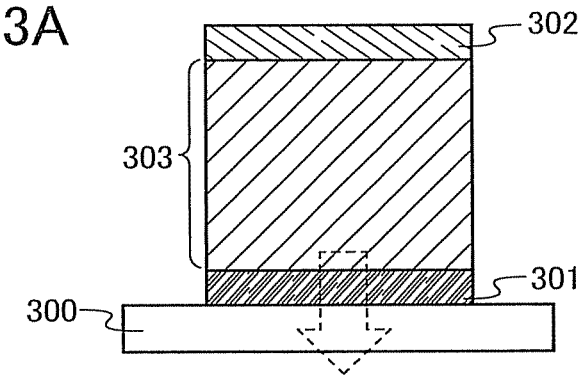
FIGS. 3A to 3C each illustrate a light-emitting element according to one embodiment of the present invention.
Figure 3B:
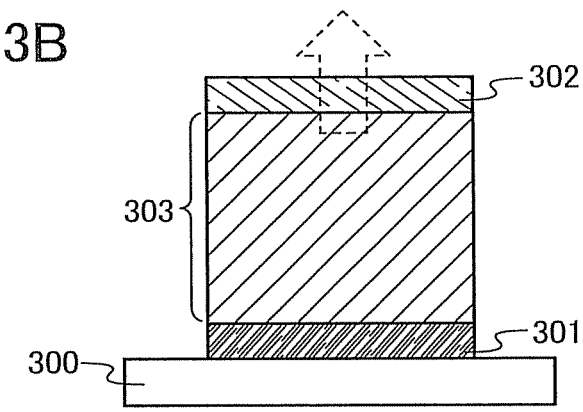
Figure 3C:
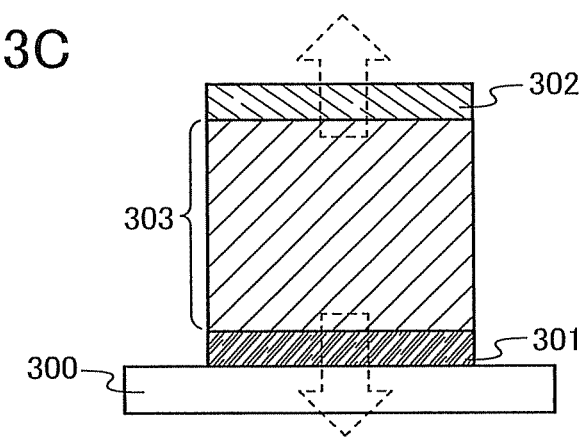

FIGS. 3A to 3C and FIGS. 4A to 4C are schematic views in the case where a light-emitting element of one embodiment of the present invention which includes an anode 301, a cathode 302, and a layer 303 containing a light-emitting substance is formed over a substrate 300. FIGS. 3A to 3C each illustrate the case where the anode 301 is formed closer to the substrate 300, and FIGS. 4A to 4C each illustrate the case where the cathode 302 is formed closer to the substrate 300. Note that as to the anode 301, the cathode 302, and the layer 303 containing a light-emitting substance, the structure described in Embodiment 2 or Embodiment 3 may be applied.

Light emission is extracted outside through one of or both the anode 301 and the cathode 302. Thus, one of or both the anode 301 and the cathode 302 are electrodes having a property of transmitting visible light. As the electrode having a property of transmitting visible light, ITO, IZO, ITSO, IWZO, a conductive composition containing a conductive high molecule, or the like, which are described in Embodiment 2, is used. Further, metal or an alloy may be formed to be thin enough to have a property of transmitting visible light.

First, the case where the anode 301 is formed over the substrate 300 (FIGS. 3A to 3C) is described. When the anode 301 and the substrate 300 each have a property of transmitting visible light and the cathode 302 has a light-shielding property, light emission is extracted from the substrate 300 side as illustrated in FIG. 3A. When at least one of the anode 301 and the substrate 300 has a light-shielding property and only the cathode 302 has a property of transmitting visible light, light emission is extracted from the side opposite to the substrate 300 as illustrated in FIG. 3B. When the anode 301, the cathode 302, and the substrate 300 each have a property of transmitting visible light, light emission is extracted from both the substrate 300 side and the side opposite to the substrate 300 as illustrated in FIG. 3C.

Figure 4A:
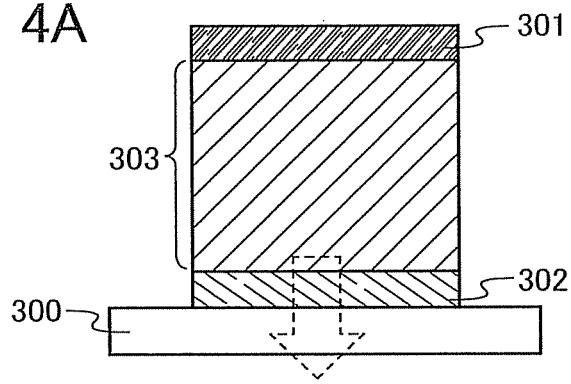
FIGS. 4A to 4C each illustrate a light-emitting element according to one embodiment of the present invention.
Figure 4B:
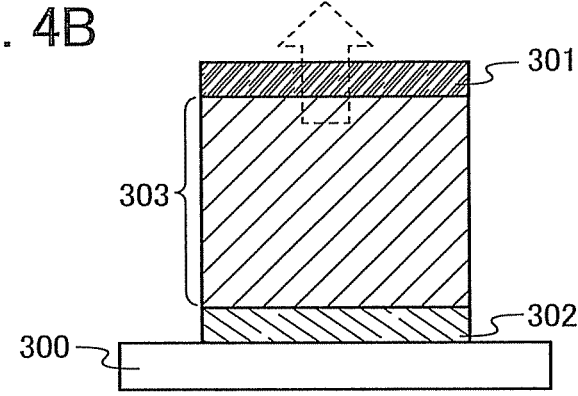
Figure 4C:
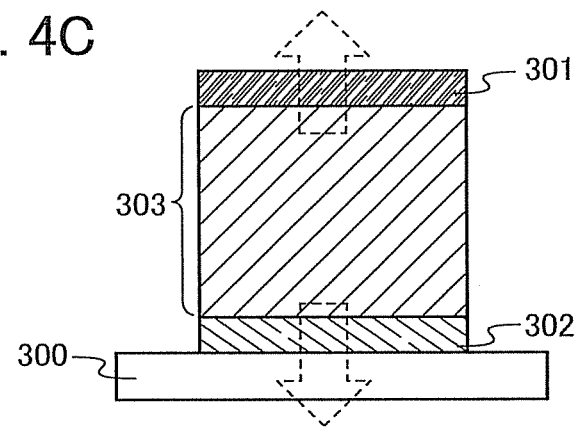

Next, the case where the cathode 302 is formed over the substrate 300 (FIGS. 4A to 4C) is described. When the cathode 302 and the substrate 300 each have a property of transmitting visible light and the anode 301 has a light-shielding property, light emission is extracted from the substrate 300 side as illustrated in FIG. 4A. When at least one of the cathode 302 and the substrate 300 has a light-shielding property and the anode 301 has a property of transmitting visible light, light emission is extracted from the side opposite to the substrate 300 as illustrated in FIG. 4B. When the anode 301, the cathode 302, and the substrate 300 each have a property of transmitting visible light, light emission is extracted from both the substrate 300 side and the side opposite to the substrate 300 as illustrated in FIG. 4C.

Note that the substrate 300 is used as a support of the light-emitting element. For the substrate 300, for example, glass or plastic can be used. When a property of transmitting visible light is not necessary (in the case of FIG. 3B or FIG. 4B), a silicon substrate, a substrate of a metal foil, or the like can also be used. Note that any material other than these may be used as long as it functions as a support in a manufacturing process of the light-emitting element.

Note that in this embodiment, the light-emitting element is formed over a substrate formed of glass, plastic, or the like. By forming a plurality of such light-emitting elements over one substrate, a passive matrix light-emitting device can be manufactured. Further, for example, a thin film transistor (TFT) is formed over a substrate fainted of glass, plastic, or the like, and the light-emitting element may be formed over an electrode which is electrically connected to the TFT. Accordingly, an active matrix light-emitting device in which drive of the light-emitting elements is controlled by the TFTs can be manufactured. Note that there is no particular limitation on the structure of the TFT, and either a staggered TFT or an inverted staggered TFT may be employed. Furthermore, a driver circuit formed over a TFT substrate may include both an n-channel TFT and a p-channel TFT or only one of an n-channel TFT and a p-channel TFT. Moreover, there is no particular limitation on the crystallinity of a semiconductor film used for the TFT, and either an amorphous semiconductor film or a crystalline semiconductor film may be used. Note that as a TFT electrically connected to an electrode of the light-emitting element, a p-channel TFT is preferably used in the case where the electrode is an anode and an n-channel TFT is preferably used in the case where the electrode is a cathode.

Embodiment 5

In Embodiment 5, a mode of a light-emitting element in which a plurality of light-emitting units of one embodiment of the present invention is stacked (hereinafter referred to as a stacked-type light-emitting element) will be described with reference to FIG. 5. This light-emitting element is a stacked-type light-emitting element including a plurality of light-emitting units between an anode and a cathode. The structure of each light-emitting unit can be similar to the structure of the layer 203 containing the light-emitting substance described in FIGS. 2A and 2B (in Embodiment 2 or Embodiment 3). That is, the light-emitting element described in Embodiment 2 or Embodiment 3 is a light-emitting element including one light-emitting unit. In this embodiment, a light-emitting element including a plurality of light-emitting units is described.

Figure 5:
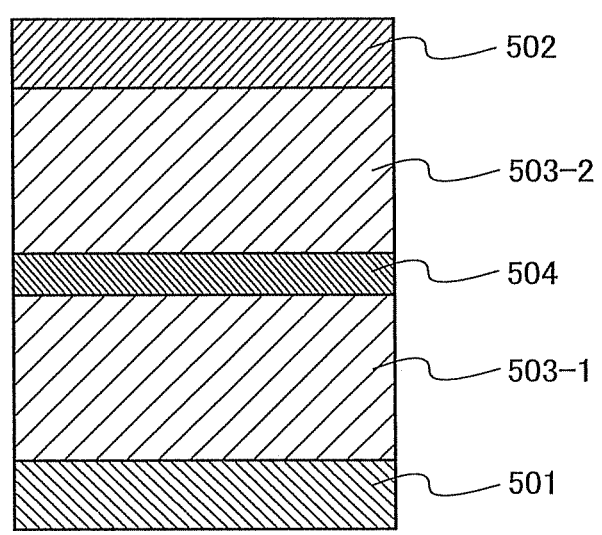
FIG. 5 illustrates a light-emitting element according to one embodiment of the present invention.

In FIG. 5, a first light-emitting unit 503-1 and a second light-emitting unit 503-2 are stacked between an anode 501 and a cathode 502. As the anode 501 and the cathode 502, an anode and a cathode which are similar to those described in Embodiment 2 can be applied. In addition, the first light-emitting unit 503-1 and the second light-emitting unit 503-2 may have either the same structure or different structures, which are similar to that of the layer 203 containing the light-emitting substance described in Embodiment 2 or Embodiment 3. Further, as long as one of the first light-emitting unit 503-1 and the second light-emitting unit 503-2 has a structure similar to that of the layer 203 containing the light-emitting substance described in Embodiment 2 or Embodiment 3, the other may have another known structure.

Any structure of a charge generation layer 504 interposed between the first light-emitting unit 503-1 and the second light-emitting unit 503-2 is acceptable as long as electrons are injected into the first light-emitting unit 503-1 and holes are injected into the second light-emitting unit 503-2 when a voltage is applied between the anode 501 and the cathode 502. However, as a preferable example, the charge generation layer 504 has a structure in which at least two layers of a layer which can inject electrons and a layer which can inject holes are included and the layer which can inject electrons is in contact with the first light-emitting unit 503-1 and the layer which can inject holes is in contact with the second light-emitting unit 503-2. Alternatively, a structure may be employed in which a layer including a substance with a high electron-transporting property (an electron-relay layer) is provided between the layer which can inject holes and the layer which can inject electrons.

As the layer which can inject electrons, a layer having a structure similar to that of the cathode or the electron-injecting layer which is described in Embodiment 2 can be used. In particular, a composite material in which a donor substance is contained in a layer formed of a substance having an electron-transporting property, which is described in Embodiment 2, is preferable.

On the other hand, as the layer which can inject holes, a layer having a structure which is similar to that of the anode and the hole-injecting layer which are described in Embodiment 2 can be used. In particular, a composite material in which an acceptor substance is contained in a layer formed of a substance having a hole-transporting property, as described in Embodiment 2, is preferable.

As a substance with a high electron-transporting property which can be used for the electron relay layer, a substance of which LUMO level is greater than or equal to −5.0 eV is preferably used, and a perylene derivative, a nitrogen-containing condensed aromatic compound, or the like is suitable to be used. Specific examples of the perylene derivative include 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H). Further, specific examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR). Besides, the following materials can be used for the electron-relay layer: perfluoropentacene, 7,7,8,8-tetracyanoquinodimethane (abbreviation: TCNQ), 1,4,5,8-naphthalenetetracarboxylic dianhydride (abbreviation: NTCDA), copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), and methanofullerene such as [6,6]-phenyl C$_{61}$ butyric acid methyl ester (abbreviation: PCBM).

As a specific example of the charge generation layer 504, a structure is given in which a layer where lithium is added to BPhen, which is a substance having an electron-transporting property, and a layer where molybdenum oxide is added to NPB, which is a substance having a hole-transporting property, are stacked in this order from the anode 501 side. Alternatively, a structure in which an electron-relay layer including 3,4,9,10-perylenetetracarboxylic-bis-benzimidazole (abbreviation: PTCBI) is provided between the above two layers is given.

As for the combination of the structures of the light-emitting units, in the case where one of the light-emitting units employs the structure of the layer 203 containing the light-emitting substance, which is described in Embodiment 2 or Embodiment 3, so that blue light and green light are obtained from the first light-emitting substance and the second light-emitting substance, the light-emitting element described in this embodiment can provide white light consisting of red light, green light, and blue light, when red light is obtained in the other of the light-emitting units. Similarly, the light-emitting element described in this embodiment can provide white light consisting of red light, green light, and blue light, in the case where blue light is obtained in one of the light-emitting units and the other of the light-emitting units employs the structure of the layer 203 containing the light-emitting substance, which is described in Embodiment 2 or Embodiment 3, so that green light and red light are obtained from the first light-emitting substance and the second light-emitting substance.

For example, in one of the light-emitting units, when a structure of the layer 203 containing the light-emitting substance described in Embodiment 2 or Embodiment 3 is applied to one of the light-emitting units and a substance emitting blue fluorescence (blue fluorescent light-emitting substance) is used as the first light-emitting substance and a substance emitting green phosphorescence (green phosphorescent light-emitting substance) is used as the second light-emitting substance, a triplet energy of the blue fluorescent light-emitting substance, the first organic compound, or the second organic compound is preferably larger than that of the green phosphorescent light-emitting substance. In the case where the triplet energy of the blue fluorescent light-emitting substance, the first organic compound, or the second organic compound is smaller than that of the green phosphorescent light-emitting substance, energy transfer from the green phosphorescent light-emitting substance occurs and efficiency of phosphorescence emission is decreased due to radiationless deactivation of triplet exciton. Since the triplet energy of the anthracene derivative which is used as the light-emitting substance in one embodiment of the present application is low, it is probable that the efficiency of phosphorescence emission is significantly decreased. Therefore, triplet energy of a material used for the light-emitting layer and a peripheral material thereof is necessary to be considered. Accordingly, materials are limited and a structure of an element becomes complicated.

Therefore, it is preferable that light-emitting units be separated to a unit emitting fluorescence and a unit emitting phosphorescence. Accordingly, without consideration of the complicated energy transfer between a fluorescent light-emitting substance and a phosphorescent light-emitting substance, a light-emitting element can be obtained which provides white light consisting of the three primary colors, red, green, and blue by utilizing phosphorescence, which is advantageous in terms of efficiency. Since light-emitting substances emitting red phosphorescence and green phosphorescence which exhibit favorable characteristics have been developed, a light-emitting unit providing light with a long wavelength such as red light or green light is preferably employed as the light-emitting unit using phosphorescence.

In the case where both the first and the second light-emitting units are the units which emit light obtained from two kinds of light-emitting substances, a preferable structure of a light-emitting element which provides white light is as follows: the light-emitting substances of which colors of light are complementary to each other are combined in each unit, and in addition, the combination of the light-emitting substances in the first light-emitting unit is different from that in the second light-emitting unit (in other words, each of the first light-emitting unit and the second light-emitting unit is a light-emitting unit which provides white light utilizing complementary colors by combining light with different wavelengths). This is because changes in emission color with accumulation of driving time can be suppressed.

In Embodiment 5, the light-emitting element having two light-emitting units is described; however, a light-emitting element in which three or more light-emitting units are stacked can also be formed in a similar manner. By arranging a plurality of light-emitting units between a pair of electrodes to be partitioned by a charge generation layer as in the light-emitting element of this embodiment, light emission in a region of high luminance can be realized while the current density is kept low; thus, a long-lifetime element can be achieved. Further, when the light-emitting element is applied to lighting, a drop in voltage due to the resistance of an electrode material can be suppressed, and thus, uniform light emission in a large area can be achieved. Moreover, a light-emitting device which can be driven at low voltage with low power consumption can be realized.

Note that Embodiment 5 can be combined with any of the other embodiments as appropriate. For example, the substrate, the stack order, and the light-emitting direction, which are as described in Embodiment 4, can be selected and combined as appropriate.

Embodiment 6

Figure 6A:
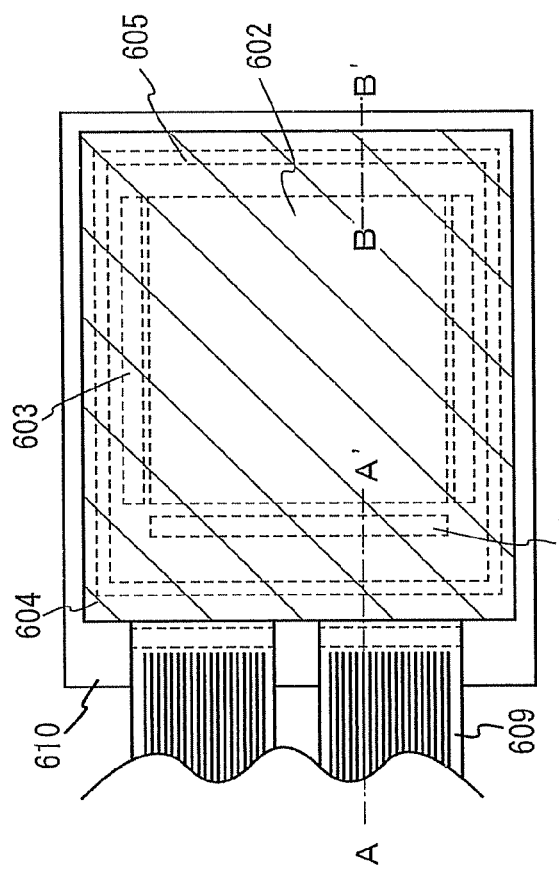
FIGS. 6A and 6B illustrate a light-emitting device according to one embodiment of the present invention.
Figure 6B:
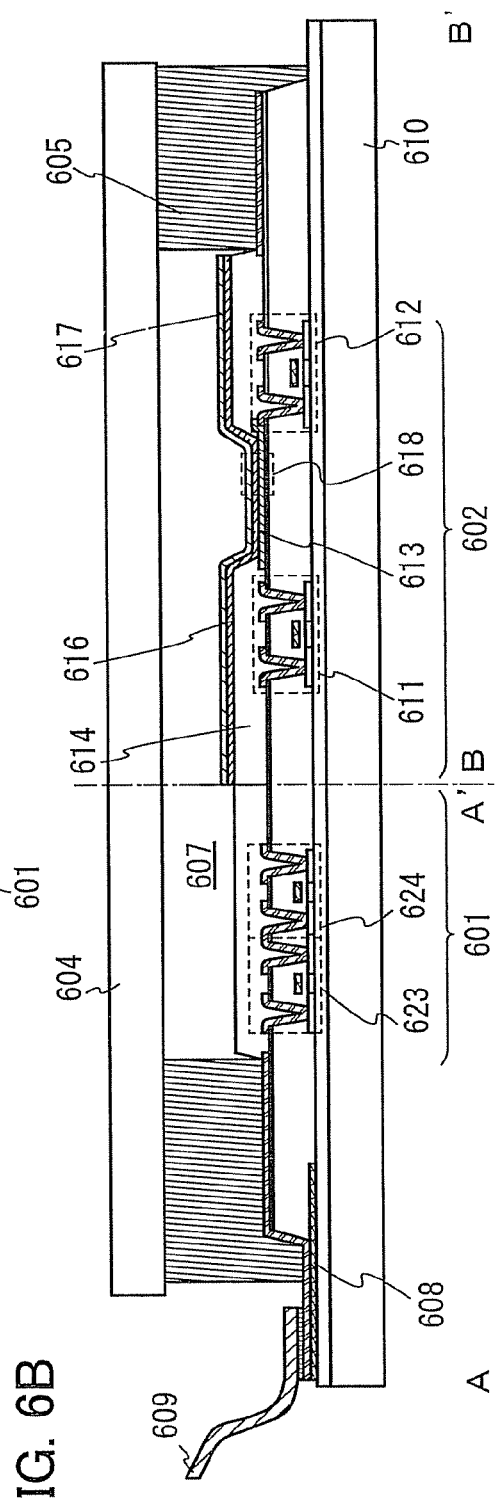

In Embodiment 6, a light-emitting device having a light-emitting element of one embodiment of the present invention will be described with reference to FIGS. 6A and 6B. Note that FIG. 6A is a top view of the light-emitting device, and FIG. 6B is a cross-sectional view taken along lines A-A' and B-B' in FIG. 6A. The light-emitting device includes a driver circuit portion (a source side driver circuit) 601, a pixel portion 602, and a driver circuit portion (a gate side driver circuit) 603 which are indicated by dotted lines and control light emission of the light-emitting element. Reference numerals 604 and 605 denote a sealing substrate and a sealing material, respectively. A portion surrounded by the sealing material 605 is a space 607.

A lead wiring 608 is a wiring used to transmit signals to be inputted to the source side driver circuit 601 and the gate side driver circuit 603 and receives a video signal, a clock signal, a start signal, a reset signal, and the like from a flexible printed circuit (FPC) 609 which is an external input terminal. Note that only the FPC is illustrated here; however, the FPC may be provided with a printed wiring board (PWB). The category of the light-emitting device in this specification includes not only a light-emitting device itself but also a light-emitting device to which an FPC or a PWB is attached.

Next, a cross-sectional structure is described with reference to FIG. 6B. The driver circuit portion and the pixel portion are formed over an element substrate 610. Here, the source side driver circuit 601 that is the driver circuit portion and one pixel in the pixel portion 602 are illustrated.

A CMOS circuit, which is a combination of an n-channel TFT 623 and a p-channel TFT 624, is formed as the source side driver circuit 601. The driver circuit may be formed using a variety of circuits such as a CMOS circuit, a PMOS circuit, or an NMOS circuit. Although a driver-integration type structure in which a driver circuit is formed over the substrate is described in this embodiment mode, a driver circuit is not necessary to be fainted over the substrate and can be formed externally from the substrate.

The pixel portion 602 includes a plurality of pixels each of which includes a switching TFT 611, a current control TFT 612, and an anode 613 which is electrically connected to a drain of the current control TFT 612. Note that an insulator 614 is formed to cover end portions of the anode 613. Here, the insulator 614 is formed using a positive photosensitive acrylic resin film.

The insulator 614 is formed so as to have a curved surface having curvature at an upper end portion or a lower end portion thereof in order to make the coverage favorable. For example, in the case of using a positive photosensitive acrylic resin as a material for the insulator 614, it is preferable that the insulator 614 be formed so as to have a curved surface with radius of curvature (0.2 µm to 3 µm) only at the upper end portion thereof. The insulator 614 can be formed using either a negative type which becomes insoluble in an etchant by light irradiation or a positive type which becomes soluble in an etchant by light irradiation.

A layer 616 containing a light-emitting substance and a cathode 617 are formed over the anode 613. Here, the anode 613 is preferably formed using a material having a high work function. For example, it is possible to use a single-layer film such as an ITO film, indium tin oxide film containing silicon, an indium oxide film containing zinc oxide of 2 wt % to 20 wt %, a titanium nitride film, a chromium film, a tungsten film, a Zn film, or a Pt film; a stacked layer of a titanium nitride film and a film containing aluminum as its main component; or a three-layer structure of a titanium nitride film, a film containing aluminum as its main component, and another titanium nitride film. When a stacked layer structure is employed, low resistance as a wiring, a favorable ohmic contact, and further a function as an anode can be achieved.

The layer 616 containing a light-emitting substance is formed by any of a variety of methods such as an evaporation method using an evaporation mask, an ink-jet method, or a spin coating method. The layer 616 containing a light-emitting substance has the structure of the light-emitting element of one embodiment of the present invention as described in Embodiments 2 to 5.

As a material used for the cathode 617, which is formed over the layer 616 containing a light-emitting substance, a material having a low work function (Al, Mg, Li, Ca, or an alloy or a compound thereof such as Mg—Ag, Mg—In, Al—Li, LiF, or $CaF_2$) is preferably used. In the case where light generated in the layer 616 containing a light-emitting substance is transmitted through the cathode 617, a stacked layer of a metal thin film with reduced thickness and a transparent conductive film (ITO, indium oxide containing zinc oxide of 2 wt % to 20 wt %, indium oxide-tin oxide containing silicon or silicon oxide, zinc oxide (ZnO), or the like) is preferably used as the cathode 617.

The sealing substrate 604 is attached to the element substrate 610 with the use of the sealing material 605; thus, a light-emitting element 618 of one embodiment of the present invention described in Embodiments 2 to 3 is provided in the space 607 surrounded by the element substrate 610, the sealing substrate 604, and the sealing material 605. Note that the space 607 is filled with a filler. The space 607 is filled with an inert gas (e.g., nitrogen or argon) or the sealing material 605 in some cases.

Note that it is preferable that an epoxy-based resin be used to form the sealing material 605 and that such a material permeate as little moisture and oxygen as possible. Further, the sealing substrate 604 can be a plastic substrate made of fiberglass-reinforced plastic (FRP), polyvinyl fluoride (PVF), polyester, acrylic, or the like as well as a glass substrate or a quartz substrate.

As described above, a light-emitting device of one embodiment of the present invention including the light-emitting element of one embodiment of the present invention and a TFT which is a means for controlling the light-emitting element can be obtained. The light-emitting device of Embodiment 6 can be utilized as an image display device.

The light-emitting device of one embodiment of the present invention has high reliability because the long-lifetime light-emitting element of one embodiment of the present invention is used.

Further, the light-emitting element of one embodiment of the present invention can provide white light. Therefore, when a white light-emitting element of one embodiment of the present invention is applied as the light-emitting element of Embodiment 6, a white image display device can be manufactured. Furthermore, the sealing substrate 604 or the element substrate 610 is provided with red, blue, and green color filters to transmit white light of the light-emitting element of one embodiment of the present invention, so that pixels of red, blue, and green, which are the three primary colors of light, can be obtained. Therefore, the light-emitting device of one embodiment of the present invention can also be used as a full-color image display device. Moreover, when a structure is employed in which color filters are provided only in part of pixels and color filters are not provided in the other pixels, it is also possible to form four kinds of a red pixel, a blue pixel, a green pixel, and a white pixel, and a full-color image can be displayed. Such a method of using four kinds of pixels is effective in reducing power consumption.

Figure 7A:
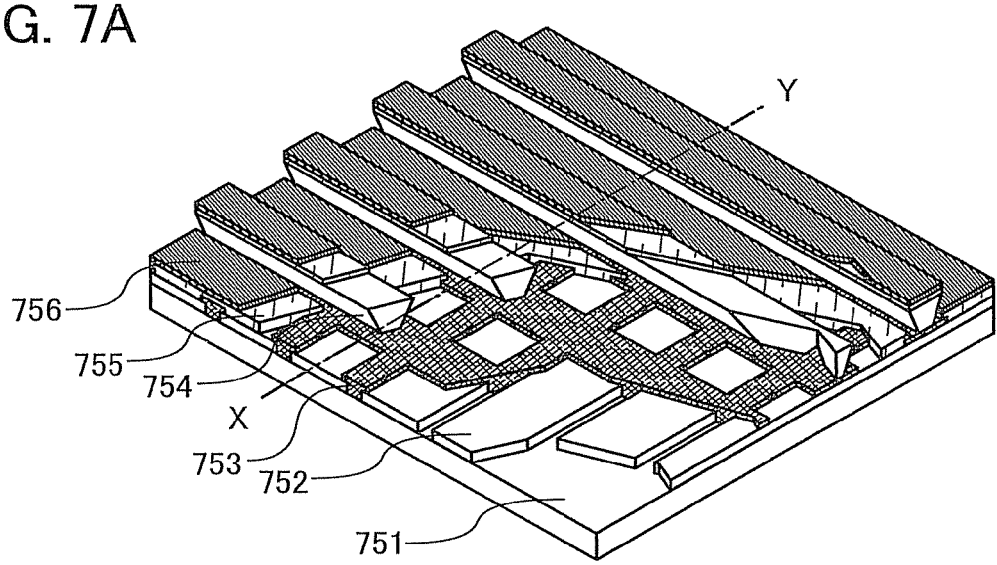
FIGS. 7A and 7B illustrate a light-emitting device according to one embodiment of the present invention.
Figure 7B:
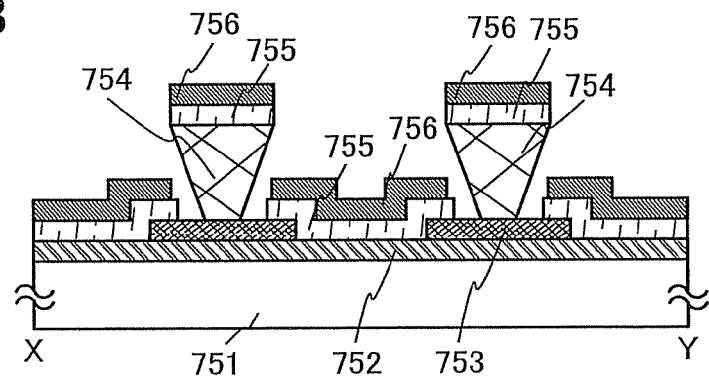

As described above, the active matrix light-emitting device in which the driving of the light-emitting element is controlled by a TFT is described in this embodiment. Alternatively, a passive matrix light-emitting device may be employed as well. FIGS. 7A and 7B illustrate a passive matrix light-emitting device having the light-emitting element of one embodiment of the present invention. FIG. 7A is a perspective view of the light-emitting device, and FIG. 7B is a cross-sectional view taken along line X-Y of FIG. 7A. In FIGS. 7A and 7B, over a substrate 751, a layer 755 containing a light-emitting substance is provided between an electrode 752 and an electrode 756. As the layer containing a light-emitting substance, a structure described in Embodiment 2 may be applied. An end portion of the electrode 752 is covered with an insulating layer 753. Then, a partition layer 754 is provided over the insulating layer 753. Sidewalls of the partition layer 754 are slanted so that a distance between one of the sidewalls and the other sidewall becomes narrower toward a substrate surface. In other words, a cross section of the partition layer 754 in the direction of a narrow side is trapezoidal, and a base (a side which faces the same direction as a plane direction of the insulating layer 753 and is in contact with the insulating layer 753) is shorter than an upper side (a side which faces in the same direction as the plane direction of the insulating layer 753 and is not in contact with the insulating layer 753). The partition layer 754 provided in this manner can prevent the light-emitting element from being defective due to static electricity or the like. When the passive matrix light-emitting device includes the light-emitting element of one embodiment of the present invention, a highly reliable light-emitting device can be obtained.

Embodiment 7

In Embodiment 7, as an example of the light-emitting device having a light-emitting element of one embodiment of the present invention, a liquid crystal display device using the light-emitting element of one embodiment of the present invention as a backlight will be exemplified.

Figure 8:
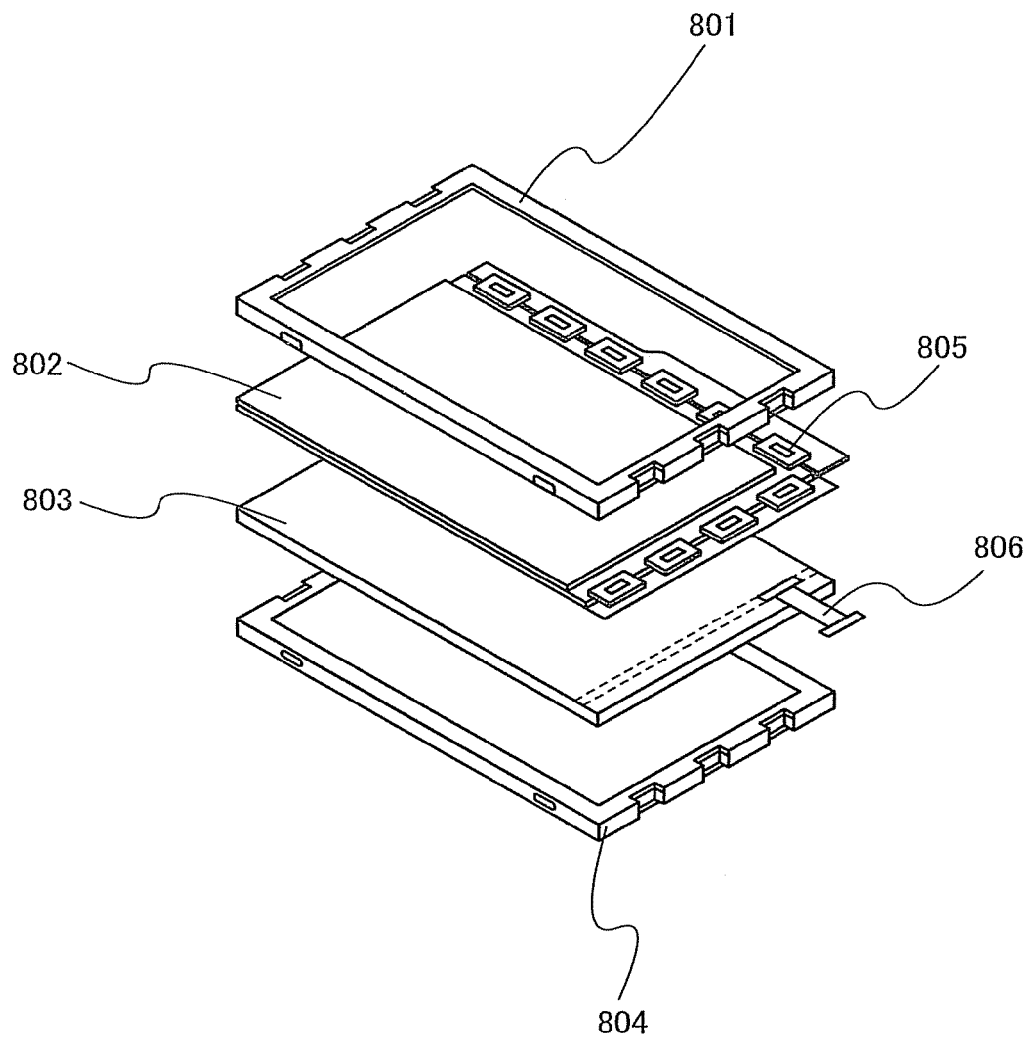
FIG. 8 illustrates a light-emitting device according to one embodiment of the present invention.

FIG. 8 illustrates an example of a liquid crystal display device using the light-emitting element of one embodiment of the present invention as a backlight. The liquid crystal display device illustrated in FIG. 8 includes a housing 801, a liquid crystal layer 802, a backlight 803, and a housing 804. The liquid crystal layer 802 is connected to a driver IC 805. Further, the light-emitting element of one embodiment of the present invention as in Embodiments 2 to 5 is used for the backlight 803, and a current is supplied through a terminal 806.

By using the light-emitting element of one embodiment of the present invention as a backlight of a liquid crystal display device, a long-lifetime backlight can be obtained; thus, a highly reliable liquid crystal display device can be obtained. Further, the light-emitting element of one embodiment of the present invention is a light-emitting element with plane light emission and can be increased in size. Therefore, the size of a backlight can be increased; thus, a large liquid crystal display can be provided.

Embodiment 8

In Embodiment 8, a lighting device will be described as an example of the light-emitting device having a light-emitting element of one embodiment of the present invention.

Figure 9A:
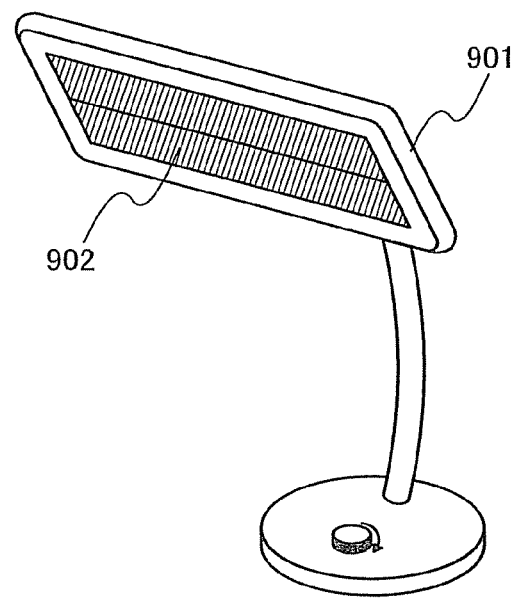
FIGS. 9A and 9B each illustrate a light-emitting device according to one embodiment of the present invention.

FIG. 9A illustrates an example in which the light-emitting device having a light-emitting element of one embodiment of the present invention is applied to a table lamp which is a lighting device. The table lamp illustrated in FIG. 9A has a housing 901 and a light source 902. The light-emitting element of one embodiment of the present invention as in Embodiments 2 to 5 is used as the light source 902. By using the light-emitting element of one embodiment of the present invention as a light source, a long-lifetime light source can be obtained; thus, a highly reliable table lamp can be obtained.

Figure 9B:
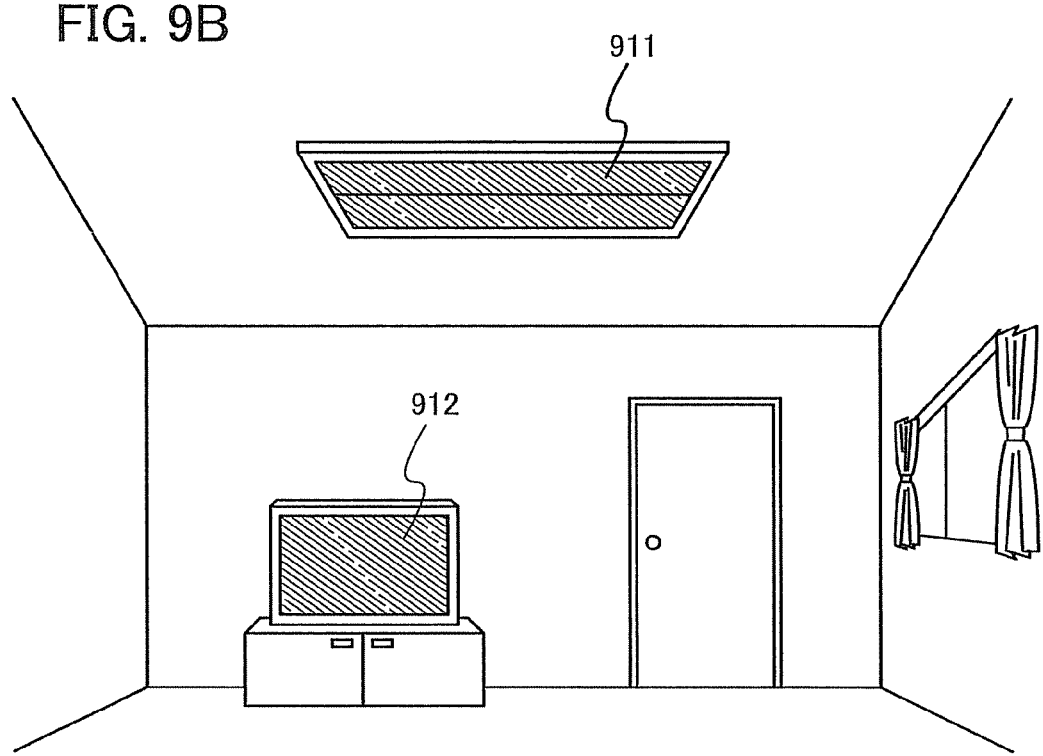

FIG. 9B illustrates an example in which the light-emitting device having a light-emitting element of one embodiment of the present invention as in Embodiments 2 to 5 is applied to an indoor lighting device 911. Since the light-emitting element of one embodiment of the present invention can be increased in size, the light-emitting element of one embodiment of the present invention can be used for a large lighting device. A television device 912 (the detail will be described in Embodiment 9) using the light-emitting device of one embodiment of the present invention as in FIGS. 6A and 6B, FIGS. 7A and 7B, or FIG. 8 as an image display device is thus placed in a room where the light-emitting element of one embodiment of the present invention is used for the indoor lighting device 911 so that public broadcasting and movies can be enjoyed.

Embodiment 9

In Embodiment 9, electronic devices of one embodiment of the present invention will be described which include any of the light-emitting devices of one embodiment of the present invention. In particular, electronic devices of one embodiment of the present invention each of which includes the light-emitting device of one embodiment of the present invention as a display portion will be described. The electronic device of one embodiment of the present invention has a highly reliable display portion because the light-emitting device of one embodiment of the present invention as in Embodiments 6 to 8 is included.

Examples of the electronic devices each including a light-emitting element of one embodiment of the present invention include cameras such as video cameras and digital cameras, goggle type displays, navigation systems, audio playback devices (e.g., car audio sets, audio component sets, and the like), computers, game machines, portable information terminals (e.g., mobile computers, cellular phones, portable game machines, and e-book readers), and image reproducing devices in which a recording medium is provided (specifically, devices for reproducing a recording medium such as a digital versatile disc (DVD) and having a display device for displaying the reproduced image). Specific examples of these electronic devices are illustrated in FIGS. 10A to 10D.

Figure 10A:
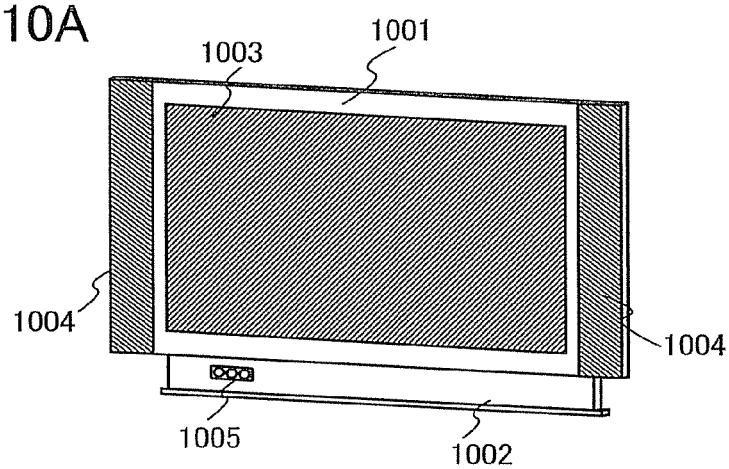
FIGS. 10A to 10D each illustrate an electronic device according to one embodiment of the present invention.

FIG. 10A illustrates a television set of one embodiment of the present invention, which includes a housing 1001, a supporting base 1002, a display portion 1003, a speaker portion 1004, a video input terminal 1005, and the like. In this television set, the display portion 1003 includes the light-emitting device of one embodiment of the present invention as in Embodiments 6 and 7. Therefore, image quality of the display portion 1003 is scarcely deteriorated. Such features contribute to significant reduction or downsizing of the deterioration compensation function circuits and power source circuits in the television set; therefore, reduction in size and weight of the housing 1001 and the supporting base 1002 can be achieved. In the television set of one embodiment of the present invention, high reliability, high image quality, and reduction in size and weight are achieved; therefore, products suitable for living environment can be provided.

Figure 10B:
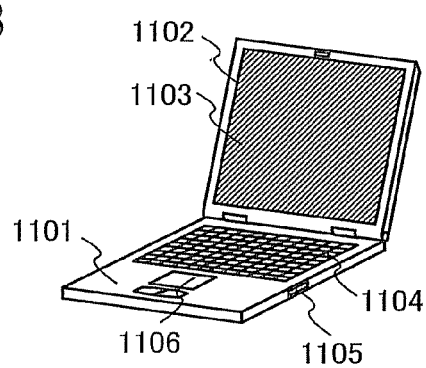

FIG. 10B illustrates a computer of one embodiment of the present invention, which includes a main body 1101, a housing 1102, a display portion 1103, a keyboard 1104, an external connection port 1105, a pointing device 1106, and the like. In this computer, the display portion 1103 includes the light-emitting device of one embodiment of the present invention as in Embodiments 6 and 7. In the computer of one embodiment of the present invention, high reliability, high image quality, and reduction in size and weight are achieved; therefore, products suitable for the environment can be provided.

Figure 10C:
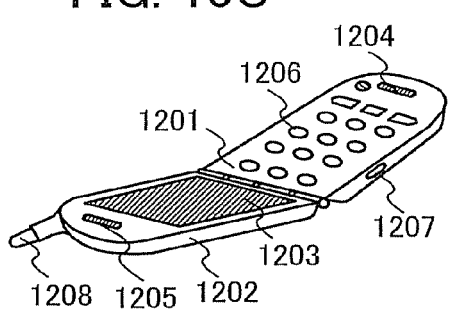

FIG. 10C illustrates a cellular phone of one embodiment of the present invention, which includes a main body 1201, a housing 1202, a display portion 1203, an audio input portion 1204, an audio output portion 1205, operation keys 1206, an external connection port 1207, an antenna 1208, and the like. In this cellular phone, the display portion 1203 includes the light-emitting device of one embodiment of the present invention as in Embodiments 6 and 7. Therefore, image quality of the display portion 1203 is scarcely deteriorated. Such features contribute to significant reduction or downsizing of deterioration compensation function circuits and power source circuits in the cellular phone; therefore, reduction in size and weight of the main body 1201 and the housing 1202 can be achieved. In the cellular phone of one embodiment of the present invention, high reliability, high image quality, and reduction in size and weight are achieved; therefore, products suitable for portability can be provided.

Figure 10D:
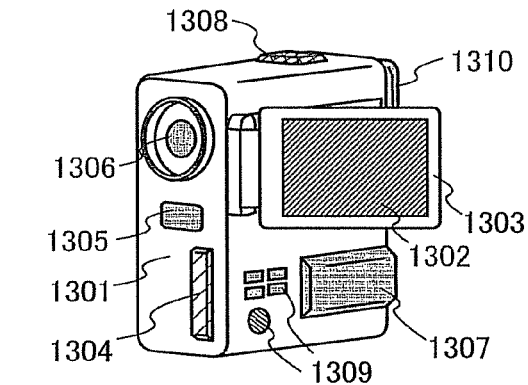

FIG. 10D illustrates a camera of one embodiment of the present invention, which includes a main body 1301, a display portion 1302, a housing 1303, an external connection port 1304, a remote control receiving portion 1305, an image receiving portion 1306, a battery 1307, an audio input portion 1308, operation keys 1309, an eyepiece portion 1310, and the like. In this camera, the display portion 1302 includes the light-emitting device of one embodiment of the present invention as described in Embodiments 6 and 7. Therefore, the display portion 1302 is scarcely deteriorated. Such features contribute to significant reduction or downsizing of deterioration compensation function circuits and power source circuits in the camera; therefore, reduction in size and weight of the main body 1301 can be achieved. In the camera of one embodiment of the present invention, high reliability, high image quality, and reduction in size and weight are achieved; therefore, products suitable for portability can be provided.

As described above, the applicable range of the light-emitting device of one embodiment of the present invention is so wide that the light-emitting device can be applied to electronic devices of a variety of fields. By applying the light-emitting device of one embodiment of the present invention to an electronic device, an electronic device having a highly reliable display portion can be provided.

Example 1

Figure 11A:
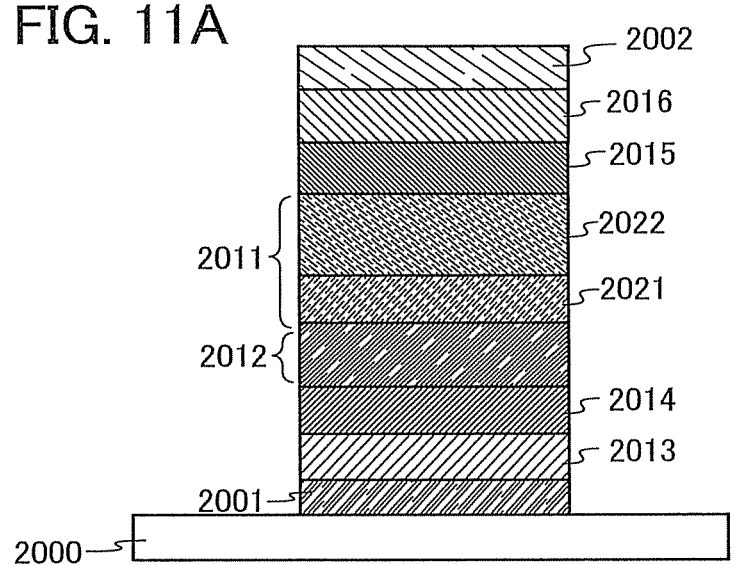
FIGS. 11A and 11B each illustrate a light-emitting element of an example.
Figure 11B:
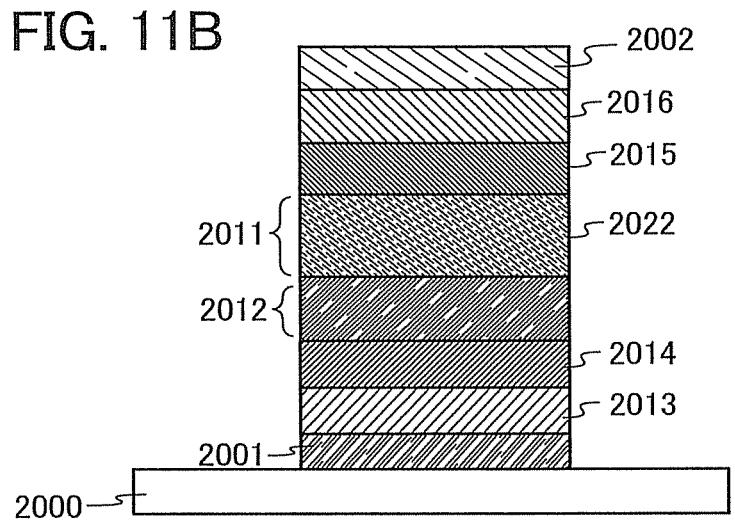

In Example 1, a manufacturing example of the light-emitting element of one embodiment of the present invention will be described with reference to FIGS. 11A and 11B. Note that a structural formula of a substance used in this example is shown below.

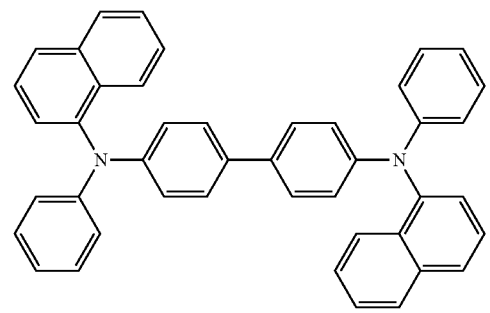

NPB

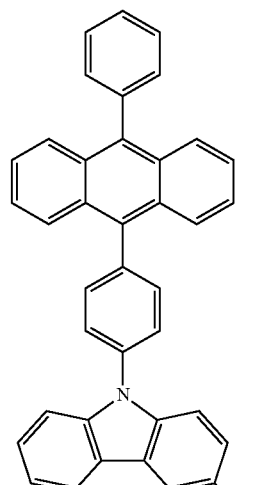

PCCPA

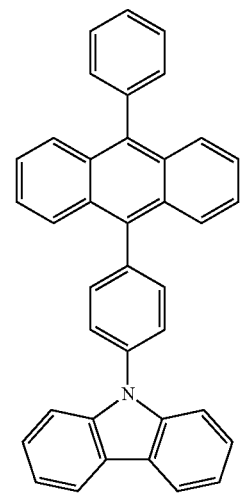

CzPA

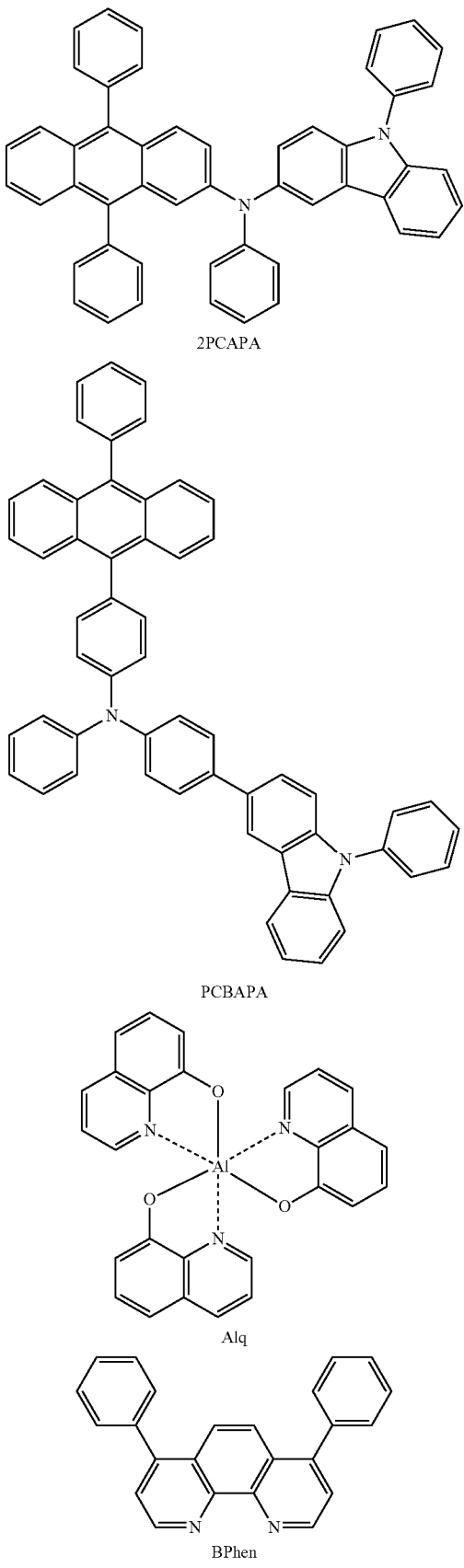

(Manufacture of Light-Emitting Element 1)

A manufacturing example of a light-emitting element 1 is described with reference to FIG. 11A. First, a glass substrate 2000 over which indium tin silicon oxide (ITSO) with a thickness of 110 nm is deposited as an anode 2001 was prepared. The periphery of the surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water, and baked at 200° C. for 1 hour, then, subjected to UV ozone treatment for 370 seconds. Then, the substrate was transferred into a vacuum evaporation apparatus whose pressure was reduced to approximately $10^{-4}$ Pa, and vacuum baking was performed at 170° C. for 30 minutes in a heating chamber in the vacuum evaporation apparatus. After that, the substrate was cooled down for approximately 30 minutes.

Next, the glass substrate 2000 over which the anode 2001 was formed was fixed to a substrate holder provided in a film formation chamber in the vacuum evaporation apparatus so that the surface where the anode 2001 is formed faced downward. Then, first, 4,4'-bis[N-(1-naphthyl)-N-phenylamino]biphenyl (abbreviation: NPB) and molybdenum (VI) oxide were co-evaporated over the anode 2001, whereby a hole-injecting layer 2013, which is formed of a composite material of an organic compound and an inorganic compound, was formed. Resistive heating was employed for evaporation. The thickness of the hole-injecting layer 2013 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to form a hole-transporting layer 2014.

Further, by co-evaporation of 9-phenyl-9'-[4-(10-phenyl-9-anthryl)phenyl]-3,3'-bi(9H-carbazole) (abbreviation: PCCPA) and N,9-diphenyl-N-(9,10-diphenyl-2-anthryl)-9H-carbazol-3-amine (abbreviation: 2PCAPA), which is a green light-emitting substance, over the hole-transporting layer 2014 using resistive heating, a second light-emitting layer 2012 was formed. The evaporation rate was adjusted such that the weight ratio of PCCPA to 2PCAPA was 1:0.02 (=PCCPA:2PCAPA). The thickness was set to be 10 nm. Since 2PCAPA serves as a light-emitting substance in the second light-emitting layer 2012, a light-emitting layer which emits green light is obtained. Note that the second light-emitting layer 2012 is a layer having a hole-transporting property.

A first light-emitting layer 2011 was formed over the second light-emitting layer 2012. First, by co-evaporation of 9-[4-(10-phenyl-9-anthryl)phenyl]-9H-carbazole (abbreviation: CzPA) and 4-(10-phenyl-9-anthryl)-4'-(9-phenyl-9H-carbazol-3-yl)triphenylamine (abbreviation: PCBAPA), which is a blue light-emitting substance, using resistive heating, a layer 2021 provided on the anode side of the first light-emitting layer 2011 was formed. The evaporation rate was adjusted such that the weight ratio of CzPA to PCBAPA was 1:2 (=CzPA:PCBAPA). The thickness of the layer 2021 provided on the anode side was set to be 10 nm. Note that although CzPA is a substance having an electron-transforming property and PCBAPA is a substance having a hole-transporting property, the layer 2021 provided on the anode side serves as a layer having a hole-transporting property since the ratio of PCBAPA is higher than that of CzPA in this layer.

Next, by co-evaporation of CzPA and PCBAPA, a layer 2022 provided on a cathode side of the first light-emitting layer 2011 was aimed. The evaporation rate was adjusted such that the weight ratio of CzPA to PCBAPA was 1:0.05 (=CzPA:PCBAPA). The thickness of the layer 2022 provided on the cathode side was set to be 20 nm. Since PCBAPA serves as a light-emitting substance in the first light-emitting layer 2011 which is formed as described above, the light-emitting layer 2011 serves as a light-emitting layer which emits blue light. Note that the layer 2022 provided on the cathode side is a layer having electron-transporting property since the ratio of CzPA is higher than that of PCBAPA, and in the light-emitting element 1, it is quite probable that carriers are recombined near the interface between the layer 2021 provided on the anode side and the layer 2022 provided on the cathode side of the first light-emitting layer 2011.

After that, by an evaporation method using resistive heating, tris(8-quinolinolato)aluminum(III) (abbreviation: Alq) was deposited to a thickness of 10 nm and bathophenanthroline (abbreviation: BPhen) was deposited to a thickness of 20 nm to form an electron-transporting layer 2015.

Further, by an evaporation method using resistive heating, lithium fluoride (LiF) was deposited to a thickness of 1 nm over the electron-transporting layer 2015, so that an electron-injecting layer 2016 is formed.

Lastly, aluminum was deposited to a thickness of 200 nm by an evaporation method using resistive heating to form a cathode 2002. Accordingly, the light-emitting element 1 was manufactured.

(Manufacture of Light-Emitting Element 2)

A light-emitting element 2 was manufactured in a manner similar to that of the light-emitting element 1 except that the weight ratio of CzPA to PCBAPA of the layer 2021 provided on the anode side of the first light-emitting layer 2011 was set to be 1:4 (=CzPA:PCBAPA).

(Manufacture of Comparative Light-Emitting Element 3)

For comparison, a comparative light-emitting element 3 was manufactured in a manner similar to that of the light-emitting element 1 except that the weight ratio of CzPA to PCBAPA of the layer 2021 provided on the anode side of the first light-emitting layer 2011 was set to be 1:0.1 (=CzPA:PCBAPA). The layer 2021 provided on an anode side in the comparative light-emitting element 3 is a layer having an electron-transporting property since the ratio of CzPA thereof is higher than that of PCBAPA, and carriers are recombined near the interface between the first light-emitting layer 2011 and the second light-emitting layer 2012.

(Comparison of Characteristics of Light-Emitting Element 1, Light-Emitting Element 2, and Comparative Light-Emitting Element 3)

Sealing was performed in a glove box under a nitrogen atmosphere so that the light-emitting element 1 of one embodiment of the present invention, the light-emitting element 2 of one embodiment of the present invention, and the comparative light-emitting element 3, which were obtained as described above, were not exposed to the atmosphere, and then operation characteristics thereof were measured. Note that the measurements were performed at a room temperature (in an atmosphere kept at 25° C.).

Figure 12:
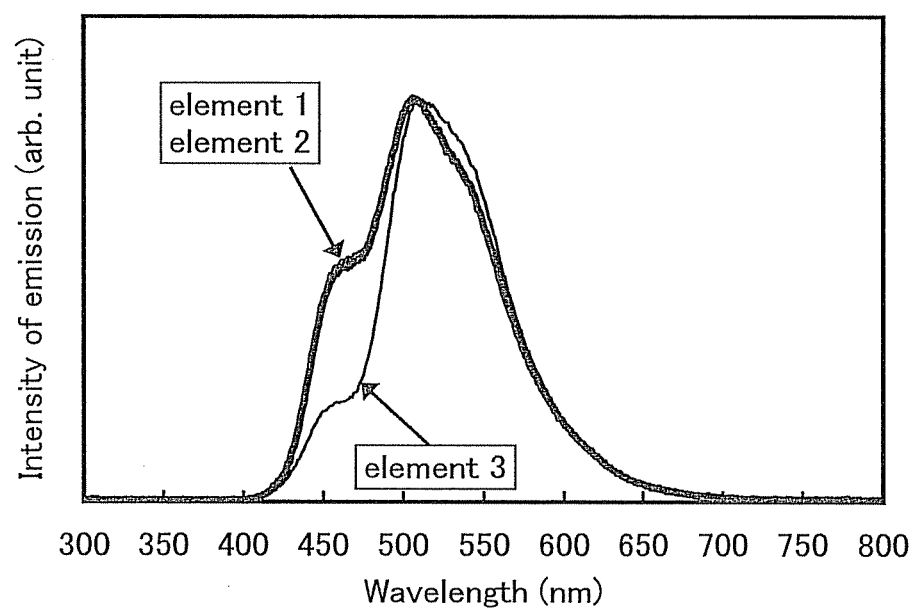
FIG. 12 illustrates a light emission spectrum of a light-emitting element manufactured in an example.

FIG. 12 illustrates an emission spectrum when a current of 1 mA flows to the light-emitting element 1, the light-emitting element 2, and the comparative light-emitting element 3. As is apparent from FIG. 12, the light-emitting element 1 and the light-emitting element 2 obtain the blue light emission near 460 nm, the intensity of which is more than half of that of green light emission at 510 nm, so that a favorable balance between blue light emission and green light emission can be achieved; whereas the intensity of blue light emission by the comparative light-emitting element 3 is extremely small. Accordingly, in the light-emitting element 1 and the light-emitting element 2 according to Embodiment 1, light with a short wavelength, which is disadvantageous in terms of energy, can be obtained in a favorable balance and emission color can be easily adjusted.

Figure 13:
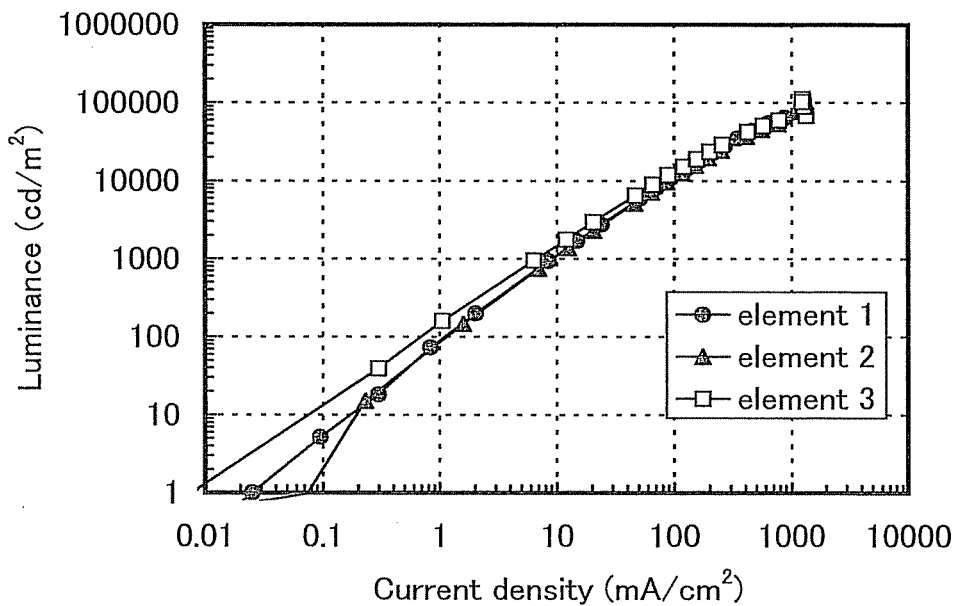
FIG. 13 illustrates current density-luminance characteristics of a light-emitting element manufactured in an example.
Figure 14:
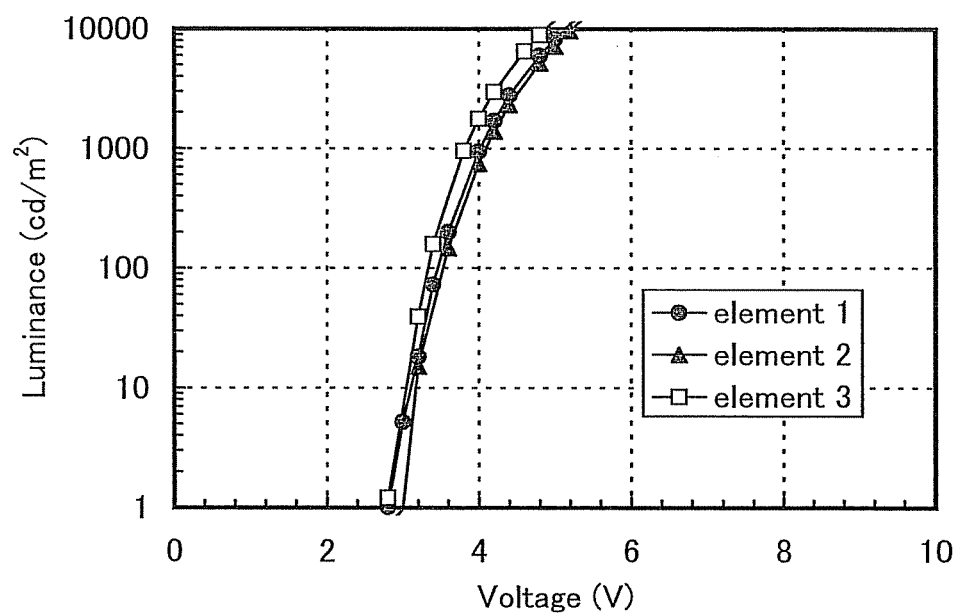
FIG. 14 illustrates voltage-luminance characteristics of a light-emitting element manufactured in an example.

Further, FIG. 13 illustrates current density-luminance characteristics of the light-emitting element 1, the light-emitting element 2, and the comparative light-emitting element 3, and FIG. 14 illustrates voltage-luminance characteristics thereof. These graphs show that the other characteristics of light-emitting element 1 and the light-emitting element 2 are almost equivalent to those of the comparative light-emitting element 3.

(Manufacture of Light-Emitting Element 4)

A light-emitting element 4 was manufactured in a manner similar to that of the light-emitting element 2 except that the thickness of the layer 2021 provided on the anode side in the light-emitting element 2 was set to be 30 nm.

(Evaluation of Characteristics of Light-Emitting Element 4)

Sealing was performed in a glove box under a nitrogen atmosphere so that the light-emitting element 4 of one embodiment of the present invention, which was obtained as described above, was not exposed to the atmosphere, and then operation characteristics of the light-emitting element 4 were measured. Note that the measurements were performed at a room temperature (in an atmosphere kept at 25° C.).

Figure 15:
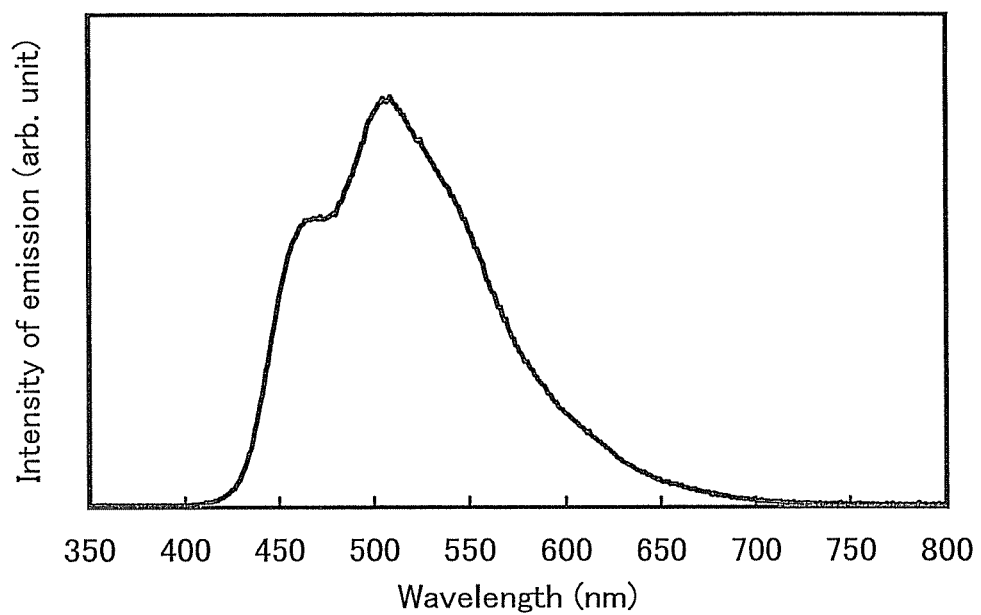
FIG. 15 illustrates an emission spectrum of a light-emitting element manufactured in an example.

FIG. 15 illustrates an emission spectrum when a current of 1 mA flows to the light-emitting element 4. FIG. 15 shows that the light-emitting element 4 obtains the blue light emission near 460 nm, the intensity of which is more than half of that of green light emission at 510 nm, so that a favorable balance between blue light emission and green light emission can be achieved. Accordingly, in the light-emitting element 4 according to Embodiment 1, light with a short wavelength, which is disadvantageous in terms of energy, can be obtained in a favorable balance and emission color can be easily adjusted.

Figure 16:
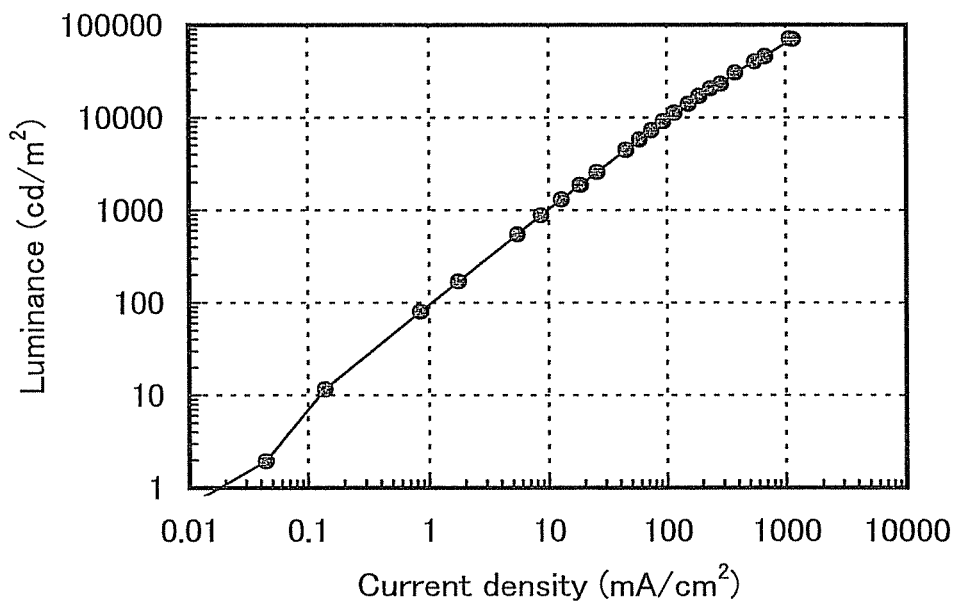
FIG. 16 illustrates current density-luminance characteristics of a light-emitting element manufactured in an example.
Figure 17:
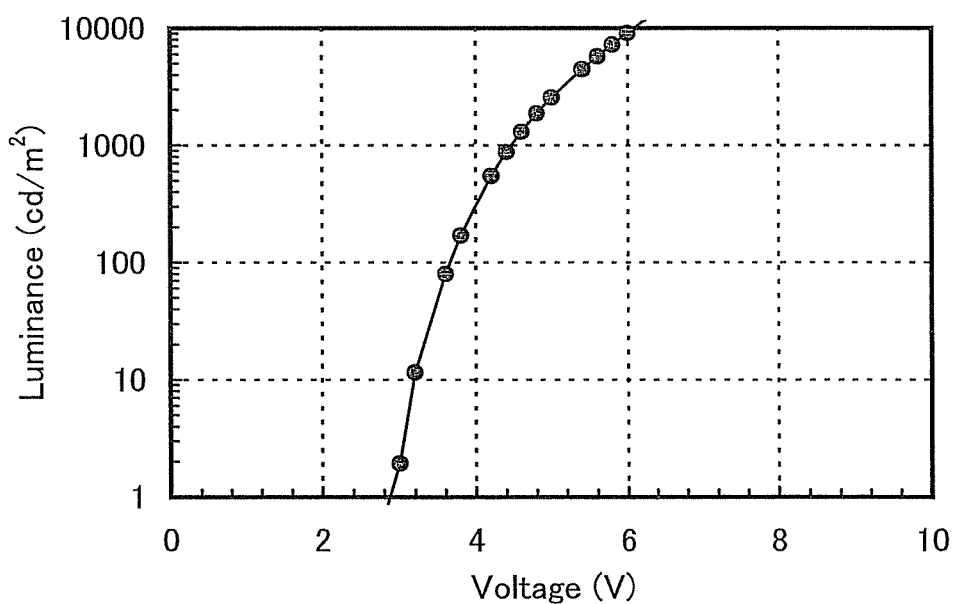
FIG. 17 illustrates voltage-luminance characteristics of a light-emitting element manufactured in an example.

Further, FIG. 16 illustrates current density-luminance characteristics of the light-emitting element 4, and FIG. 17 illustrates voltage-luminance characteristics thereof. From these graphs, it is found that the light-emitting element 4 has favorable characteristics.

Figure 18:
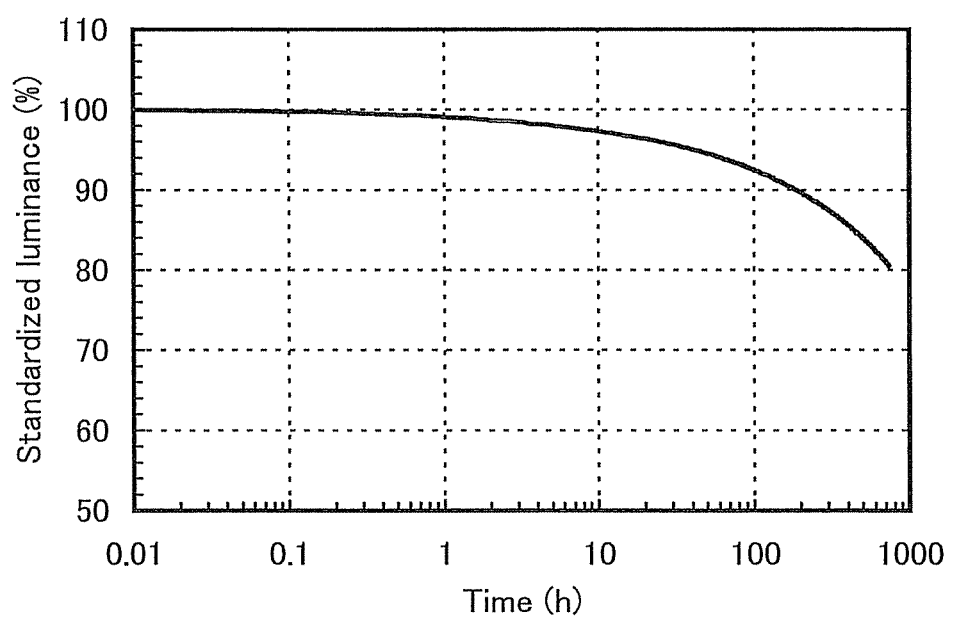
FIG. 18 illustrates the result of a continuous lighting test of a light-emitting element manufactured in an example, which is driven with a constant current.

Next, FIG. 18 illustrates the result of a continuous lighting test in which the light-emitting element 4 was continuously lit by constant current driving with the initial luminance set at 1000 cd/m$^2$ (the vertical axis indicates a standardized luminance on the condition that 1000 cd/m$^2$ is 100%).

From the result of FIG. 18, the luminance half-life period of the light-emitting element 4 is estimated as about 5000 hours, and it is found that the light-emitting element 4 has a long lifetime. Accordingly, it is proved that the light-emitting element 4 according to Embodiment 1 is a light-emitting element with a long lifetime.

(Manufacture of Light-Emitting Element 5)

A light-emitting element 5 was manufactured in a manner similar to that of the light-emitting element 4 except that the layer 2021 provided on the anode side in the light-emitting element 4 was formed using a film made of only PCBAPA.

(Evaluation of Characteristics of Light-Emitting Element 5)

Sealing was performed in a, glove box under a nitrogen atmosphere so that the light-emitting element 5 of one embodiment of the present invention, which was obtained as described above, was not exposed to the atmosphere, and then operation characteristics of the light-emitting element 5 were measured. Note that the measurements were performed at a room temperature (in an atmosphere kept at 25° C.).

Figure 19:
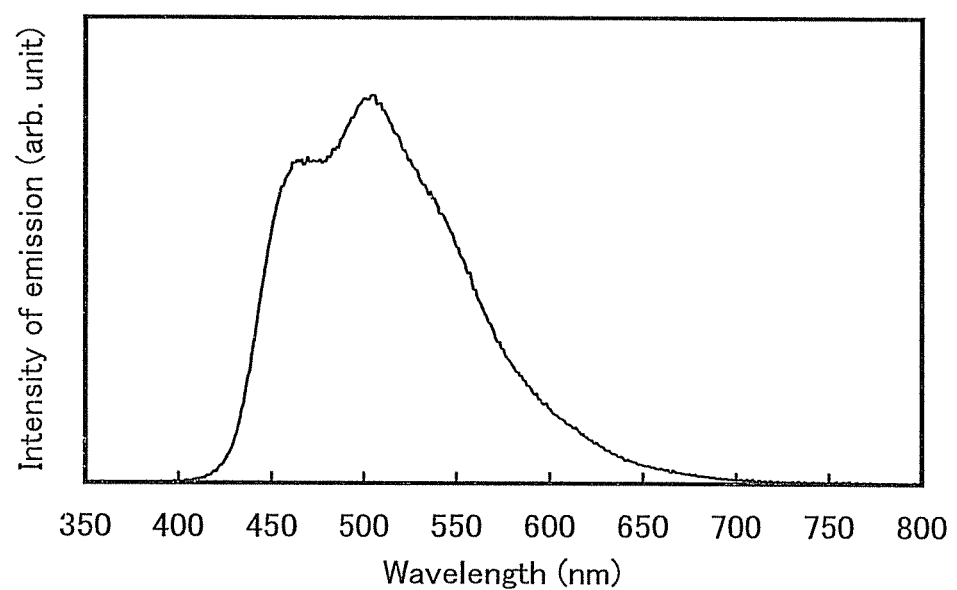
FIG. 19 illustrates an emission spectrum of a light-emitting element manufactured in an example.

FIG. 19 illustrates an emission spectrum when a current of 1 mA flows to the light-emitting element 5. FIG. 19 shows that the light-emitting element 5 obtains the blue light emission near 460 nm, the intensity of which is about four fifths of that of green light emission at 510 nm, so that a favorable balance between blue light emission and green light emission can be achieved. Accordingly, in the light-emitting element 5 according to Embodiment 1, light with a short wavelength, which is disadvantageous in terms of energy, can be obtained in a favorable balance and emission color can be easily adjusted.

Figure 20:
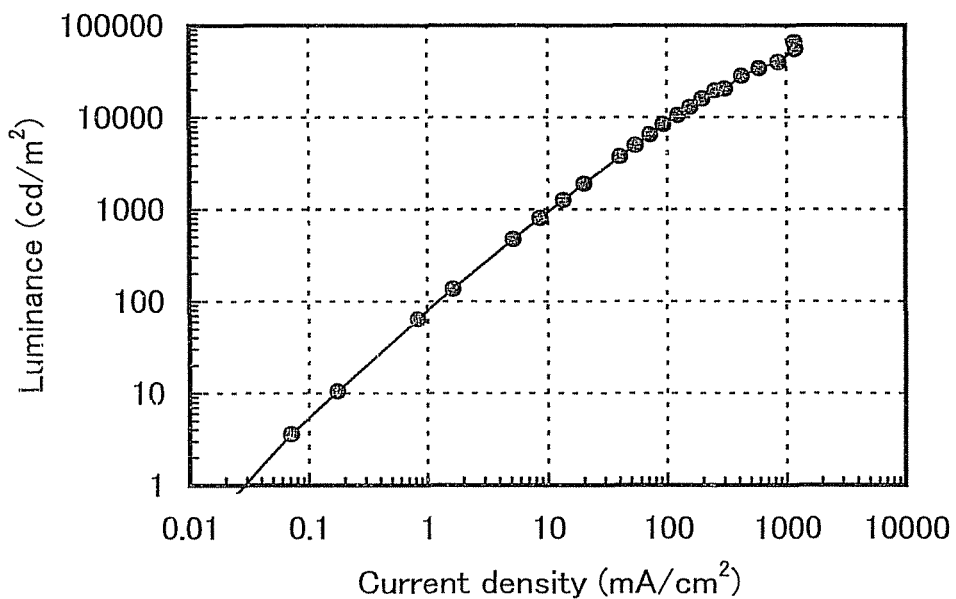
FIG. 20 illustrates current density-luminance characteristics of a light-emitting element manufactured in an example.
Figure 21:
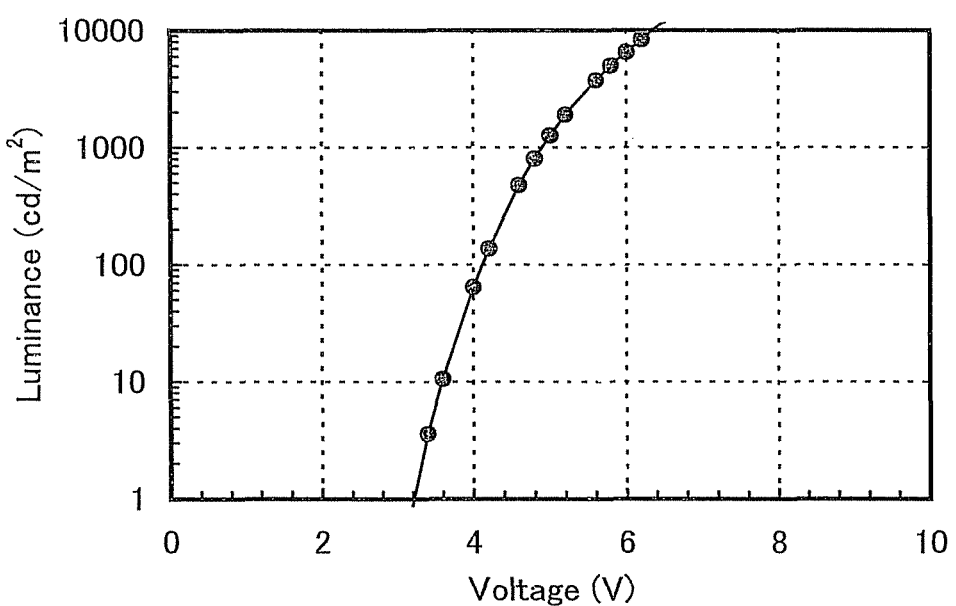
FIG. 21 illustrates voltage-luminance characteristics of a light-emitting element manufactured in an example.

Further, FIG. 20 illustrates current density-luminance characteristics of the light-emitting element 5, and FIG. 21 illustrates voltage-luminance characteristics thereof. From these graphs, it is found that the light-emitting element 5 has favorable characteristics.

Figure 22:
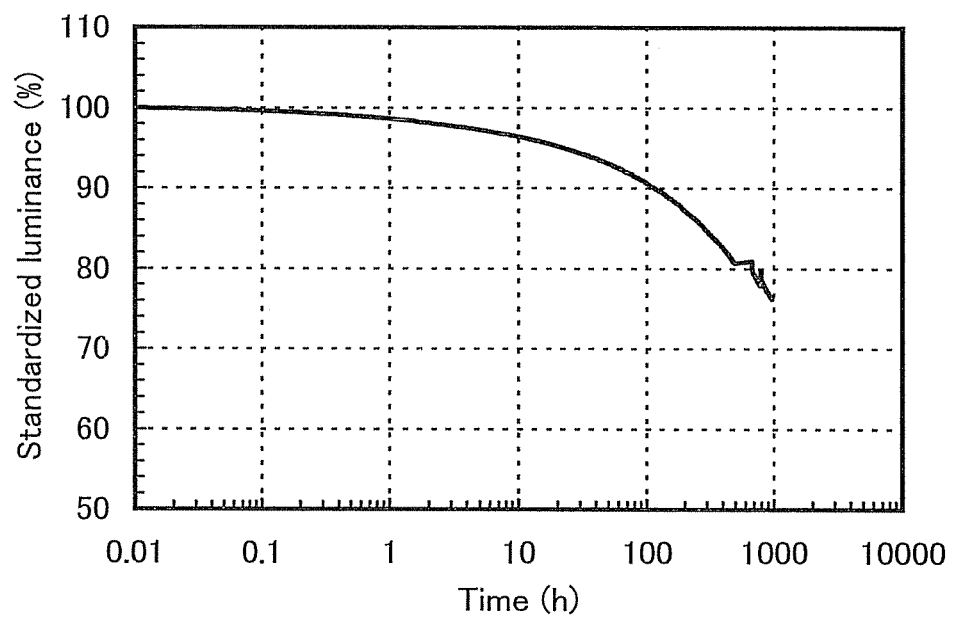
FIG. 22 illustrates the result of a continuous lighting test of a light-emitting element manufactured in an example, which is driven with a constant current.

Next, FIG. 22 illustrates the result of a continuous lighting test in which the light-emitting element 5 was continuously lit by constant current driving with the initial luminance set at 1000 cd/m$^2$ (the vertical axis indicates a standardized luminance on the condition that 1000 cd/m$^2$ is 100%).

From the result of FIG. 22, the luminance half-life period of the light-emitting element 5 is estimated as about 5000 hours, and it is found that the light-emitting element 5 has a long lifetime. Accordingly, it is proved that the light-emitting element 5 according to Embodiment 1 is a light-emitting element with a long lifetime.

Example 2

In Example 2, a manufacturing example and operating characteristics of an element will be exemplified in which rubrene is used as a light-emitting substance for the second light-emitting layer according to the light-emitting element 5 of Example 1 so that the light-emitting layer emits yellow light. Note that rubrene is a substance having a structure shown below.

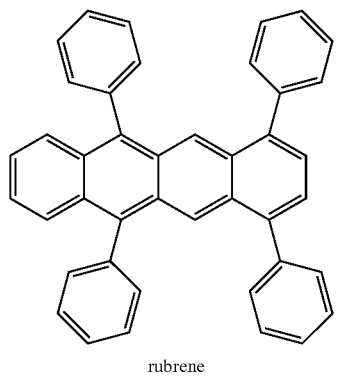 [SMILES: c1ccc(-c2ccc(-c3ccccc3)c3cc4c(-c5ccccc5)c5ccccc5c(-c5ccccc5)c4cc23)cc1]

rubrene (Manufacture of Light-Emitting Element 6)

A light-emitting element 6 was manufactured in a manner similar to that of the light-emitting element 5 of Example 1 except the second light-emitting layer 2012. The second light-emitting layer 2012 was formed by co-evaporating PCCPA and rubrene, which is a light-emitting substance emitting yellow light (the weight ratio of PCCPA to rubrene was 1:0.01), and the thickness was set to be 20 nm. Since rubrene serves as a light-emitting substance in the second light-emitting layer 2012, the second light-emitting layer 2012 emits yellow light.

(Evaluation of Characteristics of Light-Emitting Element 6)

Sealing was performed in a glove box under a nitrogen atmosphere so that the light-emitting element 6 of one embodiment of the present invention, which was obtained as described above, was not exposed to the atmosphere, and then operation characteristics of the light-emitting element 6 were measured. Note that the measurements were performed at a room temperature (in an atmosphere kept at 25° C.).

Figure 23:
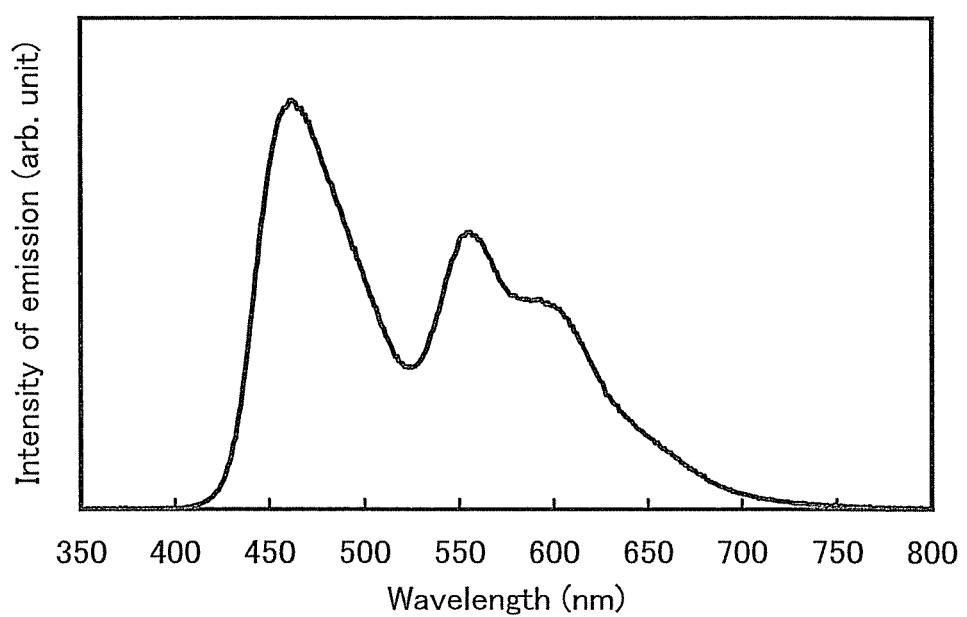
FIG. 23 illustrates an emission spectrum of a light-emitting element manufactured in an example.

FIG. 23 illustrates an emission spectrum when a current of 1 mA flows to the light-emitting element 6. FIG. 23 shows that the light-emitting element 6 obtains the blue light emission near 460 nm, the intensity of which is higher than that of yellow light emission near 560 nm, so that a favorable balance between blue light emission and yellow light emission can be achieved and the light-emitting element 6 has a broad emission spectrum. Accordingly, in the light-emitting element 6 according to Embodiment 1, light with a short wavelength, which is disadvantageous in terms of energy, can be obtained in a favorable balance and emission color can be easily adjusted. Note that the CIE chromaticity coordinate of the light-emitting element 6 at a luminance near 1000 cd/m$^2$ was (x=0.29, y=0.30), and the light-emitting element 6 provides white light.

Figure 24:
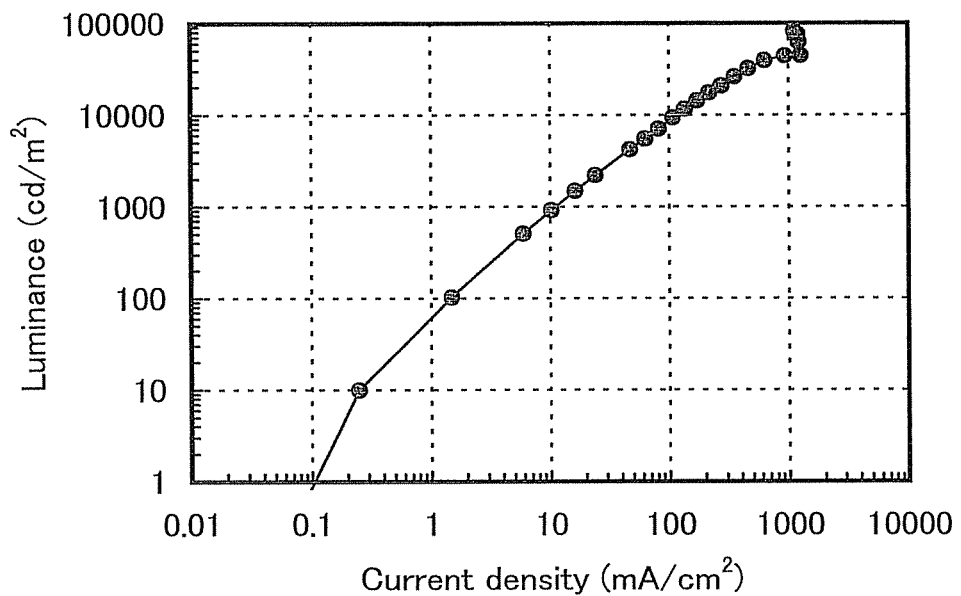
FIG. 24 illustrates current density-luminance characteristics of a light-emitting element manufactured in an example.
Figure 25:
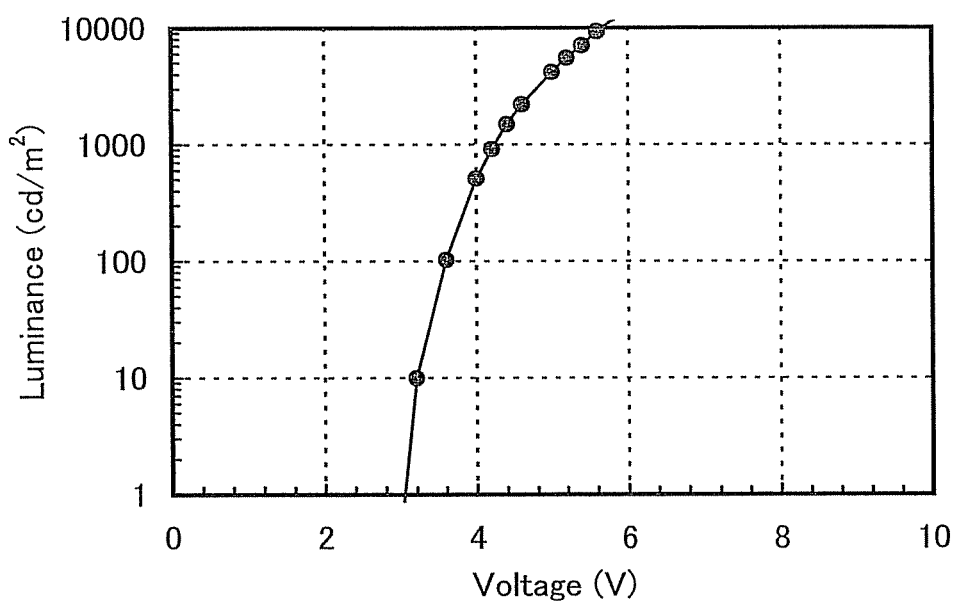
FIG. 25 illustrates voltage-luminance characteristics of a light-emitting element manufactured in an example.

Further, FIG. 24 illustrates current intensity-luminescence characteristics of the light-emitting layer 6, and FIG. 25 illustrates voltage-luminescence characteristics thereof. From these graphs, it is found that the light-emitting element 6 has favorable characteristics.

Figure 26:
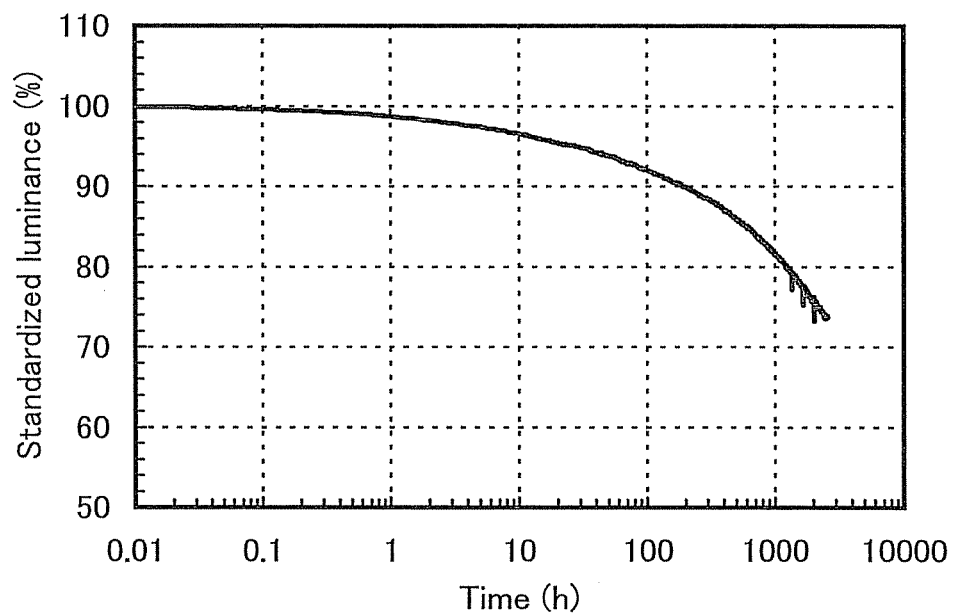
FIG. 26 illustrates the result of a continuous lighting test of a light-emitting element manufactured in an example, which is driven with a constant current.

Next, FIG. 26 illustrates the result of a continuous lighting test in which the light-emitting element 6 was continuously lit by constant current driving with the initial luminance set at 1000 cd/m$^2$ (the vertical axis indicates a standardized luminance on the condition that 1000 cd/m$^2$ is 100%).

From the result of FIG. 26, the luminance half-life period of the light-emitting element 6 is estimated as about 10000 to 20000 hours, and it is found that the light-emitting element 6 has a long lifetime. Accordingly, it is proved that the light-emitting element 6 according to Embodiment 1 is a light-emitting element with a long lifetime.

Example 3

In Example 3, materials used in the above examples will be described.

Synthesis Example 1

A synthesis method of 4-(10-phenyl-9-anthryl)-4'-(9-phenyl-9H-carbazol-3-yl)triphenylamine (abbreviation: PCBAPA) is specifically described

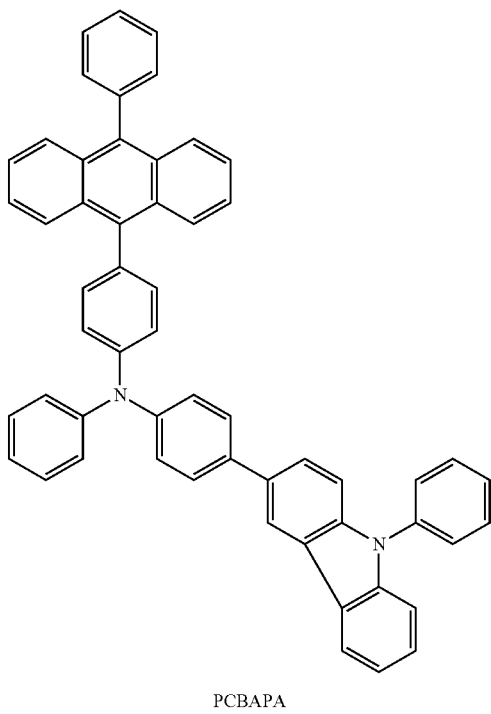 [SMILES: c1ccc(-c2c3ccccc3c(-c3ccc(N(c4ccccc4)c4ccc(-c5ccc6c(c5)c5ccccc5n6-c5ccccc5)cc4)cc3)c3ccccc23)cc1]

PCBAPA

Step 1: Synthesis of 9-phenyl-9H-carbazole-3-boronic acid

A synthesis scheme of 9-phenyl-9H-carbazole-3-boronic acid is shown in (E-1).

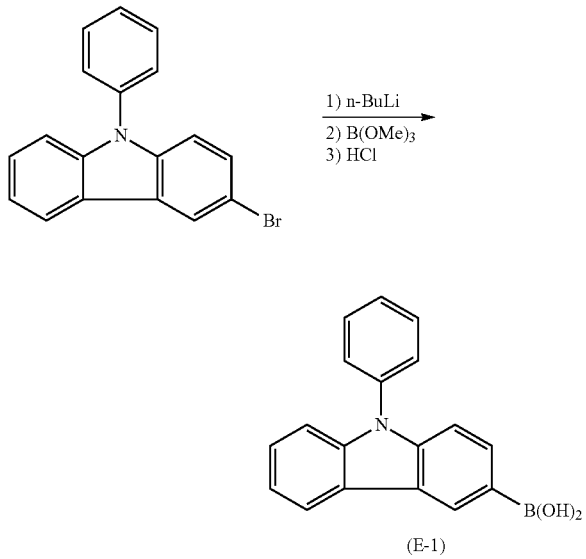

(E-1)

Into a 500 mL three-neck flask was put 10 g (31 mmol) of 3-bromo-9-phenyl-9H-carbazole. The atmosphere in the flask was replaced with nitrogen. To the flask was added 150 mL of tetrahydrofuran (THF), and 3-bromo-9-phenyl-9H-carbazole was dissolved therein. This solution was cooled to −80° C. Into this solution was dripped 20 mL (32 mmol) of n-butyllithium (a 1.58 mol/L hexane solution) with the use of a syringe. After the dripping was completed, this solution was stirred at the same temperature for 1 hour. After the stirring, 3.8 mL (34 mmol) of trimethyl borate was added to this solution, and the solution was stirred for approximately 15 hours while the temperature of the solution was being brought back to a room temperature. After the stirring, approximately 150 mL (1.0 mol/L) of dilute hydrochloric acid was added to this solution, and then the solution was stirred for 1 hour. After the stirring, an aqueous layer of this mixture was extracted with ethyl acetate. The extract was combined with an organic layer and then washed with a saturated sodium hydrogen carbonate solution. The organic layer was dried with magnesium sulfate. After the drying, this mixture was subjected to gravity filtration. The obtained filtrate was condensed to give an oily light brown substance. This obtained oily substance was dried under reduced pressure to give 7.5 g of a light brown solid, which was the object of the synthesis, in a yield of 86%.

Step 2: Synthesis of 4-(9-phenyl-9H-carbazol-3-yl)diphenylamine (abbreviation: PCBA)

A synthesis scheme of 4-(9-phenyl-9H-carbazol-3-yl)diphenylamine (abbreviation: PCBA) is shown in (E-2).

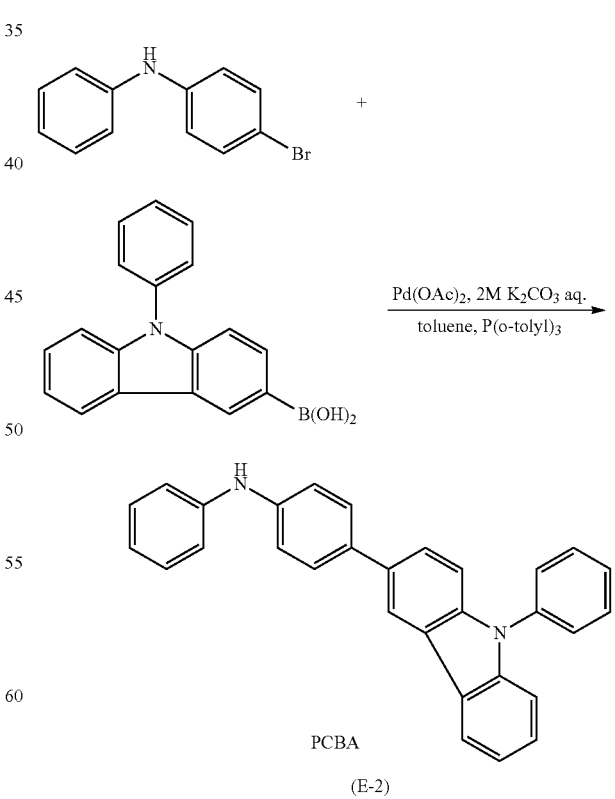

PCBA (E-2)

Into a 500 mL three-neck flask were put 6.5 g (26 mmol) of 4-bromodiphenylamine, 7.5 g (26 mmol) of 9-phenyl- 9H-carbazole-3-boronic acid, and 400 mg (1.3 mmol) of tri(o-tolyl)phosphine. The atmosphere in the flask was replaced with nitrogen. To the mixture were added 100 mL of toluene, 50 mL of ethanol, and 14 mL (0.2 mol/L) of potassium carbonate aqueous solution. Under reduced pressure, this mixture was degassed while being stirred. After the degassing, 67 mg (30 mmol) of palladium(II) acetate was added to the mixture. This mixture was refluxed at 100° C. for 10 hours. After the reflux, an aqueous layer of this mixture was extracted with toluene, and the extract was combined with an organic layer and then washed with a saturated saline solution. The organic layer was dried with magnesium sulfate. After the drying, this mixture was subjected to gravity filtration. The obtained filtrate was condensed to give an oily light brown substance. This oily substance was purified by silica gel column chromatography (a developing solvent was a mixed solvent of hexane: toluene=4:6). A white solid obtained after the purification was recrystallized with dichloromethane/hexane to give 4.9 g of a white solid, which was the object of the synthesis, in a yield of 45%.

Figure 27:
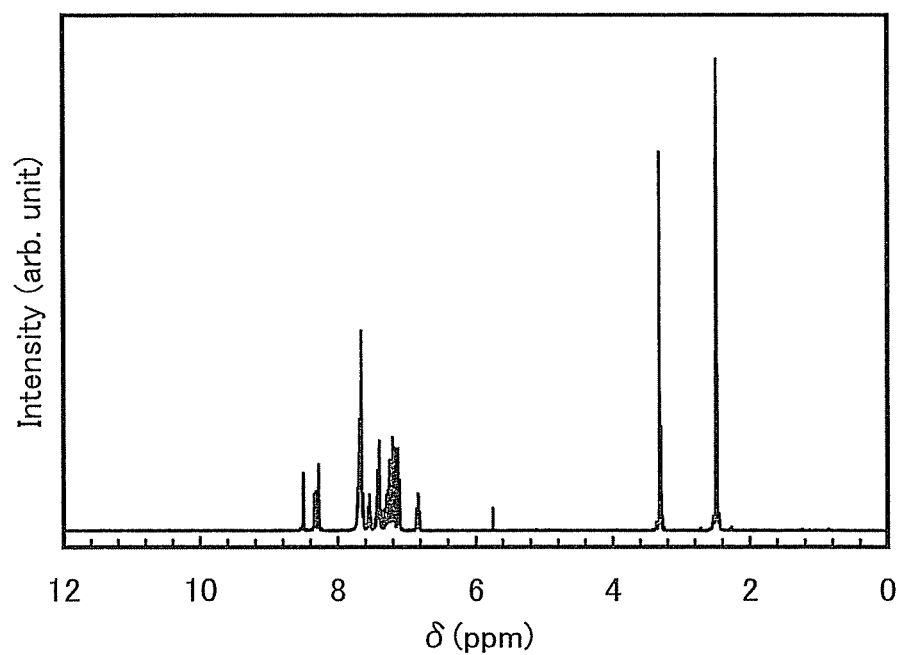
FIG. 27 illustrates a $^1$H-NMR chart of 4-(9-phenyl-9H-carbazol-3-yl)diphenylamine (abbreviation: PCBA)

Note that the solid obtained in the above Step 2 was analyzed by a nuclear magnetic resonance measurement ($^1$H NMR). The measurement data are shown below, and the $^1$H NMR chart is shown in FIG. 27. The measurement results show that PCBA was obtained in this synthesis example.

$^1$H NMR (DMSO-d$_6$, 300 MHz): δ=6.81-6.86 (m, 1H), 7.12 (dd, J$_1$=0.9 Hz, J$_2$=8.7 Hz, 2H), 7.19 (d, J=8.7 Hz, 2H), 7.23-7.32 (m, 311), 7.37-7.47 (m, 3H), 7.51-7.57 (m, 1H), 7.61-7.73 (m, 7H) 8.28 (s, 1H), 8.33 (d, J=7.2 Hz, 1H), 8.50 (d, J=1.5 Hz, 1H)

Step 3: Synthesis of PCBAPA

A synthesis scheme of PCBAPA is shown in (E-3).

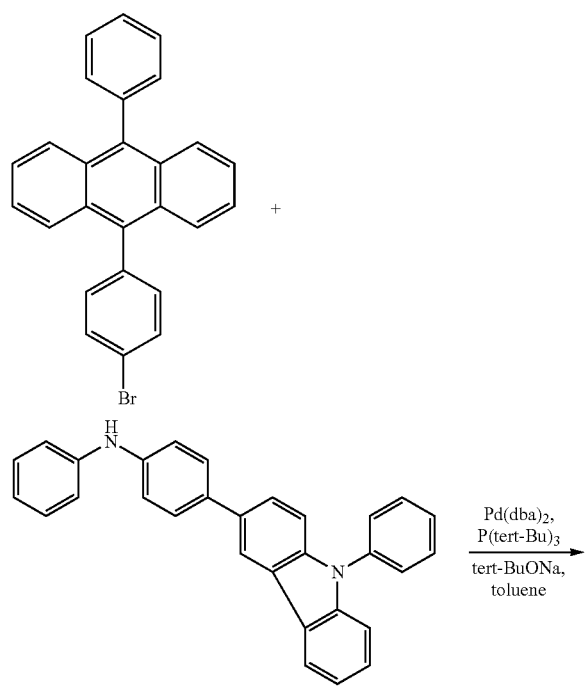

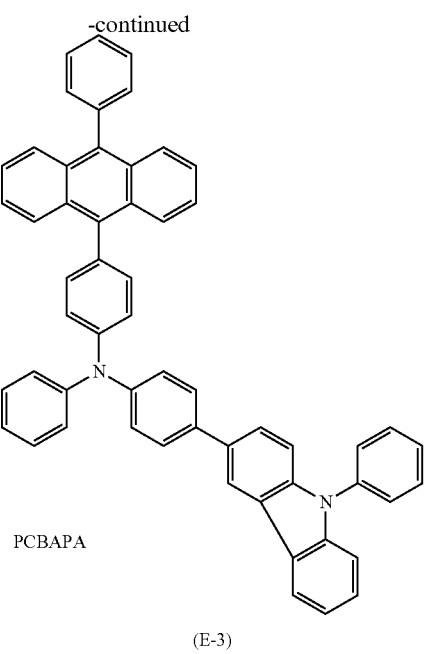

PCBAPA (E-3)

Into a 300 mL three-neck flask were put 7.8 g (12 mmol) of 9-(4-bromophenyl)-10-phenylanthracene, 4.8 g (12 mmol) of PCBA, and 5.2 g (52 mmol) of sodium tert-butoxide, and the atmosphere in the flask was replaced with nitrogen. To this mixture were added 60 mL of toluene and 0.30 mL of tri(tert-butyl)phosphine (a 10 wt % hexane solution). Under reduced pressure, this mixture was degassed while being stirred. After the degassing, 136 mg (0.24 mmol) of bis(dibenzylideneacetone)palladium(0) was added to the mixture. This mixture was stirred at 100° C. for 3 hours. After the stirring, approximately 50 mL of toluene was added to this mixture. The mixture was subjected to suction filtration through Celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was condensed to give a yellow solid. This solid was recrystallized with a mixed solvent of toluene and hexane to give 6.6 g of a light yellow solid of PCBAPA, which was the object of the synthesis, in a yield of 75%. Then, 3.0 g of the obtained light yellow powdered solid was sublimated and purified by a train sublimation method. For sublimation purification conditions, PCBAPA was heated at 350° C. under a pressure of 8.7 Pa with a flow rate of argon gas of 3.0 mL/min. After the sublimation purification, 2.7 g of a light yellow solid of PCBAPA was obtained in a yield of 90%.

Figure 28:
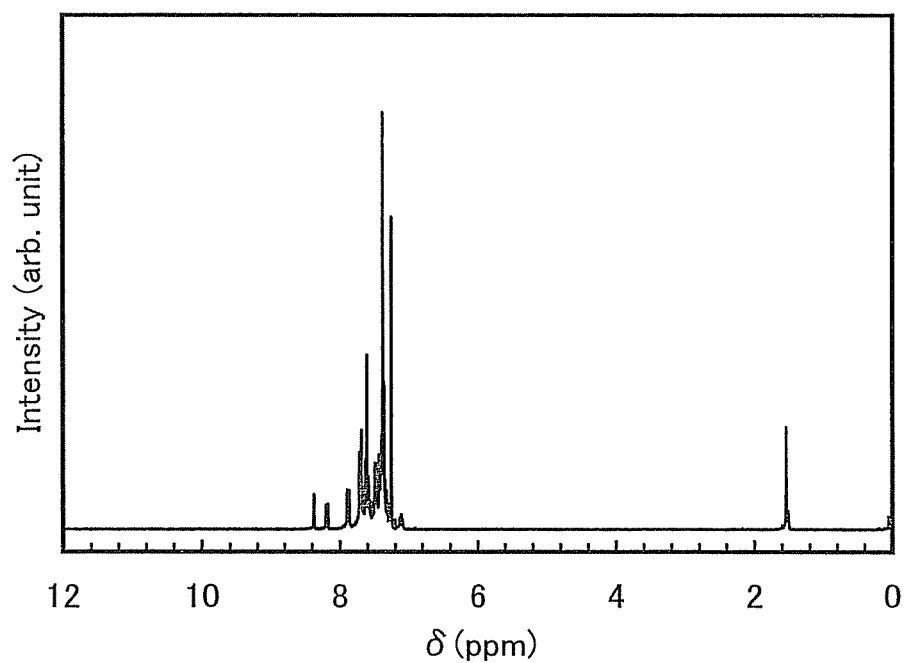
FIG. 28 illustrates a $^1$H-NMR chart of 4-(10-phenyl-9-anthryl)-4'-(9-phenyl-9H-carbazol-3-yl)triphenylamine (abbreviation: PCBAPA).

Note that the solid obtained in the above Step 3 was analyzed by $^1$H NMR. The measurement data are shown below, and the $^1$H NMR chart is illustrated in FIG. 28. The measurements result show that PCBAPA was obtained in this synthesis example.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H)

This application is based on Japanese Patent Application serial no. 2008-320918 filed with Japan Patent Office on Dec. 17, in 2008, the entire contents of which are hereby incorporated by reference.

What is claimed is:

1. A light-emitting element comprising:
a first light-emitting layer between an anode and a cathode; and
a second light-emitting layer between the anode and the cathode, the second light-emitting layer being in contact with a cathode side of the first light-emitting layer,
wherein the first light-emitting layer includes a first layer provided on an anode side and a second layer provided on a cathode side,
wherein the first layer provided on the anode side contains a first light-emitting substance and a first organic compound,
wherein the second layer provided on the cathode side contains a second organic compound and the first light-emitting substance,
wherein an amount of the second organic compound in the second layer provided on the cathode side is greater than or equal to 50 wt % and less than or equal to 99.9 wt %,
wherein the second light-emitting layer contains a third organic compound and a second light-emitting substance,
wherein an amount of the third organic compound in the second light-emitting layer is greater than or equal to 50 wt % and less than or equal to 99.9 wt %, and
wherein the first organic compound is a compound different from the second organic compound.

2. The light-emitting element according to claim 1,
wherein the first layer provided on the anode side has a hole-transporting property;
wherein the second layer provided on the cathode side has an electron-transporting property; and
wherein the second light-emitting layer has an electron-transporting property.

3. The light-emitting element according to claim 1,
wherein the first light-emitting substance has a hole-transporting property;
wherein the second organic compound has an electron-transporting property; and
wherein the third organic compound has an electron-transporting property.

4. The light-emitting element according to claim 1,
wherein the first light-emitting substance is represented by a general formula (i); and

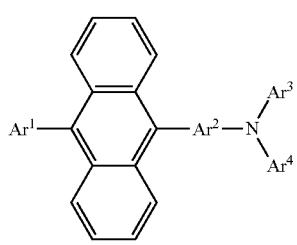

(i)

wherein $Ar^1$ represents an aryl group having 6 to 25 carbon atoms, $Ar^2$ represents an arylene group having 6 to 25 carbon atoms, and $Ar^3$ and $Ar^4$ independently represent either an aryl group having 6 to 25 carbon atoms or a carbazolyl group.

5. The light-emitting element according to claim 1,
wherein an emission peak wavelength of the first light-emitting substance is shorter than an emission peak wavelength of the second light-emitting substance.

6. The light-emitting element according to claim 1,
wherein an emission color of the first light-emitting substance and an emission color of the second light-emitting substance complement each other.

7. The light-emitting element according to claim 1,
wherein an emission color of the first light-emitting substance is blue and an emission color of the second light-emitting substance is yellow, wherein an emission color of the first light-emitting substance is blue green and an emission color of the second light-emitting substance is red, or wherein an emission color of the first light-emitting substance is blue and an emission color of the second light-emitting substance is green.

8. The light-emitting element according to claim 1,
wherein an emission peak wavelength of the first light-emitting substance is in a range of greater than or equal to 400 nm and less than 480 nm, and an emission peak wavelength of the second light-emitting substance is in a range of greater than or equal to 540 nm and less than 600 nm.

9. A lighting device comprising the light-emitting element according to claim 1.

10. The light-emitting element according to claim 1, wherein the first layer provided on the anode side consists essentially of the first light-emitting substance.

11. The light-emitting element according to claim 1, wherein both light emission from the first light-emitting substance and light emission from the second light-emitting substance can be obtained.

12. A light-emitting element comprising:
a first light-emitting layer between an anode and a cathode; and
a second light-emitting layer between the anode and the cathode, the second light-emitting layer being in contact with a cathode side of the first light-emitting layer,
wherein the first light-emitting layer includes a first layer provided on an anode side and a second layer provided on a cathode side,
wherein the first layer provided on the anode side contains a first organic compound and a first light-emitting substance,
wherein an amount of the first light-emitting substance in the first layer provided on the anode side is greater than or equal to 50 wt % and less than 100 wt %,
wherein the second layer provided on the cathode side contains a second organic compound and the first light-emitting substance,
wherein an amount of the second organic compound in the second layer provided on the cathode side is greater than or equal to 50 wt % and less than or equal to 99.9 wt %,
wherein the second light-emitting layer contains a third organic compound and a second light-emitting substance,
wherein an amount of the third organic compound in the second light-emitting layer is greater than or equal to 50 wt % and less than or equal to 99.9 wt %, and
wherein the first organic compound is a compound different from the second organic compound.

13. The light-emitting element according to claim 12,
wherein the first layer provided on the anode side has a hole-transporting property;
wherein the second layer provided on the cathode side has an electron-transporting property; and
wherein the second light-emitting layer has an electron-transporting property.

14. The light-emitting element according to claim 12,
wherein the first light-emitting substance has a hole-transporting property;
wherein the second organic compound has an electron-transporting property; and
wherein the third organic compound has an electron-transporting property.

15. The light-emitting element according to claim 12,
wherein the first light-emitting substance is represented by a general formula (i); and

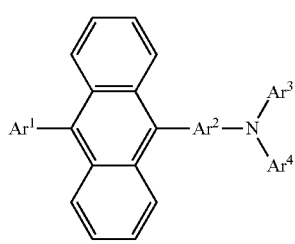

(i)

wherein $Ar^2$ represents an aryl group having 6 to 25 carbon atoms, $Ar^e$ represents an arylene group having 6 to 25 carbon atoms, and $Ar^3$ and $Ar^4$ independently represent either an aryl group having 6 to 25 carbon atoms or a carbazolyl group.

16. The light-emitting element according to claim 12,
wherein an emission peak wavelength of the first light-emitting substance is shorter than an emission peak wavelength of the second light-emitting substance.

17. The light-emitting element according to claim 12,
wherein an emission color of the first light-emitting substance and an emission color of the second light-emitting substance complement each other.

18. The light-emitting element according to claim 12,
wherein an emission color of the first light-emitting substance is blue and an emission color of the second light-emitting substance is yellow, wherein an emission color of the first light-emitting substance is blue green and an emission color of the second light-emitting substance is red, or wherein an emission color of the first light-emitting substance is blue and an emission color of the second light-emitting substance is green.

19. The light-emitting element according to claim 12,
wherein an emission peak wavelength of the first light-emitting substance is in a range of greater than or equal to 400 nm and less than 480 nm, and an emission peak wavelength of the second light-emitting substance is in a range of greater than or equal to 540 nm and less than 600 nm.

20. A lighting device comprising the light-emitting element according to claim 12.

21. The light-emitting element according to claim 12, wherein both light emission from the first light-emitting substance and light emission from the second light-emitting substance can be obtained.

22. A light-emitting element comprising:
a first light-emitting layer between an anode and a cathode;
a second light-emitting layer between the anode and the cathode, the second light-emitting layer being in contact with a cathode side of the first light-emitting layer,
wherein the first light-emitting layer includes a first layer provided on an anode side and a second layer provided on a cathode side,
wherein the first layer provided on the anode side contains a first light-emitting substance and a first organic compound,
wherein the first light-emitting substance has a hole-transporting property,
wherein an amount of the first light-emitting substance in the first layer provided on the anode side is greater than or equal to 200/3 wt % and less than 100 wt %,
wherein the second layer provided on the cathode side contains a second organic compound and the first light-emitting substance,
wherein an amount of the second organic compound in the second layer provided on the cathode side is greater than or equal to 50 wt % and less than or equal to 99.9 wt %,
wherein the second light-emitting layer contains a third organic compound and a second light-emitting substance,
wherein an amount of the third organic compound in the second light-emitting layer is greater than or equal to 50 wt % and less than or equal to 99.9 wt %, and
wherein the first organic compound is a compound different from the second organic compound.

23. The light-emitting element according to claim 22,
wherein the second layer and the first layer are in contact with each other, and
wherein the second layer has an electron-transporting property.

24. The light-emitting element according to claim 22,
wherein the first light-emitting substance is represented by a general formula (i); and

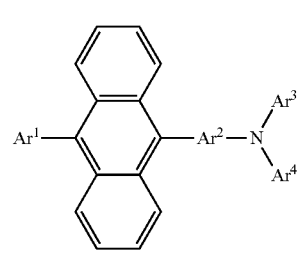

(i)

wherein $Ar^1$ represents an aryl group having 6 to 25 carbon atoms, $Ar^2$ represents an arylene group having 6 to 25 carbon atoms, and $Ar^3$ and $Ar^4$ independently represent either an aryl group having 6 to 25 carbon atoms or a carbazolyl group.

25. A lighting device comprising the light-emitting element according to claim 22.

26. A light-emitting element comprising:
a first light-emitting layer between an anode and a cathode; and
a second light-emitting layer between the anode and the cathode, the second light-emitting layer being in contact with a cathode side of the first light-emitting layer,
wherein the first light-emitting layer includes a first layer provided on an anode side and a second layer provided on a cathode side,
wherein the first layer provided on an anode side contains a first light-emitting substance and a first organic compound,
wherein the second layer provided on the cathode side contains a second organic compound and the first light-emitting substance, wherein an amount of the second organic compound in the second layer provided on the cathode side is greater than or equal to 50 wt % and less than or equal to 99.9 wt %, wherein the second light-emitting layer contains a third organic compound and a second light-emitting substance, wherein an amount of the third organic compound in the second light-emitting layer is greater than or equal to 50 wt % and less than or equal to 99.9 wt %, wherein the first organic compound is a compound different from the second organic compound, wherein the first layer has a hole-transporting property higher than the second layer, wherein the second layer has an electron-transporting property higher than the first layer, and wherein a thickness of the second layer is smaller than a thickness of the first layer.

27. The light-emitting element according to claim 26, wherein the first layer and the second layer are in contact with each other.

28. The light-emitting element according to claim 26, wherein the second layer and the second light-emitting layer are in contact with each other.

29. The light-emitting element according to claim 26, wherein the first light-emitting substance is represented by a general formula (i); and

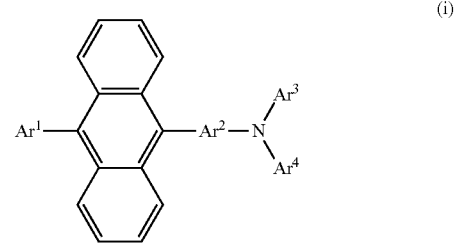

wherein $Ar^1$ represents an aryl group having 6 to 25 carbon atoms, $Ar^2$ represents an arylene group having 6 to 25 carbon atoms, and $Ar^a$ and $Ar^4$ independently represent either an aryl group having 6 to 25 carbon atoms or a carbazolyl group.

30. A lighting device comprising the light-emitting element according to claim 26.

* * * * *

UNITED STATES PATENT AND TRADEMARK OFFICE
CERTIFICATE OF CORRECTION

PATENT NO. : 9,437,824 B2  
APPLICATION NO. : 13/748844  
DATED : September 6, 2016  
INVENTOR(S) : Ushikubo et al.

Page 1 of 2

It is certified that error appears in the above-identified patent and that said Letters Patent is hereby corrected as shown below:

In the Specification

Column 9, Line 56; Change "faulting" to --forming--.

Column 15, Line 35; Change "N,N-bis" to --N,N'-bis--.

Column 15, Line 38; Change "4'-b is [" to --4'-bis [--.

Column 15, Line 40; Change ")-N-phenylamino]" to --)-N'-phenylamino]--.

Column 16, Line 44; Change "IPB3)." to --TPB3).--.

Column 17, Line 55; Change "anthry)phenyl" to --anthrylphenyl--.

Column 18, Line 46; Change "4-phen ylenediamine]" to --4-phenylenediamine]--.

Column 19, Line 15; Change "d iamine" to --diamine--.

Column 19, Line 34; Change "platinum(H)" to --platinum(II)--.

Column 19, Line 45; Change "iridium(II)" to --iridium(III)--.

Column 23, Line 20; Change "poly(-vinyltriphenylamine)" to --poly(4-vinyltriphenylamine)--.

Column 23, Line 21; Change "phenyl-N" to --phenyl-N'--.

Column 24, Line 35; Change "fainted" to --formed--.

Column 27, Line 53; Change "BeBq$_z$," to --BeBq$_2$,--.

Signed and Sealed this  
Twenty-fourth Day of January, 2017

Michelle K. Lee  
*Director of the United States Patent and Trademark Office*

Column 28, Line 55; Change "fainted" to --formed--.

Column 29, Line 53; Change "fainted" to --formed--.

Column 31, Line 24; Change "naphthalenetetracarboxylic boxylic" to --naphthalenetetracarboxylicboxylic--.

Column 33, Line 36; Change "fainted" to --formed--.

Column 41, Line 6; Change "aimed." to --formed.--.

Column 43, Line 1; Change "a, glove" to --a glove--.

Column 44, Line 67; Change "described" to --described.--.

Column 47, Line 31; Change "(m, 311)," to --(m, 3H),--.

In the Claims

Column 51, Line 24, Claim 15; Change "$Ar^2$" to --$Ar^1$--.

Column 51, Line 25, Claim 15; Change "$Ar^e$" to --$Ar^2$--.

Column 52, Lines 59 to 60, Claim 26; Change "first provided on" to --first layer provided on--.

Column 54, Line 19, Claim 29; Change "$Ar^a$" to --$Ar^3$--.